United States Patent [19]

Kuroda et al.

[11] Patent Number: 5,444,664
[45] Date of Patent: Aug. 22, 1995

[54] FLASH MEMORY AND A MICROCOMPUTER

[75] Inventors: Kenichi Kuroda, Tachikawa; Kiyoshi Matsubara, Higashimurayama, both of Japan

[73] Assignee: Hitachi, Ltd., Tokyo, Japan

[21] Appl. No.: 274,279

[22] Filed: Jul. 13, 1994

[30] Foreign Application Priority Data

Jul. 13, 1993 [JP] Japan .................................. 5-171942

[51] Int. Cl.⁶ ............................................. G11C 13/00
[52] U.S. Cl. ...................... 365/226; 365/185; 365/189.09; 365/900
[58] Field of Search ............ 365/226, 185, 900, 189.09

[56] References Cited

U.S. PATENT DOCUMENTS 5,172,342  12/1992  Gochi .................................. 365/226

FOREIGN PATENT DOCUMENTS 62-128100  6/1987  Japan .
1-161469   6/1989  Japan .
2-289997  11/1990  Japan .
3-73497    3/1991  Japan .

Primary Examiner—Joseph A. Popek
Assistant Examiner—A. Zarabian
Attorney, Agent, or Firm—Antonelli, Terry, Stout & Kraus

[57] ABSTRACT

A microcomputer mounted on a single semiconductor chip includes a central processing unit and a nonvolatile flash memory which allows the information to be processed by the central processing unit to be re-programmed by electrical erasing and programming operations. The microcomputer is provided with a normal power supply voltage terminal and a programming power supply voltage terminal and also incorporates a power supply voltage level detection device and an internal voltage boost circuit to decide the re-programming mode for the flash memory according to the level of the voltage supplied and to select between the boost voltage and the external high voltage in performing the erasing and programming of data.

7 Claims, 38 Drawing Sheets

FIG. 12A
PROGRAM

| MEMORY CELL | SELECTED/NOT SELECTED | SOURCE | DRAIN | GATE |
|---|---|---|---|---|
| MC 1 | SELECTED | 0v | 5v | 12v |
| MC 2 | NOT SELECTED | 0v | 0v | 12v |
| MC 3 | NOT SELECTED | 0v | 5v | 0v |
| MC 4 | NOT SELECTED | 0v | 0v | 0v |

FIG. 12B
ERASE (POSITIVE VOLTAGE METHOD)

| MEMORY CELL | SELECTED/NOT SELECTED | SOURCE | DRAIN | GATE |
|---|---|---|---|---|
| MC1, 3 | SELECTED | 12v | 0v | 0v |
| MC2, 4 | NOT SELECTED | 0v | 0v | 0v |

FIG. 12C
ERASE (NEGATIVE VOLTAGE METHOD)

| MEMORY CELL | SELECTED/NOT SELECTED | SOURCE | DRAIN | GATE |
|---|---|---|---|---|
| MC1, 2 | SELECTED | 5v | 0v | -10v |
| MC3, 4 | NOT SELECTED | 5v | 0v | 0v |

FIG. 27A
CONTROL REGISTER CREG

PROGRAM/ERASE CONTROL REGISTER

| $V_{PP}$ | $V_{CC}$ | $V_{PP}/V_{CC}$ | PB | EV | PV | E | P |
|---|---|---|---|---|---|---|---|

PEREG

FIG. 27B
ERASE BLOCK SPECIFICATION REGISTER — MBREG 1

| | 6 | 5 | 4 | 3 | 2 | 1 | 0 |
|---|---|---|---|---|---|---|---|

FIG. 27C
ERASE BLOCK SPECIFICATION REGISTER — MBREG 2

| 7 | 6 | 5 | 4 | 3 | 2 | 1 | 0 |
|---|---|---|---|---|---|---|---|

FIG. 27D

PB : PROGRAMMING SIZE SPECIFICATION BIT { "1":PAGE PROGRAMMING  "0":NO PAGE PROGRAMMING $V_{PP}/V_{CC}$ : POWER SUPPLY SWITCH BIT { "1":$V_{PPWe}=V_{PP}$  "0":$V_{PPWe}=V_{CC}$ BOOST $V_{PP}$ : $V_{PP}$ APPLICATION FLAG    E : ERASE $V_{CC}$ : $V_{CC}$    P : PROGRAM

EV : ERASE VERIFY
PV : PROGRAM VERIFY

MBREG 1 : FOR SPECIFYING LARGE BLOCK (56K)
MBREG 2 : FOR SPECIFYING SMALL BLOCK (4K)

FLASH MEMORY AND A MICROCOMPUTER

BACKGROUND OF THE INVENTION

The present invention relates to a non-volatile flash memory that can reprogram stored information by electrical erasure and programming and to a microcomputer incorporating the flash memory. More specifically, this invention relates to a technology suitably applied to a method of supplying erasing and programming voltages to the flash memory.

[0002]

Japanese Patent Laid-Open No. 161469/1989 describes a microcomputer that mounts on a single semiconductor chip an EPROM (erasable and programmable read only memory) or EEPROM (electrically erasable and programmable read only memory) as a programmable non-volatile memory. An on-chip non-volatile memory for such a microcomputer holds programs and data.

The EPROM erases stored information by ultraviolet rays and thus cannot be programmed unless it is removed from the mounted system. The EEPROM can erase or write data electrically and thus can change its stored information while it is mounted on the system. But because memory cells forming the EEPROM require selection transistors in addition to memory elements such as NMOS (metal nitride oxide semiconductor), the EEPROM is about 2.5 to 5 times as large as the EPROM, occupying a relatively large chip area.

[0003]

Japanese Patent Laid-Open No. 289997/1990 describes whole information erasing type EEPROM, which can be taken to be identical with the flash memory mentioned in this specification. The flash memory can change its stored information by electrical erasing and programming and form the memory cell with one transistor, and, like the EPROM, has the function of electrically erasing the whole memory cells or a block of memory cells in one operation. Thus, the flash memory can change its stored information while in the system-mounted (or device-mounted) state and, by its block erasing function, can shorten the re-programming time and also contribute to reducing the chip occupying area.

[0004]

Among the conventional methods of supplying erasing and programming potentials to the flash memory there are two methods. One is to provide, in addition to an ordinary power supply voltage terminal, a second terminal for a power supply voltage higher than the first one. The other method provides a boost circuit in the chip to generate an erasing and programming voltage Vpp such as 12 V from the ordinary power supply voltage Vcc such as 5 V.

For example, Japanese Patent Laid-Open No. 73497/1991 discloses a method whereby in addition to the ordinary power supply voltage terminal, another power supply voltage terminal is provided for supplying an erasing and programming voltage. Further, Japanese Patent Laid-Open No. 73497/1991 describes a method that provides a boost circuit in the chip to generate an erasing and programming voltage Vpp.

SUMMARY OF THE INVENTION

Having studied the above-mentioned two power supply methods, the inventor of this invention has found the following problems.

(1) The above two power supply methods both require two power supply devices (batteries). Hence, in electronic equipment where a small size is a priority, as in handy cameras, the equipment size becomes large because of the two power supply devices mounted. To deal with this situation, it may be conceived that the equipment such as camera is mounted with one power supply device and that when a need arises for overwriting data, an external PROM writer is used to re-program the flash memory. With this method, however, the data rewriting in real time is not possible, making the enhancement of functions of equipment difficult and the data reprogramming operation troublesome. This in turn limits the range of applications for this method.

[0006]

(2) With the above-mentioned internal boost method, in the process of erasing and programming a flash memory, as the number of bits erased or programmed in one operation increases, as during the block erasing of memory cells or the simultaneous programming of a large number of bits, a large current is needed, which in turn requires the boost circuit to have a large current supply capability. This makes it necessary to increase the area occupied by the boost circuit. In the microcomputer with a built-in flash memory, however, the chip size cannot allow a sufficiently large area to be allocated to the boost circuit. That is, the internal boost circuit necessarily has a smaller-than-needed current supply capability. As a result, the memory cell block erasing and the simultaneous programming of large numbers of bits are difficult to perform and take longer time.

Further, in the internal boost method, when a battery is used as a power supply, a fall in power supply voltage may result in an erasing or programming failure.

[0007]

An object of this invention is to provide a microcomputer incorporating a flash memory which is easy to handle.

To describe in more detail, a first objective of this invention is to provide a flash memory which allows data to be reprogrammed while in use, or a microcomputer incorporating such a flash memory.

A second objective of this invention is to provide a flash memory which allows easy block erasing and simultaneous programming of large numbers of bits and can reduce the time required by programming and erasing, or a microcomputer incorporating such a flash memory.

[0008]

A further objective of this invention is to provide a flash memory which allows for appropriate selection of a programming and erasing method according to the system or equipment employed, or a microcomputer incorporating such a flash memory.

A further object of this invention is to make this invention applicable to whatever type of the flash memory and, in the case of flash memory that is erased by negative voltages, to minimize the area occupied by a circuit that generates programming and erasing voltages.

These and other objects and novel features of this invention will become apparent form the following description in this specification and the accompanying drawings.

[0009]

Representative aspects of this invention disclosed in this specification are briefly described below.

A microcomputer—which has mounted on a single semiconductor chip a central processing unit and a non-volatile flash memory whose stored information to be processed by the central processing unit can be reprogrammed by electrical erasing and programming—is provided with a normal power supply voltage terminal and a programming and erasing power supply voltage terminal. The microcomputer incorporates a power supply voltage level detection means and an internal boost means so as to determine a reprogramming mode for the flash memory according to the level of the voltage supplied and to switch between a boost voltage and an external high voltage to perform the erasing and programming of data.

[0010]

With the above-mentioned means, it is possible to erase and program data to and from the flash memory either with the internal boost voltage or external high voltage. This not only makes it possible to reprogram data in real time and enhance the function of the equipment but also obviates the need for incorporating batteries of different voltages in portable equipment, reducing the size of the equipment. Further, because the programming is made optimum for the applied system, this invention offers improved versatility and reduces the time required by the programming and erasing.

Furthermore, if the data programming and erasing in the flash memory are performed by taking advantage of a tunnel phenomenon, the programming of one bit needs only several nA to several tens of nA, reducing the burden of the boost circuit, so that the area occupied by the power supply circuit, if incorporated, can be made small.

BRIEF DESCRIPTION OF THE DRAWINGS

FIG. 12 is an explanatory diagram showing the voltage conditions for memory cell erasing and programming operations;

FIG. 27 is an example configuration of a control register;

DESCRIPTION OF THE PREFERRED EMBODIMENTS (Embodiment 1)

Figure 1:
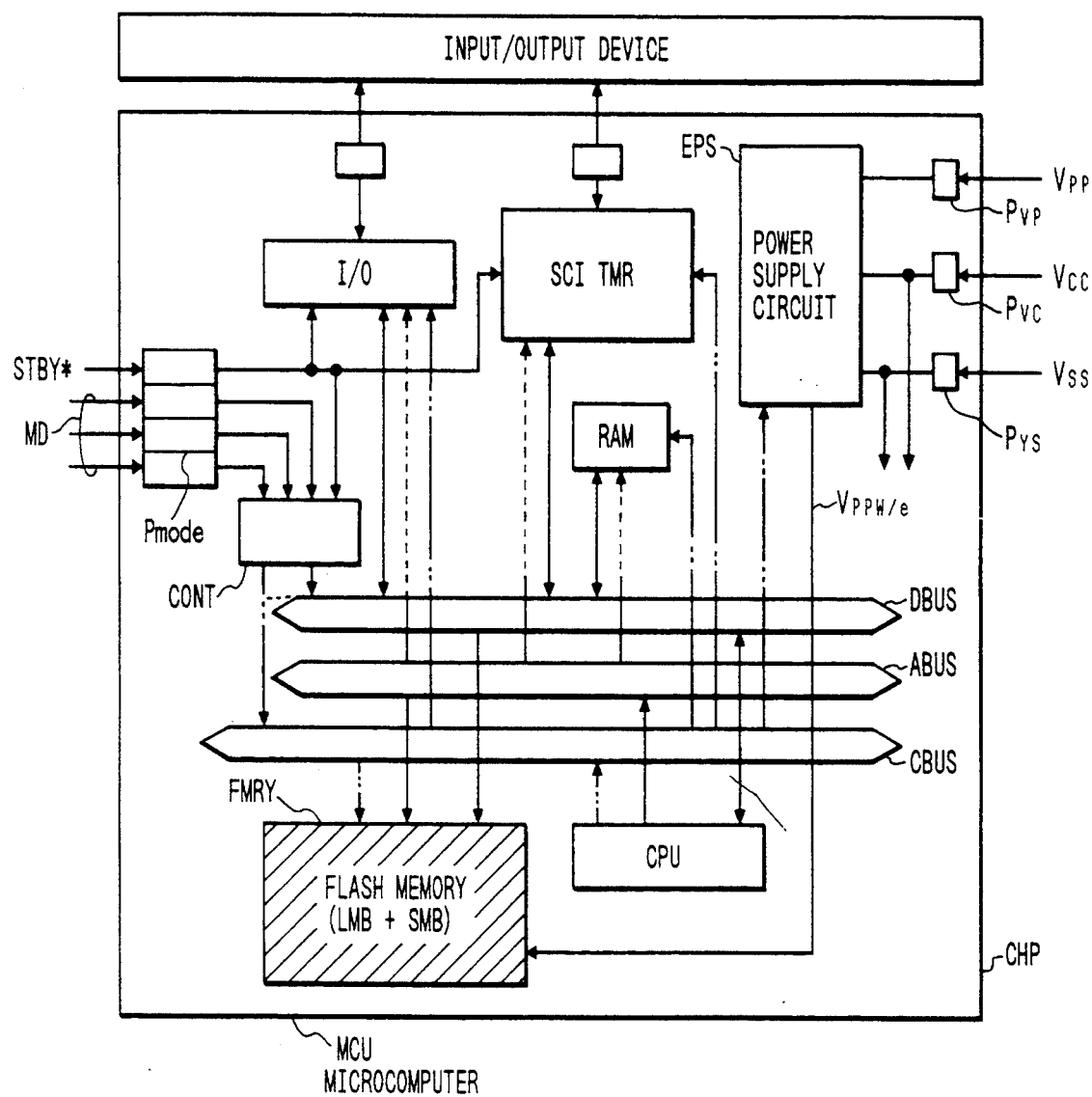
FIG. 1 is a block diagram of one embodiment of a microcomputer incorporating a flash memory.

FIG. 1 shows a block diagram of one embodiment of a microcomputer incorporating an all-flash memory. The microcomputer MCU shown in the figure includes: a central processing unit CPU; a nonvolatile flash memory FMRY, whose stored information to be processed by the central processing unit CPU can be reprogrammed by electrical erasing and programming; peripheral circuits such as timer TMR, serial communication interface SCI, random access memory RAM and other input/output circuits I/O; a mode control circuit CONT that determines the operation mode according to an operation mode signal MD given to a mode signal input terminal Pmode on the semiconductor chip CHP; buses ABUS, CBUS, DBUS interconnecting these circuit blocks; and a power supply circuit EPS supplying voltages to these circuits. These constituent circuits making up the microcomputer MCU are formed on a single semiconductor chip CHP such as a silicon chip by a known semiconductor integrated circuit manufacturing technique.

[0012]

The flash memory FMRY allows its stored information to be reprogrammed by electrical erasing and programming procedure, and can form its memory cell with one transistor as in the case of EPROM. Further, the flash memory FMRY has a function of electrically erasing the entire memory cells or a block of memory cells (memory block) in one operation.

A program/erase voltage Vppw/e used for electrical erasing and programming of the flash memory FMRY is supplied from the power supply circuit EPS. The power supply circuit EPS is supplied, from outside the semiconductor chip CHP, a program/erase voltage Vpp, an operation voltage Vcc and a circuit reference potential Vss. The operation voltage Vcc is a positive-polarity voltage having a specified potential difference with respect to the circuit reference potential Vss. The program/erase voltage Vpp is a positive-polarity voltage having a greater potential difference with respect to the circuit reference potential Vss than the above-mentioned specified one. In the power supply circuit EPS a voltage selection switch is operated by a control described later to select either Vpp or the boost voltage of Vcc, which is then supplied to the flash memory FMRY as the program/erase voltage Vppw/e. The central processing unit CPU, timer TMR, serial communication interface SCI, random access memory RAM, input/output circuit I/O and mode control circuit CONT operate upon reception of the operation voltage Vcc and the reference voltage Vss.

[0013]

The flash memory FMRY consists of a plurality of memory blocks, each of which can be erased at one time. In FIG. 1, reference symbol LMB represents a large memory block with a relatively large memory capacity and SMB a small memory block with a relatively small memory capacity. The memory capacity of the small memory block SMB is set smaller than that of the random access memory RAM. Hence, the random access memory RAM can receive data transmission from the small memory block SMB and store that information temporarily, and thus can be used as a work area for rewriting or a data buffer area. The flash memory FMRY is programmed with desired data and program. Details of the flash memory FMRY will be given later.

[0014]

The flash memory FMRY allows its stored information to be re-programmed according to the control from the central processing unit CPU with the microcomputer MCU mounted on the system. It also allows its stored information to be re-programmed according to the control from external devices outside the semiconductor chip CHP such as a general-purpose PROM writer. In the figure, what is designated as MD represents mode signals: a first operation mode signal to permit the flash memory FMRY to be re-programmed by the central processing unit CPU, a second operation mode signal to permit the flash memory FMRY to be re-programmed by the external device, and a third operation mode signal to selectively specify whether or not to use the voltage generated by the internal boost circuit. These operation mode signals are fed to a mode signal input pad Pmode on the semiconductor chip CHP.

When it is desired to make it possible to externally specify which of Vpp or the boost voltage of Vcc should be used for the programming and erasing of the flash memory FMRY, which is described later, or when it is desired to make it possible to specify from outside the size of memory block to be programmed or erased, the mode signal input pad Pmode can be used to input the associated mode signal.

[0015]

(Embodiment 2)

Figure 2:
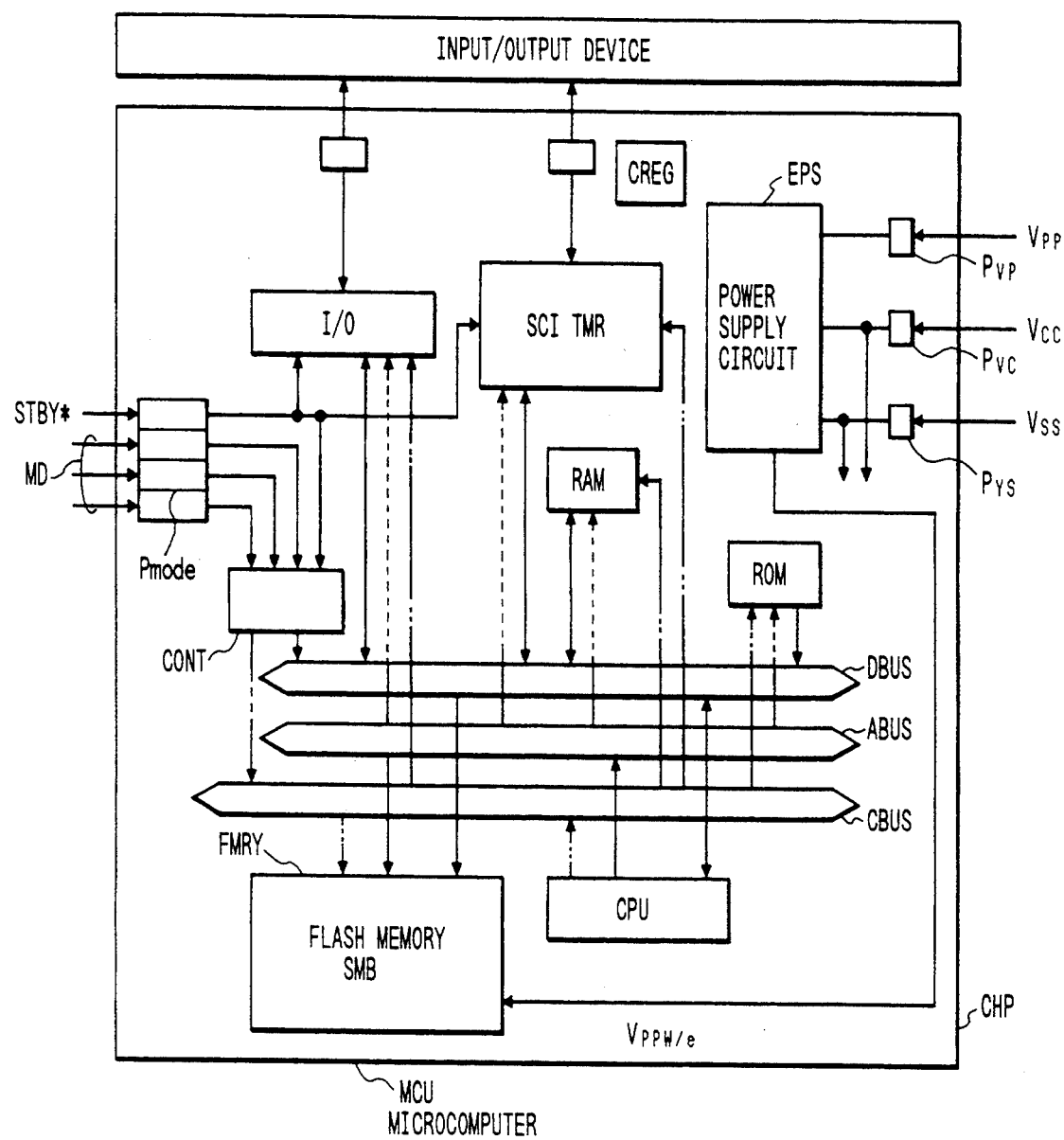
FIG. 2 is a block diagram of one embodiment of a microcomputer incorporating a flash memory and a mask ROM.

FIG. 2 shows a block diagram of one embodiment of the microcomputer incorporating a flash memory and a mask ROM.

In the microcomputer MCU shown in the figure, a part of the flash memory FMRY of FIG. 1 is replaced with a mask read-only memory ROM. The mask read-only memory ROM stores data and program that do not require to be reprogrammed. The flash memory FMRY of FIG. 2 has a plurality of small memory blocks SMB, each of which can be erased in one operation. Other aspects of the configuration are similar to those of the embodiment of FIG. 1.

[0016]

Figure 3:
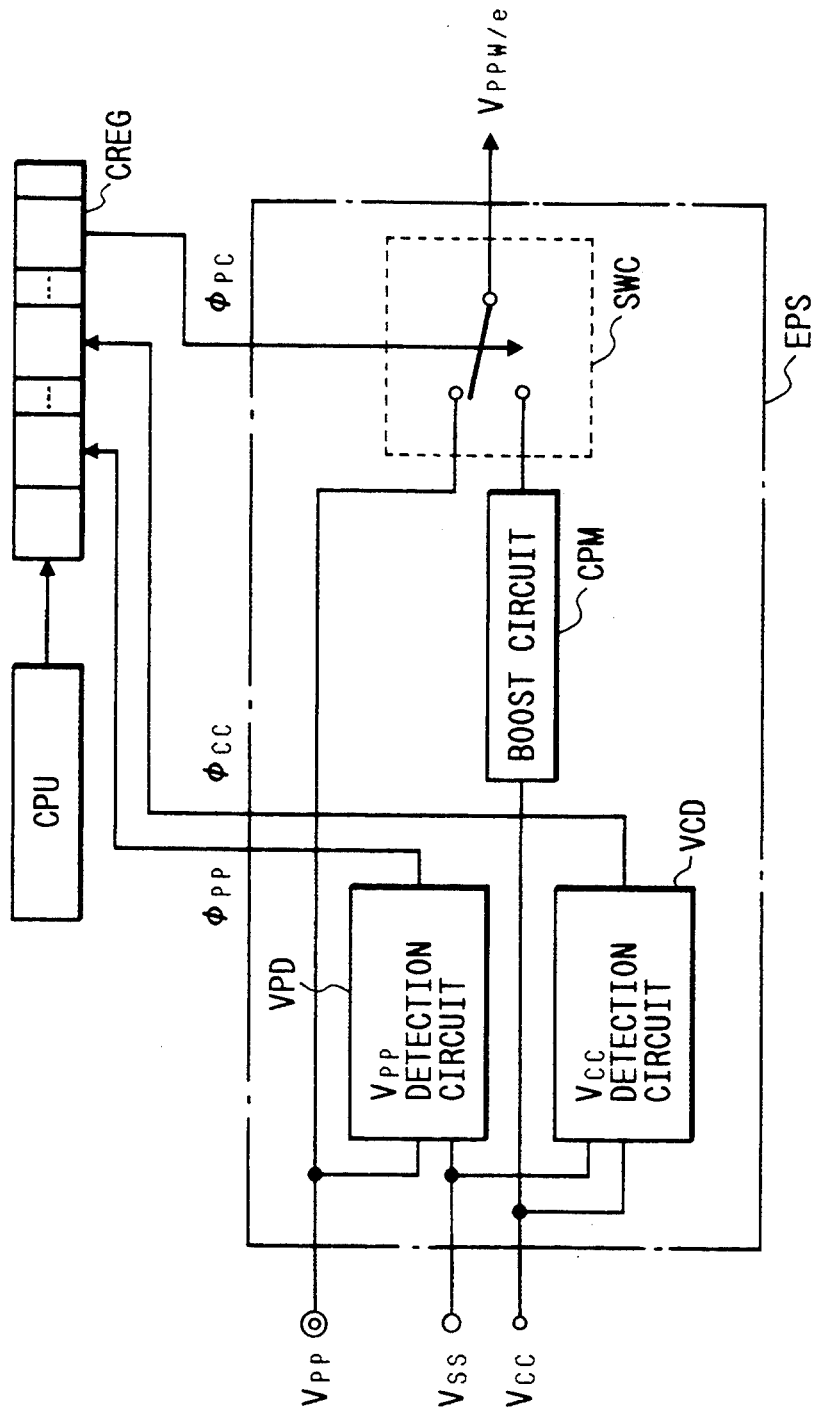
FIG. 3 is a block diagram showing an example configuration of a power supply circuit.

FIG. 3 shows one embodiment of the power supply circuit EPS.

In this embodiment, the semiconductor chip is provided with a power supply pad Pvc for receiving a power supply voltage Vcc that represents a normal operation voltage, a power supply pad Pvp for receiving a program/erase voltage Vpp, and a power supply pad Pvs for receiving a circuit reference potential Vss, all these voltages being fed to the power supply circuit EPS. The power supply circuit EPS has a level detection circuits VCD and VPD that check if the power supply voltages Vcc and Vpp are higher than the specified levels, and also a boost circuit CPM that steps up the voltage Vcc supplied to the power supply pad Pvc to generate a program/erase voltage. The power supply circuit EPS is also provided with a voltage selection switch SWC that selects either the stepped-up voltage generated by the boost circuit CPM or the power supply voltage Vpp fed to the power supply pad Pvp and feeds it to the internal flash memory FMRY as the program/erase voltage Vppw/e.

[0017]

In this embodiment there is provided a control register CREG, which has bits that are set by detection signals from the level detection circuits VCD and VPD, respectively. The control register CREG includes a control bit for the voltage selection switch SWC of program/erase voltage Vppw/e (referred to simply as a selection control bit). The selection control bit is so set as to cause the voltage selection switch SWC to supply the power supply voltage Vpp as the program/erase voltage Vppw/e to the flash memory FMRY when the central processing unit CPU checks the level detection bit in the control register CREG and the level detection circuit VPD decides that the power supply voltage Vpp is higher than the specified level. When the level detection circuit VPD decides that the power supply voltage Vpp is not higher than the specified level, the selection control bit is set to cause the voltage selection switch SWC to feed the voltage stepped up by the boost circuit CPM to the flash memory FMRY.

[0018]

When the central processing unit CPU checks the level detection bit in the control register CREG and finds that neither the power source voltage $V_{cc}$ as the normal operation voltage nor the program/erase power supply voltage Vpp is higher than the specified level, the central processing unit CPU does not perform the programming operation even if the program mode is specified for the flash memory FMRY. This prevents a problem that may be experienced when, for example, in a system having a microcomputer with a built-in flash memory, a battery voltage lowers to such an extent that the internal boost circuit CPM can no longer supply enough current and a write cycle that happens to be executed under this condition results in a write failure destroying data. When, for example, the power supply voltage Vpp is 12 V, the power supply voltage $V_{cc}$ is 5 V and the circuit reference voltage $V_{ss}$ is 0 V, the power supply voltage Vpp must be more than 10 V to be judged as being higher than the specified level by the level detection circuit VPD and the power source voltage $V_{cc}$ must be higher than 4 V to be decided as being higher than the specified level by the level detection circuit VCD.

[0019]

In the above embodiment, when the programming is performed by feeding the external voltage Vpp to the flash memory FMRY, the programming is done in unit of a page (byte) and the erasing is done two or more blocks at a time; and when the programming is done by feeding the internal boost voltage to the flash memory FMRY, the programming is carried out one byte at a time and the erasing one block at a time. This reduces the burden of the boost circuit CPM when performing the programming and erasing of the flash memory FMRY by the internal boost voltage, which in turn allows the programming and erasing to be performed by the boost circuit with a small current supply capability, thus minimizing the area occupied by the boost circuit. Selection of the programming and erasing size is made according to the selection control bit in the control register CREG.

Further, even when the external program/erase power supply voltage Vpp is higher than the specified level, it is possible to control the programming and erasing of the flash memory FMRY with the internal boost voltage by the central processing unit CPU rewriting the selection control bit in the control register CREG according to a program.

[0020]

Figure 4:
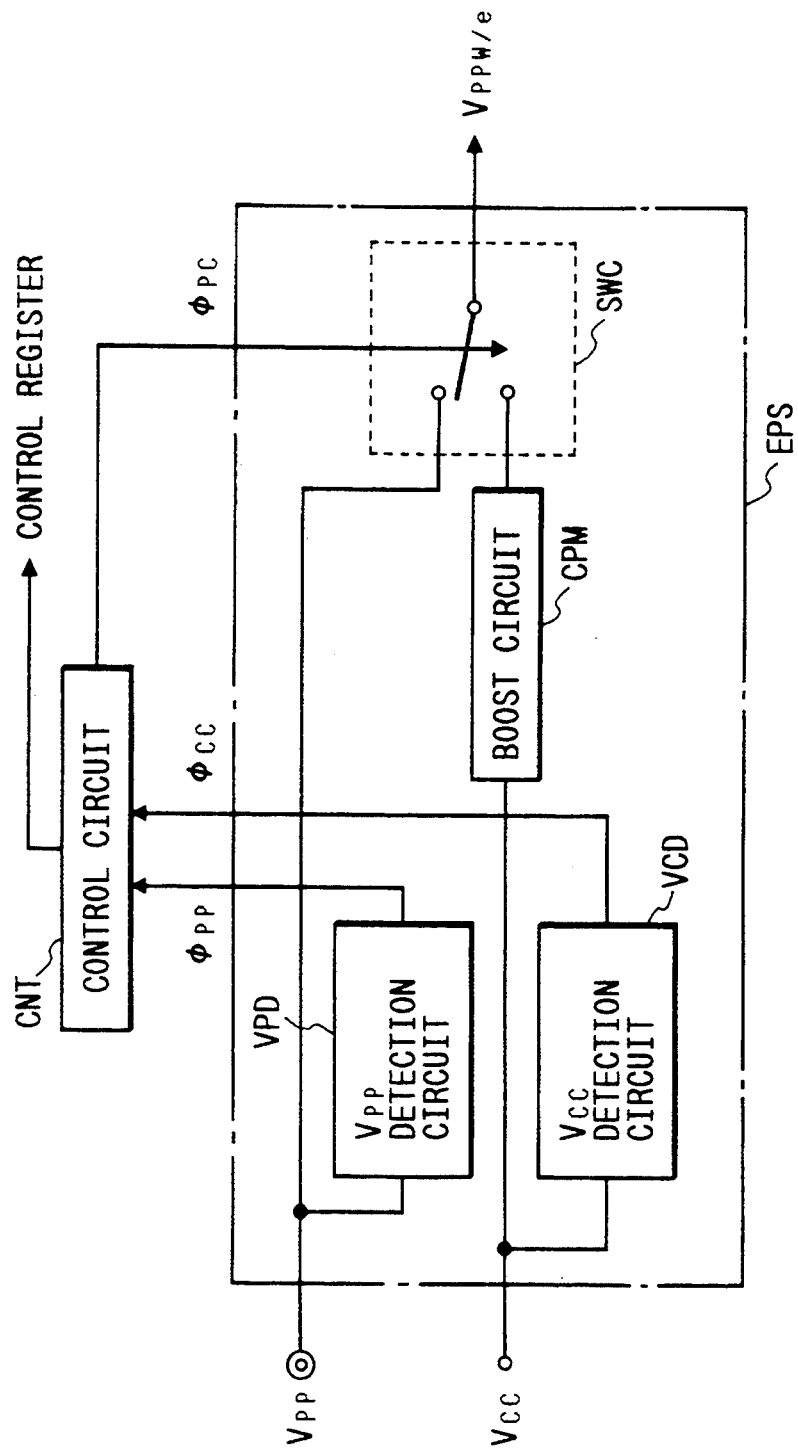
FIG. 4 is a block diagram showing a further example of a power supply circuit configuration.
Figure 5:
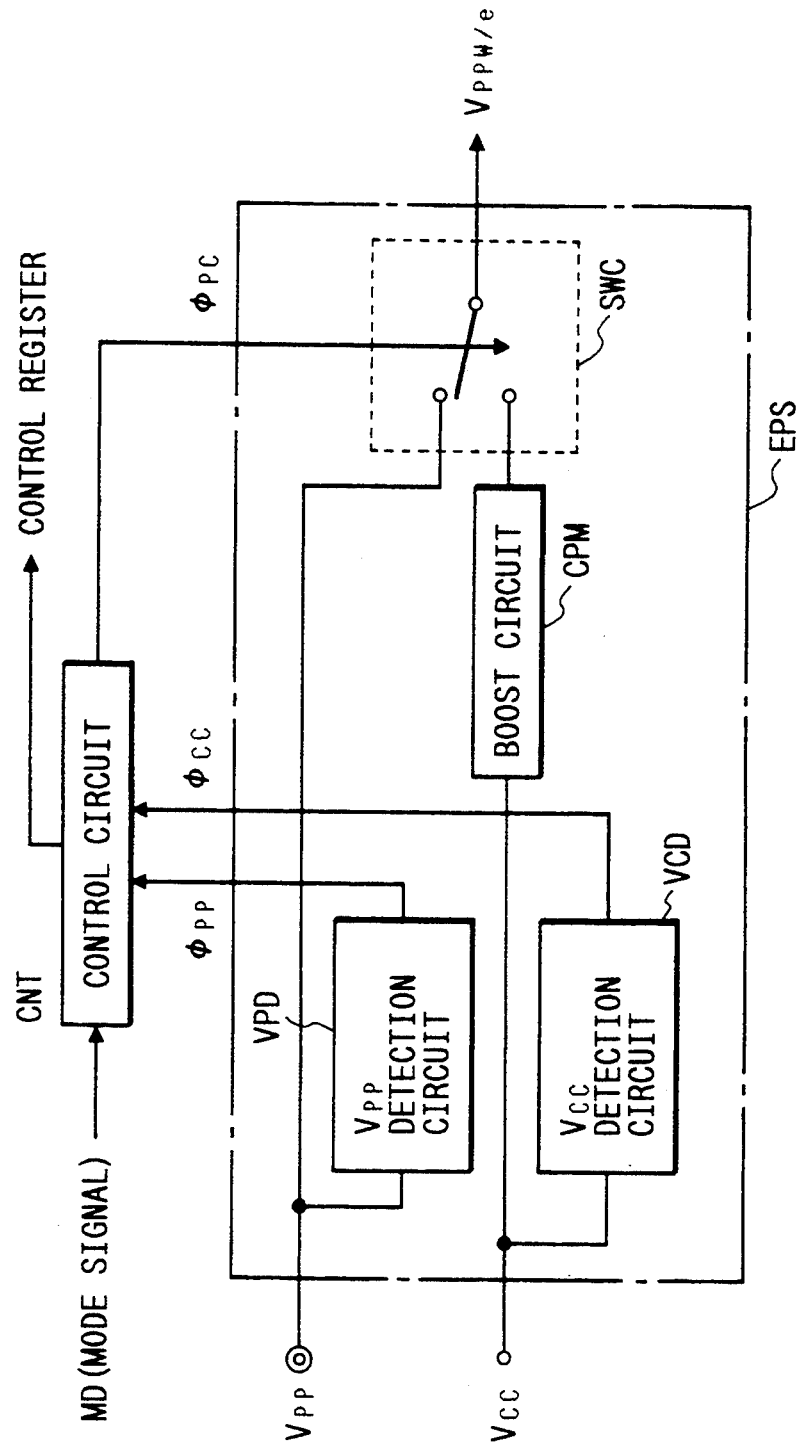
FIG. 5 is a block diagram showing a further example of a power supply circuit configuration.
Figure 6:
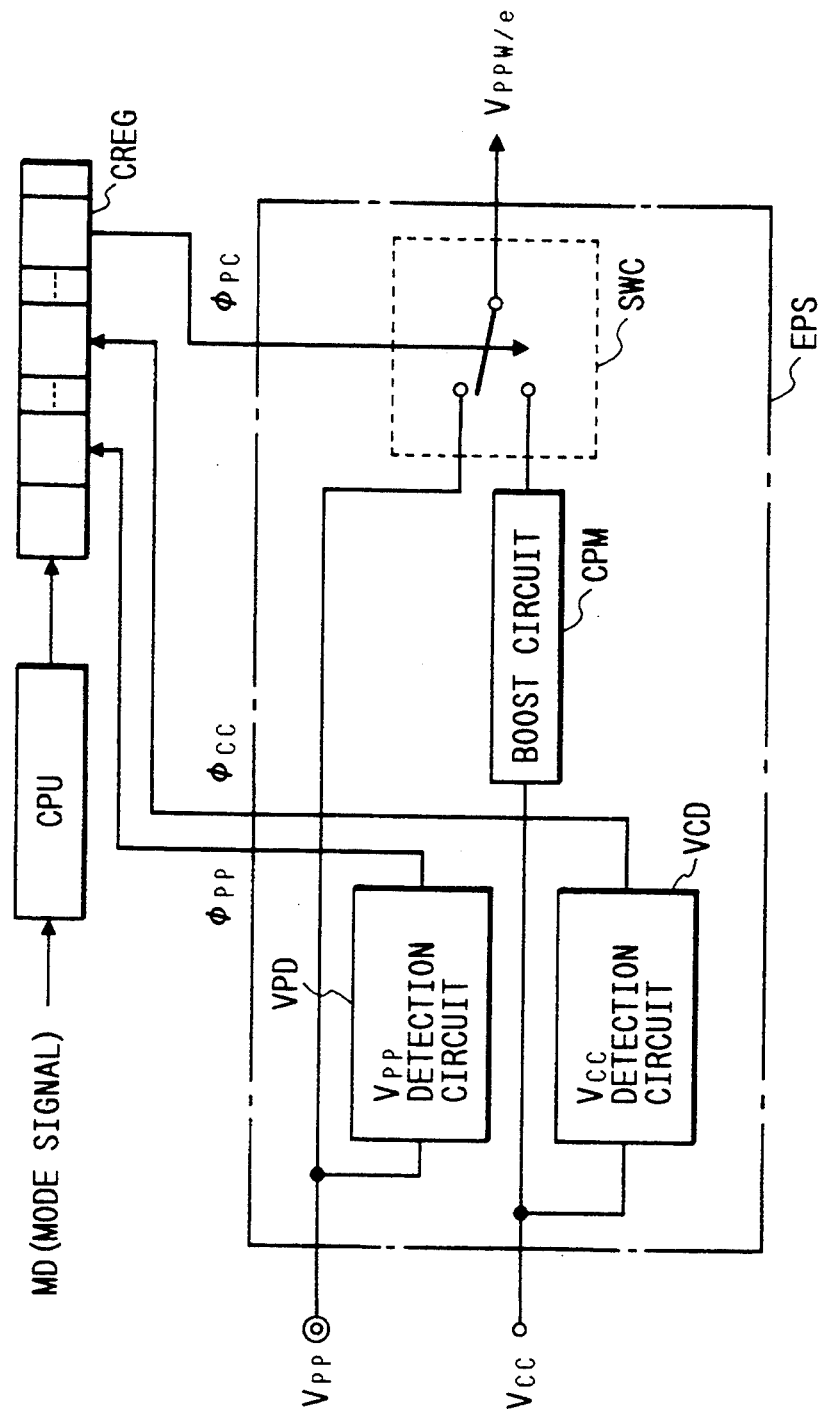
FIG. 6 is a block diagram showing a further example of a power supply circuit configuration.

FIG. 4, 5 and 6 show other embodiments of the control methods for the power supply circuit EPS. The configurations of the power supply circuit EPS in these figures are the same as that shown in FIG. 3 and consist of a level detection circuit VCD for Vcc, a level detection circuit VPD for Vpp, a boost circuit CPM, and a voltage selection switch SWC.

Of FIGS. 4, 5 and 6, the embodiment of FIG. 4 is provided with a dedicated control circuit CNT that, in place of the central processing unit CPU, performs status check and control on the power supply circuit EPS. In the embodiment of FIG. 5, the dedicated control circuit CNT, according to the mode signal MD supplied from outside, determines which voltage—either the stepped-up voltage generated by the boost circuit CPM or the power supply voltage Vpp supplied to the power supply pad Pvp—should be selected and supplied as the program/erase voltage Vppw/e to the flash memory FMRY and, according to the result of the decision, forms a control signal for the voltage selection switch SWC. The dedicated control circuit CNT can be provided in the control circuit CONT shown in FIG. 1 and 2.

[0021]

If the mode signal MD specifies that the programming and erasing be done according to the boost voltage of the power supply voltage $V_{ss}$, the boost voltage of the power supply voltage $V_{cc}$ is fed as the program/erase voltage Vppw/e to the internal flash memory FMRY even when the power supply voltage Vpp fed to the power supply pad Pvp is higher than the specified level. The result of the decision is reflected on the control register CREG.

The embodiment of FIG. 6 has the function of the dedicated control circuit CNT of FIG. 5 performed by the central processing unit CPU.

While the above embodiments are provided with both the level detection circuit VCD for Vcc and the level detection circuit VPD for Vpp, it is possible, in a system that does not use a battery, to omit the level detection circuit VCD for Vcc and incorporate only the level detection circuit VPD for Vpp in the power supply circuit EPS because the power supply voltage $V_{cc}$ is generally stable.

[0022]

Figure 7:
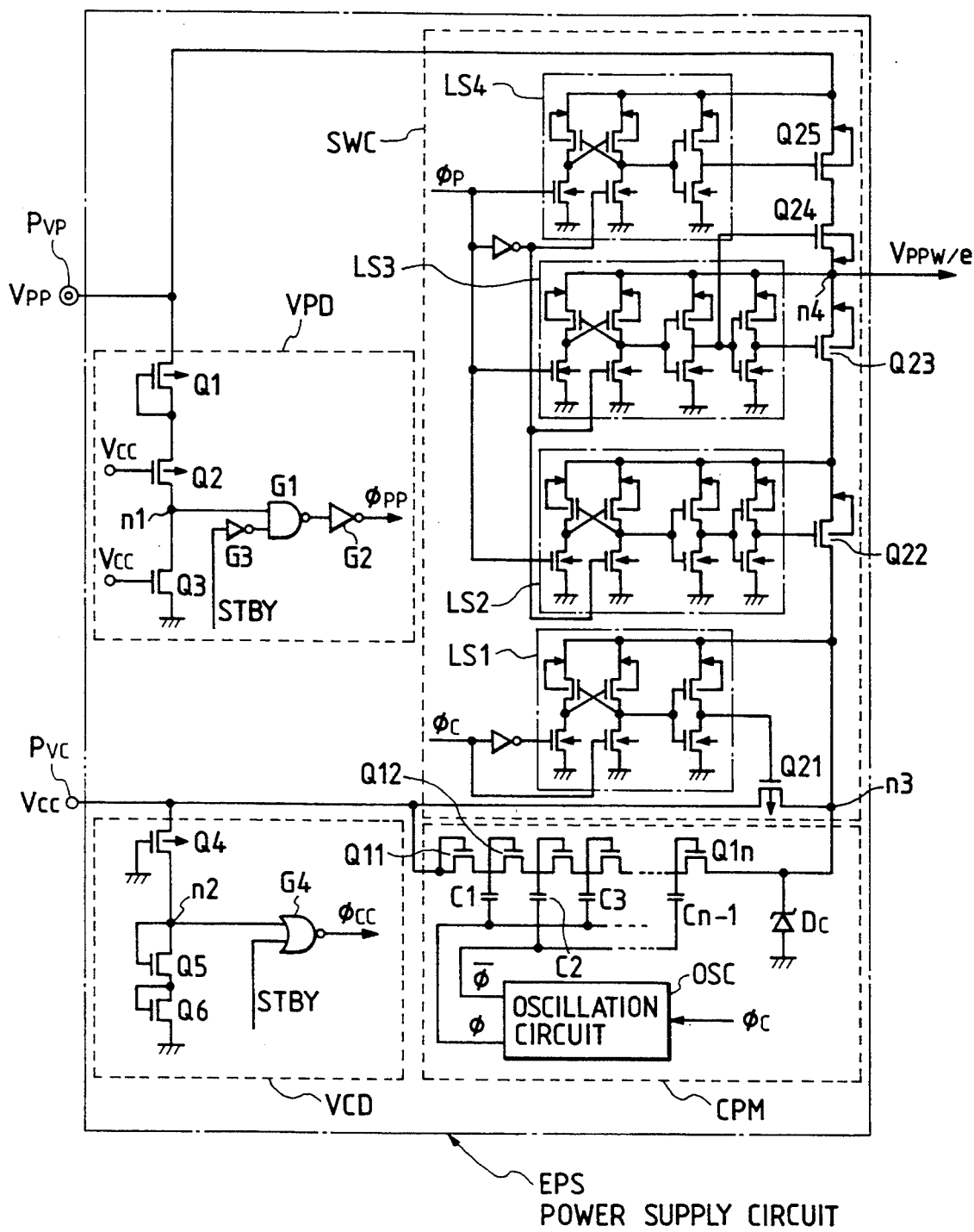
FIG. 7 is a circuitry showing the detail of one example of a power supply circuit.

FIG. 7 shows an example of detailed circuit configuration of the power supply circuit EPS. In FIG. 7, the circuits assigned the same reference numbers as those in FIG. 3 to 6 represent the identical circuits.

The level detection circuit VPD for Vpp includes between the power supply line connected to the power supply pad Pvp and the grounding point: a voltage dividing circuit consisting of two P-channel MOS transistors Q1, Q2 and an N-channel MOS transistor Q3 connected in series; and a NAND gate G1 taking as an input the potential at the node n1 produced by the voltage dividing circuit, and an inverter G2.

The MOS transistor Q1 is diode-connected, so to speak, which means that the gate and drain terminals are short-circuited. The MOS transistors Q2 and Q3 have their gate terminals applied with the power supply voltage $V_{cc}$, and the MOS transistor Q3 is kept turned on at all times. The other input terminal of the NAND gate G1 is supplied a standby signal STBY inverted by an inverter G3 which is fed from outside the semiconductor chip CHP to control the operation state.

[0023]

In the level detection circuit VPD for Vpp of this embodiment, when the voltage Vpp of the power supply pad Pvp is low,, the impedance of the MOS transistors Q1, Q2 becomes high bringing the node n1 close to the ground potential (0 V). Hence, the potential of the node n1 is lower than the logic threshold value (about 2.5 V) of the NAND gate G1, holding the detection signal $\phi$pp at low level.

With the low-level standby signal STBY supplied, as the voltage Vpp of the power supply pad Pvp gradually increases, the impedance of the MOS transistors Q1, Q2 becomes progressively small. If the threshold value of the MOS transistors Q1, Q2 is taken as Vth, as the program/erase voltage Vpp exceeds (Vcc+2Vth), a through current starts to flow in the MOS transistors Q1–Q3, increasing the potential of the node n1. When the voltage Vpp further increases to 10–11 V, the potential of the node n1 exceeds the logic threshold value, of the NAND gate G1, changing the detection signal $\phi$pp to high level, which indicates that the program/erase voltage Vpp fed to the power supply pad Pvp is higher than the specified level.

The reason that the NAND gate G1 is used and controlled by the standby signal STBY is to prevent the through current to flow to the NAND gate G1 when the potential of the node n1 is close to the logic threshold value of the NAND gate G1.

[0024]

The level detection circuit VCD for Vcc includes between the power supply line connected to the power supply pad Pvc: a voltage dividing circuit consisting of one P-channel MOS transistor Q4 and two N-channel MOS transistors Q5, Q6 connected in series, and a NOR gate G4 that takes in a potential of the node n2 produced by the voltage dividing circuit. The MOS transistors Q5, Q6 are diode-connected and of relatively large size. The MOS transistor Q4 has its gate terminal applied with a 9round potential and is kept turned on at all times. The other input terminal of the NOR gate G4 is supplied the standby signal STBY.

[0025]

Because the level detection circuit VCD for Vcc of this embodiment consists of the diode-connected MOS transistors Q5, Q6 of relatively large size, the potential of the node n2 increases gradually if the voltage Vcc is higher than 2Vth, until it is saturated at around 2Vth. The threshold voltage of the NOR gate G4 has Vcc-dependency and increases in proportion to the Vcc.

Hence, with the low-level standby signal STBY supplied, when the power supply voltage $V_{cc}$ becomes high so that the threshold voltage of the NOR gate G4 exceeds the potential of the node n2 (2Vth), the detection signal $\phi$cc goes high, indicating that the power supply voltage $V_{cc}$ is higher than the specified level.

The states of the above detection signals $\phi$pp and $\phi$cc are reflected on the control register CREG and, according to these detection signals, the control signal $\phi$ of the voltage selection switch SWC and the operation control signal $\phi$c of the step-up circuit CPM are formed.

[0026]

The boost circuit CPM consists, between the power supply line (Vcc line) connected to the power supply pad Pvc and the output node n3, of: diode-connected series MOS transistors Q11–Q1n; (n-1) capacitors C1, C2, . . . , Cn-1 connected to the connection node of each MOS transistor; a clamp diode Dc connected between the output node n3 and the grounding point; and an oscillation circuit OSC. In this boost circuit CPM, the oscillation circuit OSC produces complementary clocks $\phi$, /$\phi$, which, through the capacitors, alternately turn on and off every other MOS transistors Q11–Q1n, moving the electric charge toward the capacitor on the output terminal side to increase the Vcc voltage. The oscillation circuit OSC consists, for example, of a ring oscillator which is started or stopped by the operation control signal $\phi$c.

[0027]

The voltage selection switch SWC includes: a MOS transistor Q21 connected between the power supply pad Pvc and the node n3; a level shift circuit LS1 that level-shifts the operation control signal $\phi$c and supplies it to the gate of the MOS transistor Q21; two P-channel MOS transistors Q22, Q23 connected in series between the node n3 and the circuit'output node n4; level shift circuits LS2, LS3 that level-shift the switching control signal $\phi$p and feed it to the gates of the MOS transistors Q22, Q23; two P-channel MOS transistors Q24, Q25 connected in series between the power supply pad Pvp and the output node n4; and a level shift circuit LS4 that level-shifts the switching control signal $\phi$p and feeds it to the gate of the MOS transistor Q25.

[0028]

The MOS transistors Q22, Q23 have their wells connected to the node n3 side and n4 side respectively, and the MOS transistors Q24, Q25 have their wells connected to the node n4 side and Vpp line side respectively. The reason that the two MOS transistors are connected in series to differentiate the well potentials is that even when the Vpp, with the MOS transistors Q22, Q23 turned on, lowers below the boost voltage, a current will not flow to the level shift circuit LS4 and that even when the Vpp, with the MOS transistors Q24, Q25 turned on, becomes higher than the boost voltage, a current will not flow into the level shift circuits LS1, LS2. When only one MOS transistor is provided between each node and when the potential relation is reversed, for example, a current will flow into the level shift circuit through the well.

[0029]

The level shift circuits LS1–LS4 each consist of a flip-flop circuit that uses the boost voltage or external program/erase voltage vpp as its power supply voltage, and an inverter that shapes the output from the flip-flop circuit. LS1 latches the operation control signal $\phi$c and shifts its level, and SL2–LS4 latch the switching control signal φp and shift its level. The level shift circuit LS3 doubles as a gate control voltage generation circuit for the MOS transistor Q23 and as the one for the MOS transistor Q24.

Of the level shift circuits LS1–LS4, LS1 and LS2 use the potential at the node n3 (Vcc or its boost voltage) as its power source voltage, LS3 uses the output voltage Vppw/e and LS4 the external program/erase voltage Vpp. In this way, it is possible to reliably turn on and off the MOS transistors QZ1–Q24 irrespective of the power supply voltage level.

[0030]

Figure 8:
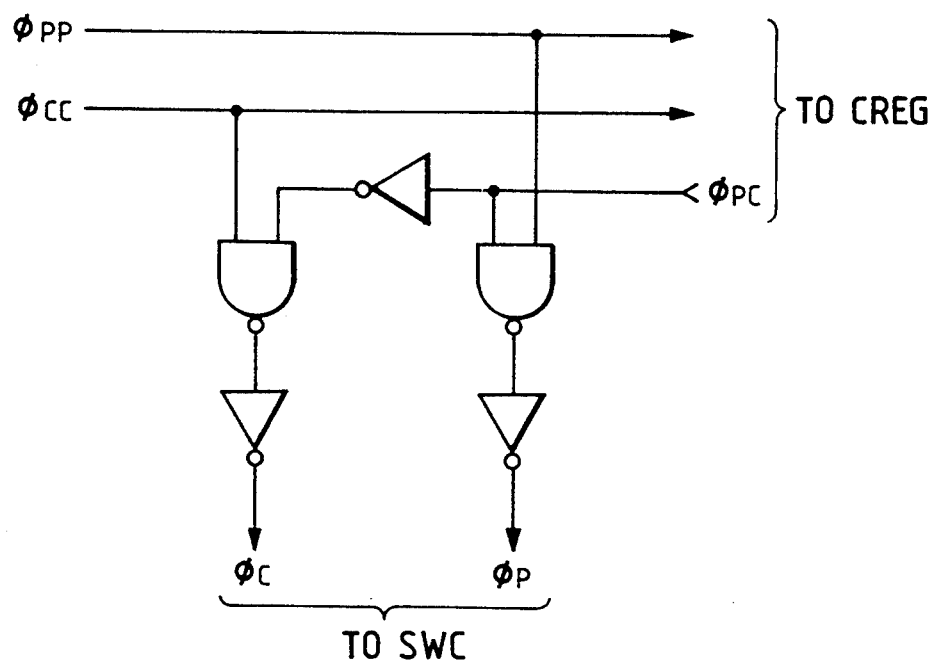
FIG. 8 is a logic circuit representing an example circuit configuration that generates a control signal supplied to the power supply circuit.

FIG. 8 shows one example circuit that forms the control signals φc, φp according to the detection signal φpp and φcc. In the figure, φpc is a signal that represents a voltage switching flag provided to the control register. This flag is set by the central processing unit CPU referencing the detection signals φpp and φcc (φpp, φcc and MD when there is a mode signal MD).

When the operation control signal φc is high, the oscillation circuit OSC is activated and the MOS transistor Q21 is turned off. When φc is low, the oscillation circuit OSC is stopped and the MOS transistor Q21 is turned on. The reason that the MOS transistor Q21 is turned on to feed the voltage Vcc to the node n3 when φc is low is to prevent the node n3 from becoming floated as may be caused by the stopping of the oscillation circuit OSC.

[0031]

When the voltage switching control signal φp is high, the MOS transistors Q24 and Q25 are turned on and Q22 and Q23 are turned off to output the Vpp as the program/erase voltage Vppw/e. When the switching control signal φp is low, the MOS transistors Q22, Q23 are turned on and Q24 and Q25 are turned off to output the boost voltage as the program/erase voltage Vppw/e. The control signals φc and φp are not held high simultaneously.

Table 1 shows the relationship between the power supply voltages Vpp, Vcc (detection signals φpp, φcc), the control signal φpc, the control signals φc, φp, and the program/erase voltage Vppw/e.

[0032]

[TABLE 1]

| Vpp (φpp) | H | H | L | L |
|---|---|---|---|---|
| Vcc (φcc) | H | L | H | L |
| φpc | H/L | H | L | — |
| φp | H/L | H | L | L |
| φc | H/L | L | H | L |
| Read/write enabled or disabled | Enabled | Enabled | Enabled | Disabled |
| Vppw/e | Vpp/boost Vcc | Vpp | boost Vcc | — |

[0033]

Next, referring to FIGS. 9 and 10, the working principle of programming and erasing the flash memory will be described.

Figure 9:
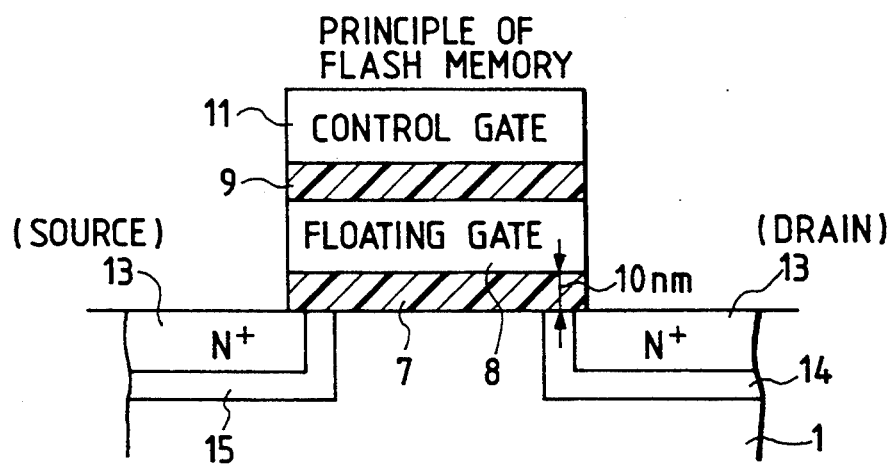
FIG. 9 is a schematic cross section explaining the principle of the flash memory.

The memory cell schematically shown in FIG. 9 consists of an insulated gate field-effect transistor of two-layer structure.

In the figure, designated 1 is a P-type silicon substrate; 14 a P-type semiconductor area formed in the silicon substrate 1; 13 an N-type semiconductor area; and 15 a low-concentration N-type semiconductor area. Denoted 8 is a floating gate formed over the P-type silicon substrate 1 with a thin oxide film 7 (about 10 nm thick) interposed as a tunnel insulation film; and 11 a control gate formed over the floating gate 8 with an oxide film 9 interposed. A source is formed of 13 and 15 and a drain is formed of 13, 14. Information stored in this memory cell is held in the transistor as a change in the threshold voltage.

[0034]

Unless otherwise specifically noted in the following description, the transistor in the memory cell storing the information (hereinafter referred to as a storage transistor) is of N-channel type.

The operation of programming information into the memory cell is realized by applying a high voltage such as 12 V to the control gate 11 and drain 13 to inject electrons (hot electrons) into the floating gate 8 from the drain side by the avalanche injection. As a result of this programming, the threshold voltage of the storage transistor as seen from the control gate 11 becomes higher than that of the storage transistor in the erased state when no programming is performed, as shown in FIG. 10.

[0035]

On the other hand, the erase operation is accomplished by applying a high voltage to the source to pull electrons from the floating gate 8 toward the source by a tunnel effect. As shown in FIG. 10, the threshold voltage of the storage transistor as seen from the control gate 11 is lowered as a result of the erase operation.

Figure 10:
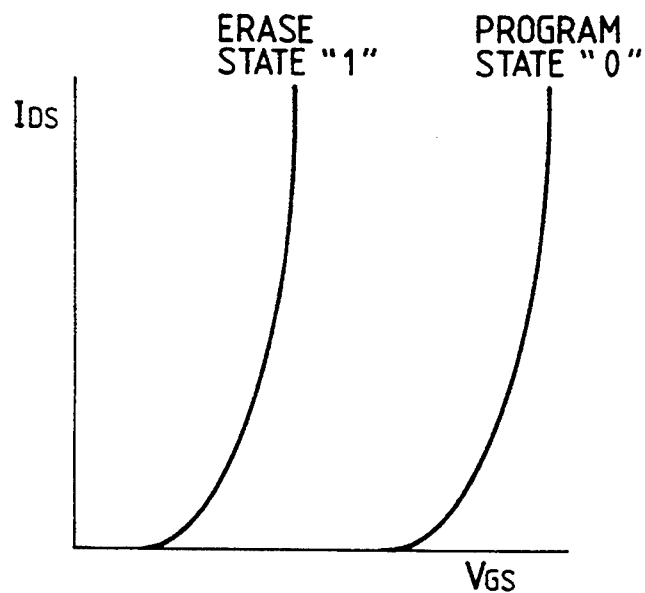
FIG. 10 is a graph representing a gate voltage vs. drain current characteristic of memory elements of the flash memory.

In FIG. 10, the threshold voltage of the storage transistor is set at the positive level either in the programmed or erased state. That is, the threshold voltage in the programmed state is held high with respect to the word line selection level given from the word line to the control gate 11, and the threshold voltage in the erased state is held low. With these two threshold voltages and the word line selection level set in such a relationship, the memory cell can be formed by a single transistor without adopting a selection transistor.

[0036]

In electrically erasing stored information, the electrons accumulated in the floating gate 8 are drawn into the source electrode. Thus, performing the erase operation for a relatively long time will pull a larger amount of electrons than was injected into the floating gate 8 during the program operation. Therefore, if an over-erase in which electrical erase operation is continued for a relatively long duration is done, the threshold voltage of the storage transistor becomes negative, giving rise to an inconvenient situation where the word line selection level is interpreted to be at the same level as the selected level even when it is in fact at the nonselection level. The programming can also be performed by utilizing the tunnel current as in the case of the erase operation.

[0037]

In the read operation, a weak programming is done to the memory cell, that is, the voltage to be applied to the drain 13 and control gate 11 is limited to a relatively low value in order to prevent undesired injection of carriers into the floating gate 8. For example, a low voltage of about 1 V is applied to the drain 13 and another low voltage of about 5 V to the control gate 11. By these voltage applications, the magnitude of the channel current flowing through the storage transistor is detected to determine whether the information held in the memory cell is "0" or "1."

[0038]

Figure 11:
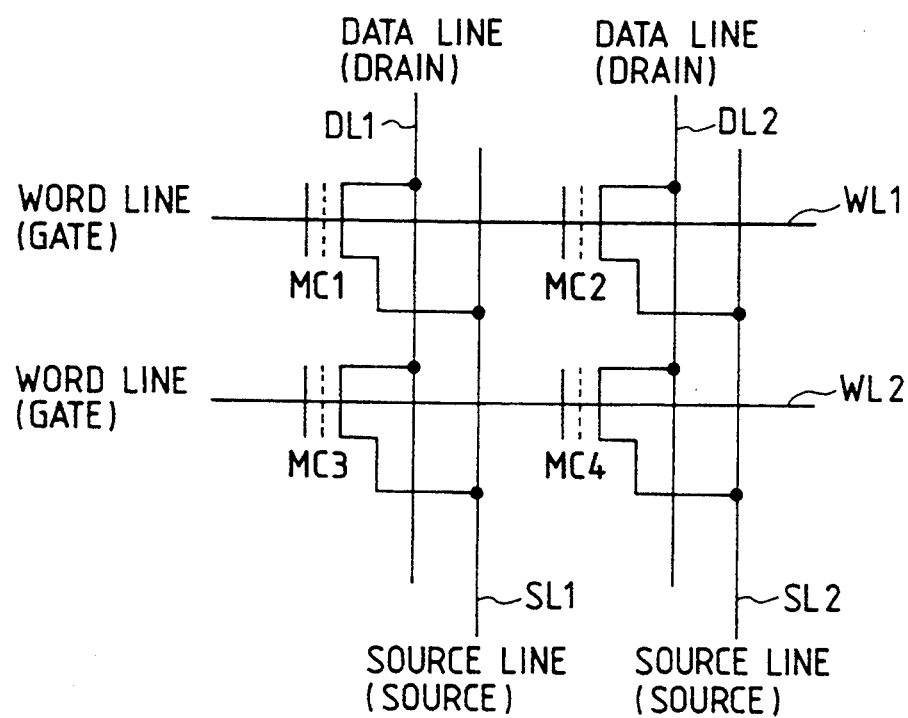
FIG. 11 is a schematic diagram showing a memory cell array configuration using memory transistors of FIG. 9.

FIG. 11 shows the fundamental configuration of the memory cell array using the storage transistors. In the figure, four storage transistors (memory cells) MC1–MC4 are representatively shown. In the memory cells matrix-arranged in the X and Y directions, the control gates (memory cell selection gates) of the storage transistors MC1, MC2 (MC3, MC4) arranged in the same row are connected to the corresponding word line WL1 (WL2) and the drain areas (memory cell input-/output nodes) of the storage transistors MC1, MC3 (MC2, MC4) arranged in the same column are connected to the corresponding data line DL1, DL2. The source areas of the storage transistors MC1, MC3 (MC2, MC4) are connected to the source line SL1 (SL2).

[0039]

FIG. 12 shows one example of voltage conditions for the erase and program operations on the memory cells. In the figure, the memory element represents a memory cell and the gate represents a control gate as the memory cell selection gate. In the figure, the erase operation of the negative voltage method involves applying a negative voltage of, say −10 V, to the control gate to form an electric field strong enough to erase the information. As is evident from the voltage conditions shown in the figure, because the positive voltage erase method need only apply a high voltage to the source of the selected memory element, a simultaneous erasing can be done to all memory cells with at least their sources commonly connected.

[0040]

Therefore, in the configuration of FIG. 11, if the source lines SL1, SL2 are connected together, the four memory cells MC1-MC4 can be erased in one operation. In this case, by changing the number of memory bits connecting to the same source line, it is possible to arbitrarily set the size of the memory block. Among the source line division methods are one that uses data lines as units (the common source line is extended in the direction of data line) and one that uses word lines as units (the common source line is extended in the direction of word line).

In the negative voltage type erase operation, it will be understood from FIG. 12 that those memory cells with their control gates commonly connected can be erased in one operation.

[0041]

Figure 13:
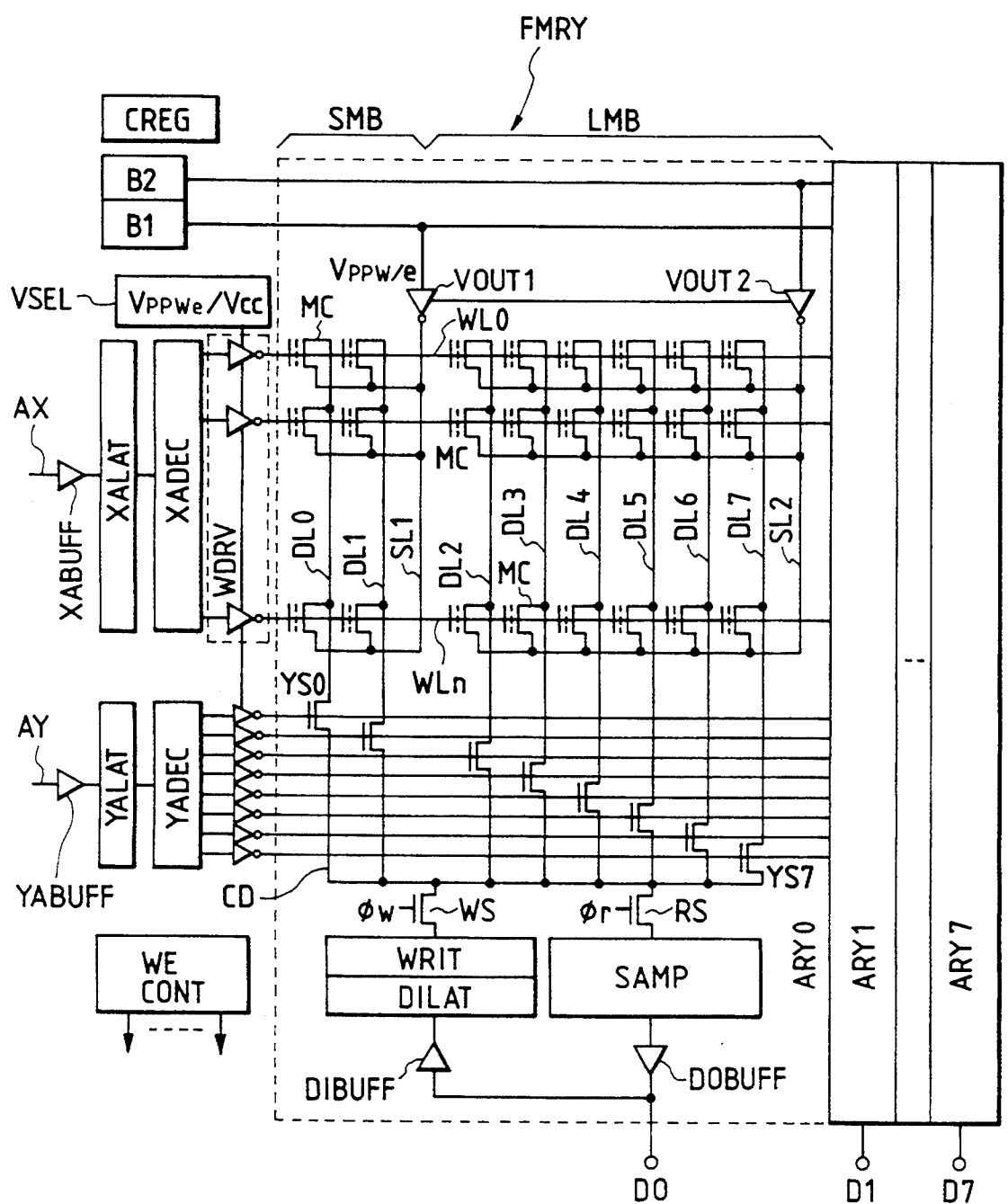
FIG. 13 is a circuit block diagram of the flash memory which is grouped, by data lines, into blocks of memory with differing capacities.

FIG. 13 shows an example circuit block diagram of the flash memory with simultaneously erasable memory blocks having different memory capacities.

The flash memory FMRY shown in the figure has 8-bit data input/output terminals D0-D7, each provided with a memory mat ARY0-ARY7. Each of the memory mats ARY0-ARY7 has a memory block LMB with a relatively large memory capacity and another memory block SMB with a relatively small memory capacity. In the figure the memory mat ARY0 is representatively shown in detail. Other memory mats ARY1-ARY7 are similarly configured.

[0042]

Each of the memory mats ARY0-ARY7 has matrix-arranged the memory cells MC which are formed of insulated gate field-effect transistors of two-layer gate structure. In the figure, designated WL0-WLn are word lines common to all memory mats ARY0-ARY7.

The control gates of memory cells arranged in the same row are connected to the corresponding word line. In each of the memory mats ARY0-ARY7, the drain areas of the memory cells MC arranged in the same column are connected to the corresponding data line DL0-DL7. The source areas of the memory cells making up the memory block SMB are commonly connected to the source line SL1, while the source areas of the memory cells making up the memory block LMB are commonly connected to the source line SL2.

[0043]

The source lines SL1, SL2 are applied a high voltage Vppw/e from the voltage output circuits VOUT1, VOUT2, which is used for erasing. This high voltage Vppw/e is supplied from the power supply circuit EPS mentioned earlier. That is, the voltage Vppw/e is either the program/erase voltage Vpp or the boost voltage of Vcc selected by the voltage selection switch SWC.

The output operation of the voltage output circuits VOUT1, VOUT2 is selected by the value of bits B1, B2 in an erase block specification register whose data is set or cleared by the central processing unit CPU. When, for example, the erase block specification register's bit B1 is set with "1," only the memory block SMB in each of the memory mats ARY0-ARY7 is made erasable at one time. When the erase block specification register's bit B2 is set with "1," only the memory block LMB in each of the memory mats ARY0-ARY7 is made erasable in one operation. When both of the bits B1, B2 are set with "1," then the entire flash memory can be erased at one time.

[0044]

Selection of the word lines WL0-WLn is done by a row address decoder XADEC decoding a row address signal AX, which is taken in via a row address buffer XABUFF and a row address latch XALAT. A word driver WDRV drives the word lines according to the selection signal output from the row address decoder XADEC.

In the data read operation, the word driver WDRV operates on the voltage Vcc of, say, 5 V and the ground voltage of, say, 0 V, both supplied from a voltage selection circuit VSEL, and drives the word line to be selected to a selection level by the voltage Vcc and keeps the non-selected word line at the non-selection level such as the ground potential.

In the data write or program operation, the word driver WDRV operates on the voltage vppw/e of, say 12 V, supplied from the voltage selection circuit VSEL and on the ground potential of 0 V, and drives the selected word lines to a high voltage level of 12 V for programming. During the data erase operation, the output of the word driver WDRV is set to a low voltage level of 0 V. The voltage Vppw/e is supplied from the power supply circuit EPS.

[0045]

In each of the memory mats ARY0-ARY7, the data lines DL0-DL7 are connected through column selection switches YS0-YS7 to a common data line CD. Switch control of the column selection switches YS0-YS7 is done by a column address decoder YADEC decoding a column address signal AY taken in via a column address buffer YABUFF and a column address latch YALAT.

The output selection signal of the column address decoder YADEC is supplied commonly to all the memory mats ARY0-ARY7. Thus, when one of the output selection signals of the column address decoder YADEC is set to a selection level, one data line is connected to the common data line CD in each of the memory mats ARY0-ARY7.

[0046]

The data read out from the memory cell MC to the common data line CD is given through a selection switch RS to a sense amplifier SAMP, where it is amplified and output through a data output latch DOLAT and from a data output buffer DOBUFF. The selection switch RS is set to the selection level in synchronism with the read operation.

The write data or program data supplied from outside is held in a data input latch DILAT through a data input buffer DIBUFF. When the data held in the data input latch DILAT is "0," a program circuit WRIT supplies a programming high voltage to the common data line CD through a selection switch WS.

The programming high voltage is sent through the data line selected by the column address signal AY to the drain of the memory cell whose control gate is applied with a high voltage by the row address signal AX. This writes data into the selected memory cell. The selection switch WS is set to the selection level in synchronism with the write operation (program operation). The programming and erasing timing signals and voltage selection/control signals are generated by the program/erase control circuit WECONT.

[0047]

Figure 14:
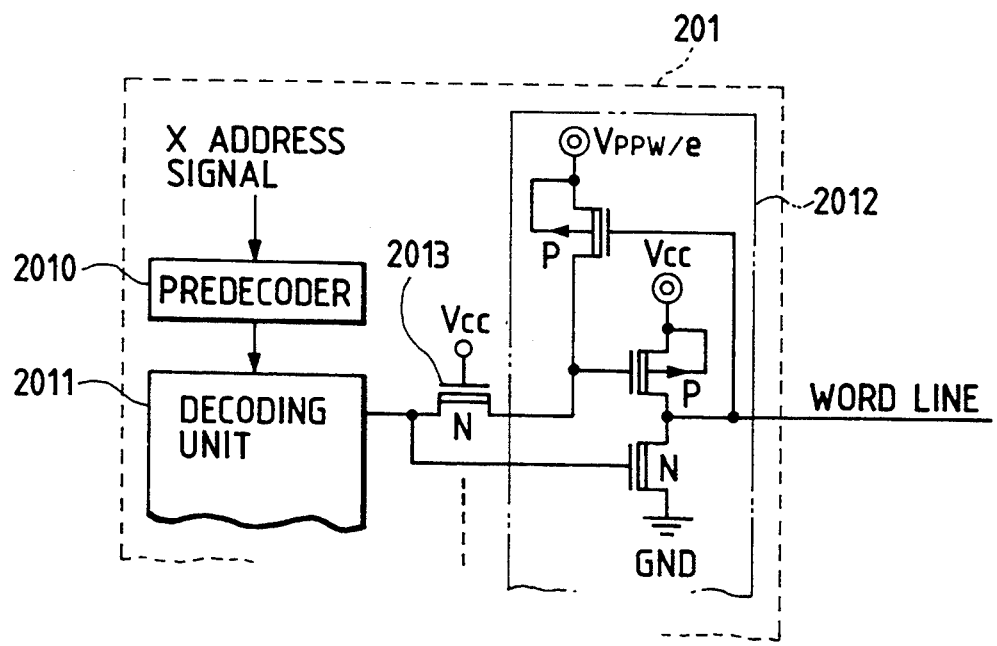
FIG. 14 is an explanatory diagram showing the detail of an X-address decoder contained in the flash memory.

FIG. 14 shows one example of the X address decoder and the word driver 201. In the figure, the configuration corresponding to one word line is representatively shown. The X address signal is decoded by a predecoder 2010 whose output is further decoded by a decode unit 2011. According to the output of the decode unit 2011, a drive unit 2012 selects and drives a word line. The predecoder 2010 and the decode unit 2011 are operated by the power supply voltage $V_{cc}$ of, say, 5 V. The drive unit 2012 is a high-voltage driven system that is driven by a high voltage such as the voltage Vppw/e. Denoted 2013 is a high-voltage withstand N-channel MOS transistor used to isolate the 5 V system and the high-voltage system.

During the programming, the voltage Vppw/e is supplied to the drive unit 2012, which sets the word lines either to the selection level of Vppw/e or to the non-selection level of 0 V. During the read operation, the power supply voltage $V_{cc}$ is fed to the drive unit 2012, which sets the word lines either to the selection level of Vcc or to the non-selection level of 0 V. Switching between Vppw/e and Vcc is done by a circuit similar to the voltage selection switch SWC in the power supply circuit EPS.

[0048]

Figure 15:
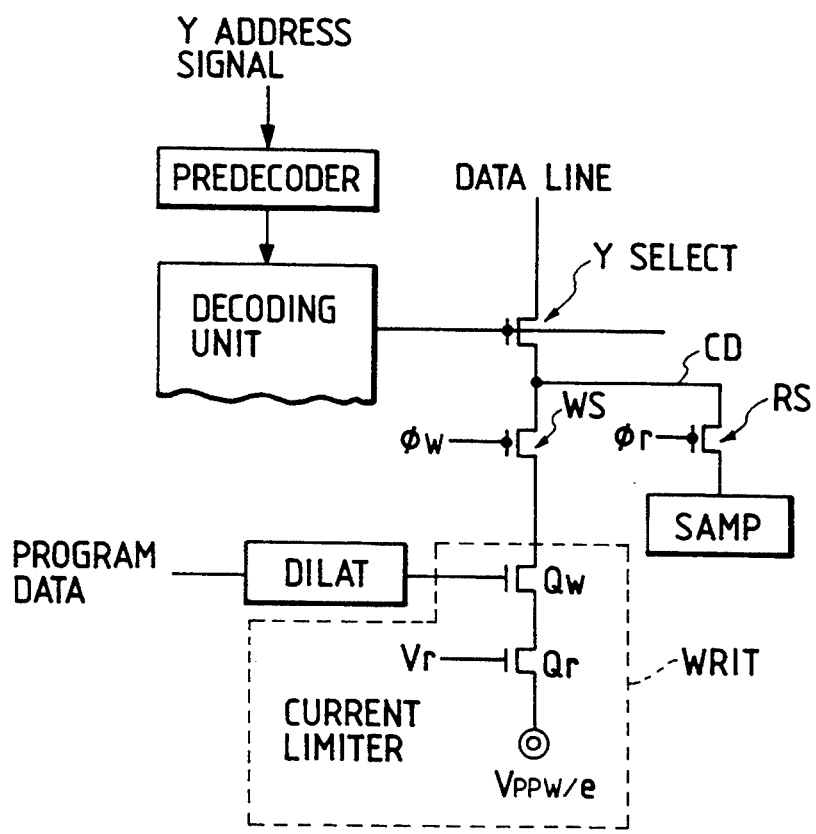
FIG. 15 is an explanatory diagram showing the detail of a programming circuit contained in the flash memory.
Figure 16:
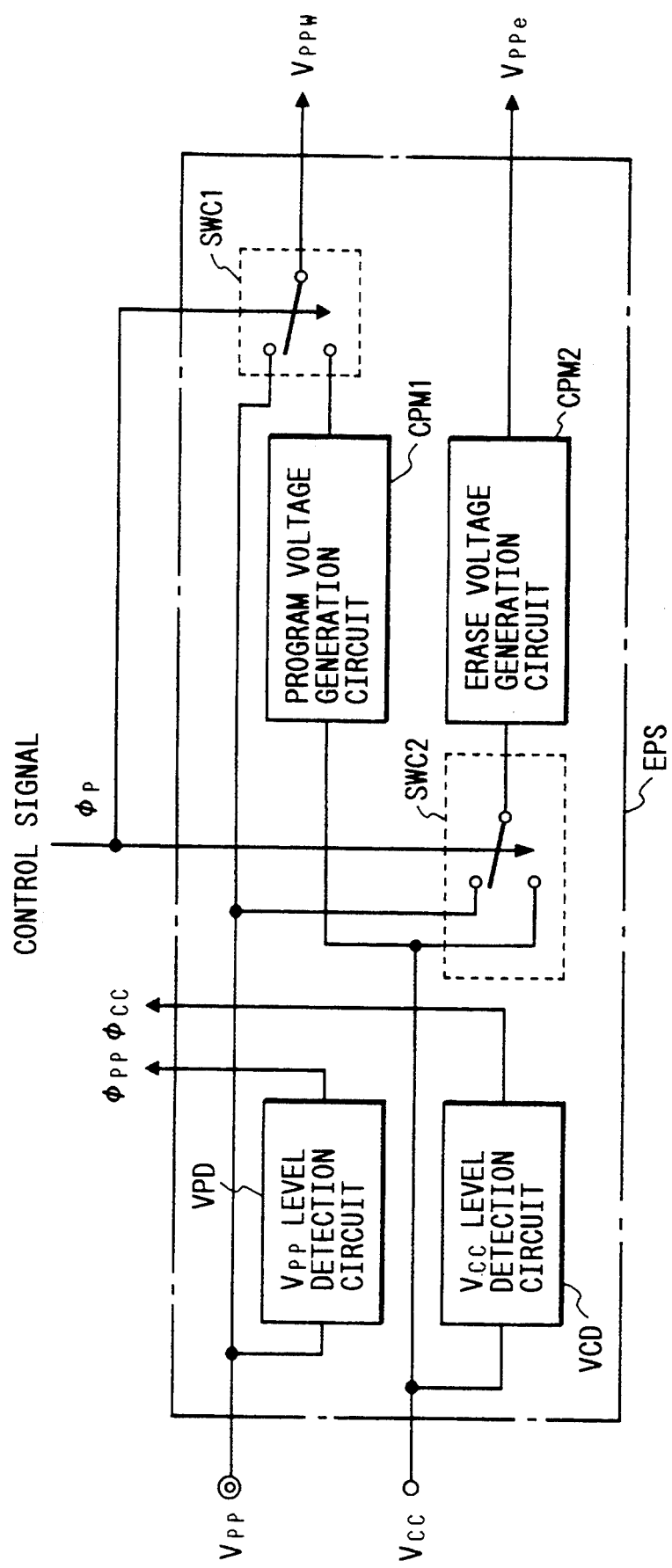
FIG. 16 is a block diagram showing another example of a power supply circuit suitably applied to a negative-voltage programming flash memory.

FIG. 15 shows one example of the program circuit WRIT. In the figure, the configuration corresponding to one data line is representatively shown. This program circuit WRIT consists of a current limiting MOS transistor Qr and a program MOS transistor Qw which is turned on and off according to the program data held in the data input latch DILAT. When Qr and Qw are turned on, the program/erase high voltage Vppw/e is supplied through the Selection switch WS to the common data line CD.

Though not shown, the source circuit used for erasing operation has the same configuration as the word line drive unit of FIG. 14. Hence, the high voltage Vppw/e is also supplied to the erasing source circuit. During the erase operation, the voltage Vppw/e is fed to the specified source line according to the bits B1, B2 of the erase block specification register. In other cases (when no specification is given or during the program and read operations) the voltage is set to 0 V.

[0049]

Next, by referring to FIGS. 16 to 19, description will be given to an embodiment of the power supply circuit EPS when the present invention is applied to a flash memory of a type in which the programming is done by using a high voltage and the erasing by a negative voltage.

Figure 19:
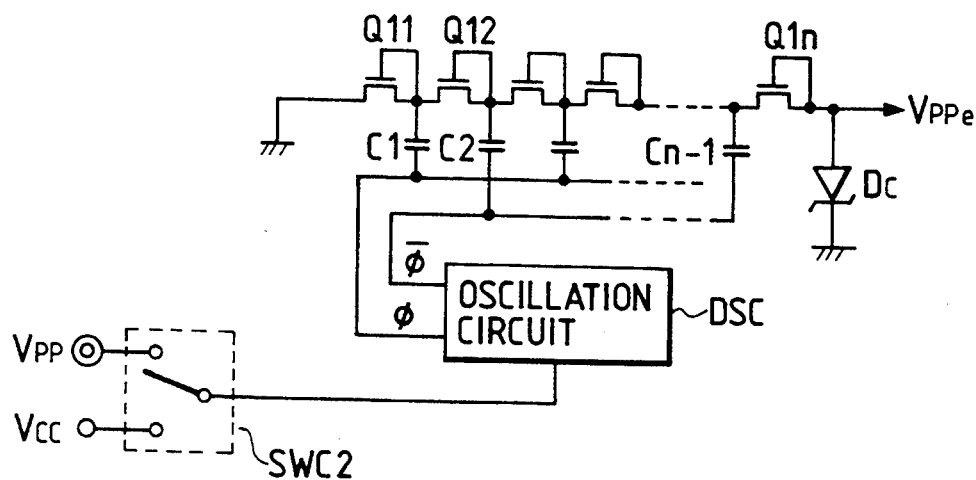
FIG. 19 is a circuitry showing an example of a negative voltage generator.

In the flash memory that performs programming operation by using a high voltage and erasing operation by using a negative voltage, an erasing negative voltage of, say, −10 V is required in addition to the programming voltage of 12 V. The power supply circuit EPS of FIG. 16 has a high-voltage generation circuit CPM1 that produces a programming voltage and a negative voltage generation circuit CPM2 that produces an erasing negative voltage. The high-voltage generation circuit CPM1 and the negative voltage generation circuit CPM2 both consist of a Charge pump that has the same circuit configuration as the boost circuit CPM shown in FIG. 7. Of these, the negative voltage generation circuit CPM2, as shown in FIG. 19, has the source and drain of the MOS transistors Q11–Q1n reversed with respect to the high-voltage generation circuit CPM1 and also has the clamp diode Dc directed in reverse direction.

[0050]

In addition to the level detection circuit VCD for Vpp and the level detection circuit VPD for Vcc, the power supply circuit EPS of this embodiment also has a voltage selection circuit SWC1 that selectively supplies as an internal programming voltage Vppw to the flash memory either the externally supplied programming voltage Vpp or the high voltage generated by the high-voltage generation circuit CPM1, as in the case of the power supply circuit EPS of FIGS. 3 to 6. Further, the power supply circuit EPS of this embodiment is provided with a voltage selection circuit SWC2 that determines whether the negative voltage generation circuit CPM2 should generate a negative voltage according to the externally supplied programming voltage Vpp or the normal operation power supply voltage Vcc. When the negative voltage generation circuit CPM2 is operated by the programming voltage Vpp, the current supply capability of the negative voltage generation circuit CPM2 can be made larger than when the circuit is operated by the power supply voltage $V_{cc}$. Hence, it is possible to perform the erase operation by larger blocks.

The switching control signals for the voltage selection circuits SWC1 and SWC2 can use a common signal $\phi p$. The switching control signal $\phi p$ may be formed either by the central processing unit CPU as in the preceding embodiment of FIGS. 3 to 6 or by providing a dedicated control circuit for forming such a control signal.

[0051]

Figure 17:
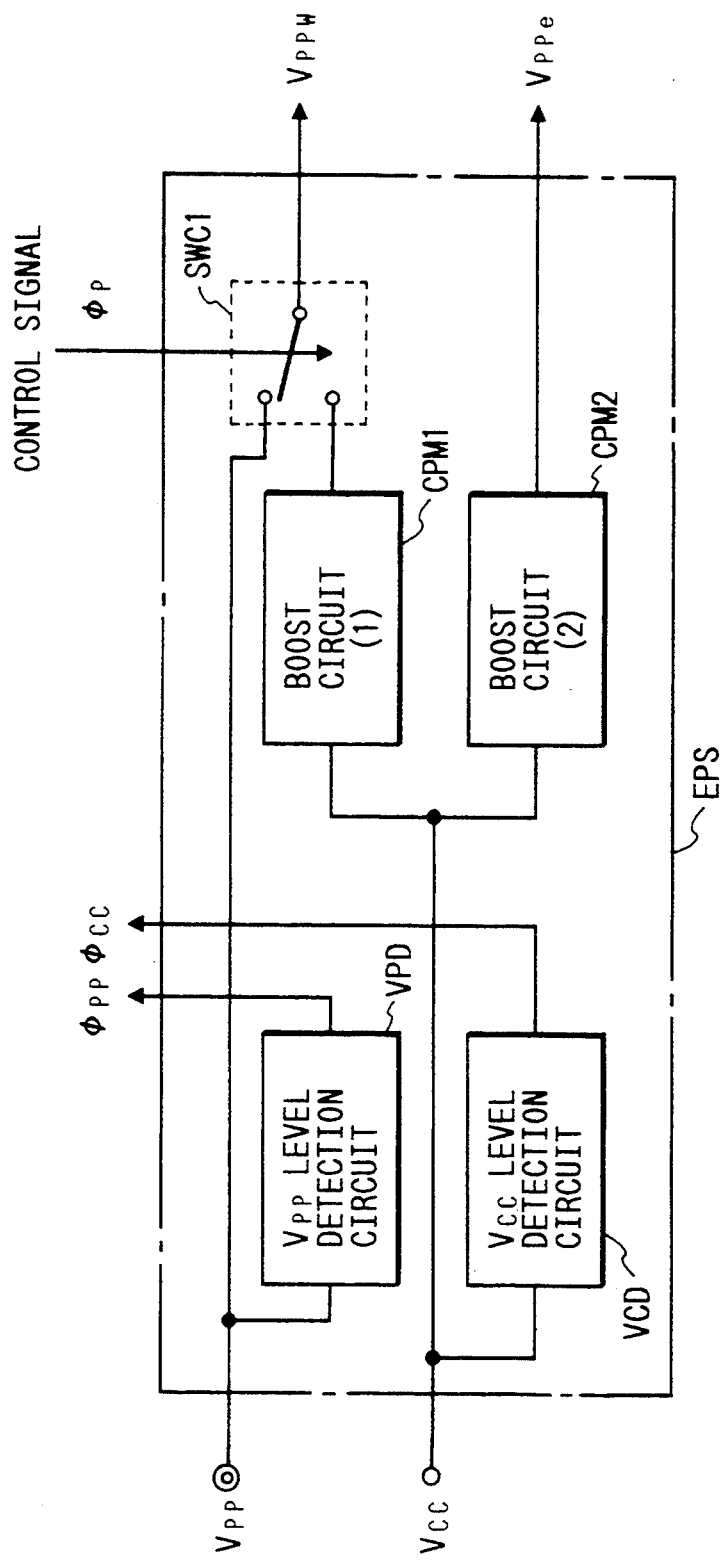
FIG. 17 is a block diagram representing another example of a power supply circuit configuration.
Figure 18:
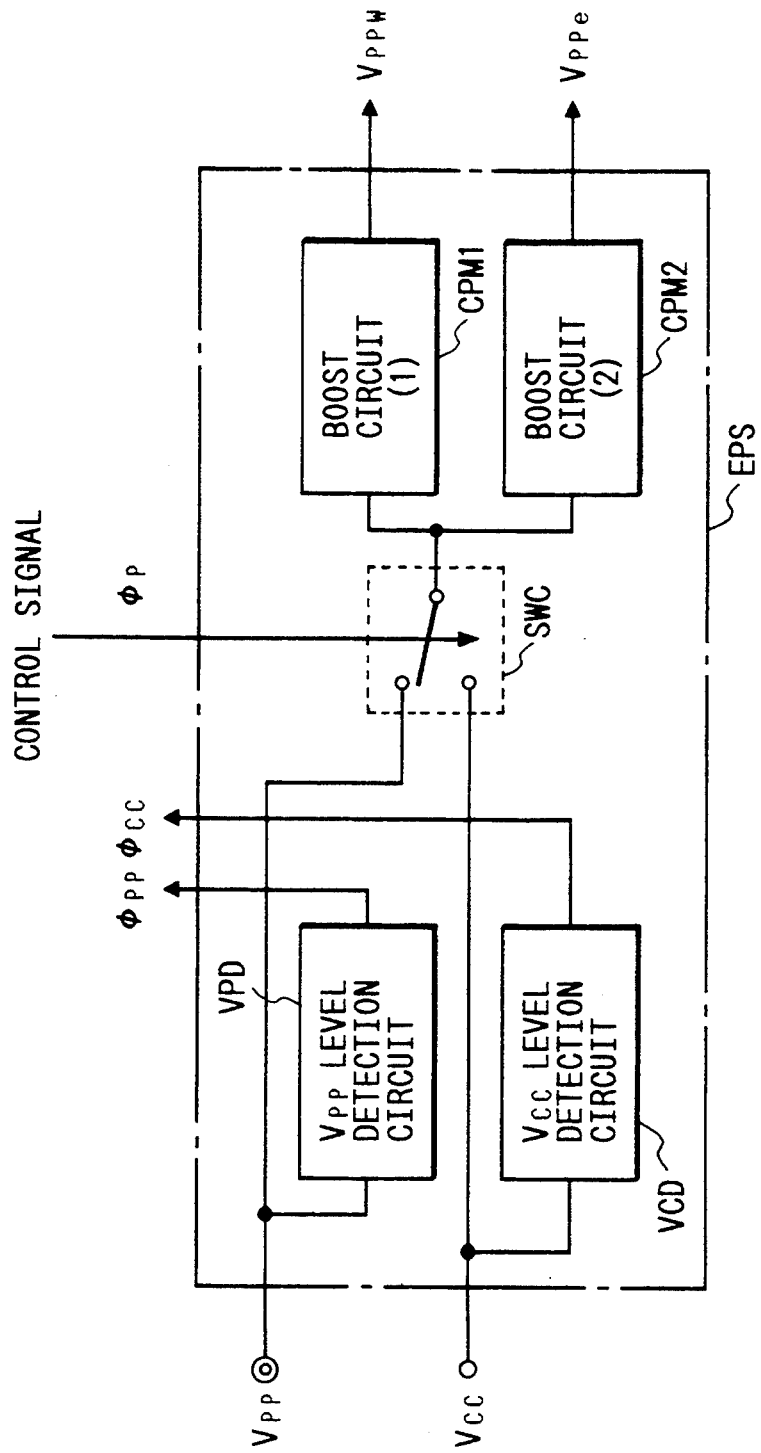
FIG. 18 is a block diagram representing another example of a power supply circuit configuration.

Switching between the programming and erasing voltages can be achieved by a variety of methods, which include one that operates the high-voltage generation circuit CPM1 and the negative voltage generation circuit CPM2 with only the power supply voltage $V_{cc}$ as shown in FIG. 17 and one that supplies the internal programming voltage Vppw and the erasing voltage Vppe from the step-up circuit at all times and switches the operation voltage for the boost circuit as shown in FIG. 18.

The configuration of the power supply circuit EPS may be determined according to the flash memory programming and erasing method. In addition to the above configuration that employs the high voltage and the negative voltage, the power supply circuit EPS may have two kinds of boost circuit when the flash memory uses two kinds of high voltage, whereby these two voltages are selectively supplied by the voltage selection circuits SWC1 and SWC2, as in the case of FIGS. 16 to 18.

[0052]

Figure 20:
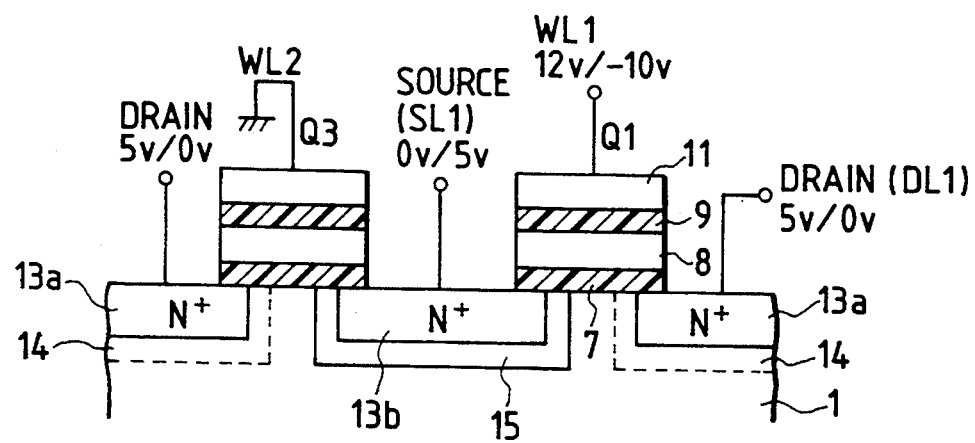
FIG. 20 is a schematic cross section showing the principle of a negative-voltage programming flash memory.
Figure 21:
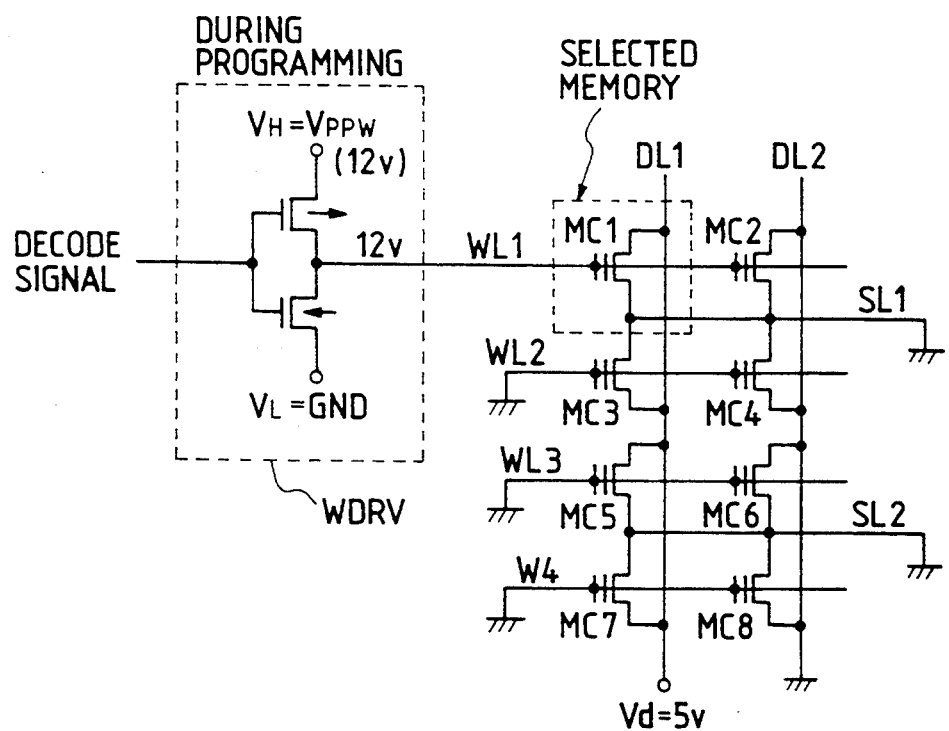
FIG. 21 is a circuitry showing the memory array configuration of the negative-voltage programming flash memory and the state of the flash memory at time of programming.
Figure 22:
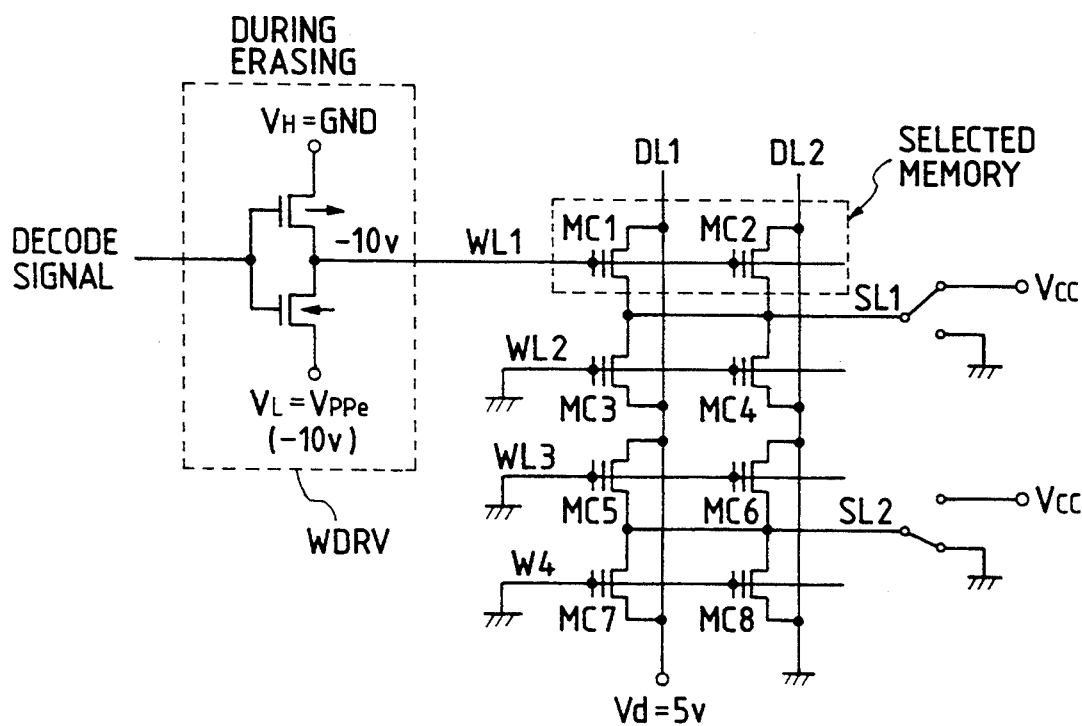
FIG. 22 is a circuitry showing the state of the negative-voltage programming flash memory at time of memory array erasing.

Next, the working principle of the programming and erasing using a negative voltage is described by referring to FIGS. 20 to 22.

The memory cell representatively shown in Figure 20 consists of an insulated gate field-effect transistor of two-layer gate structure as with the memory cell of FIG. 9. For easy understanding, FIG. 20 shows two memory cells (corresponding to MC1 and MC3 in FIG. 21) arranged adjacent in the column direction with their source lines commonly connected.

In the figure, the components identical with those of FIG. 9 are given the same reference numbers. That is, denoted 1 is a P-type silicon substrate; 14 a P-type semiconductor region formed in the silicon substrate 1; 15 a low-concentration N-type semiconductor region; 13a an N-type semiconductor region as a drain area formed in the P-type semiconductor region 14; and 13b an N-type semiconductor region as a source area formed in the N-type semiconductor region 15. Reference numeral 8 represents a floating gate formed over the P-type silicon substrate 1 with a thin oxide film 7 (about 10 nm thick) as a tunnel insulation film interposed. Denoted 11 is a control gate formed over the floating gate 8 with an oxide film 9 interposed.

[0053]

Programming the memory cell MC1 is carried out, as shown in FIG. 21, by applying a high voltage of, say, 12 V to the control gate 11 and Vcc (5 V) to the drain, and connecting the source to the ground potential to pass a current from the drain to the source thus injecting electrons (hot electrons) into the floating gate 8 by the avalanche injection. With this programming operation performed, the storage transistor has its threshold voltage as seen from the control gate 11 held higher than that of a storage transistor in the erased state for which the programming operation was not performed.

The drain of the non-selected memory cell MC2, whose word line is shared with the first memory cell MC1, is given a ground potential through the data line DL2 to block the programming. As to a non-selected memory cell MC3, whose data line is common with the first memory cell MC1, a ground potential is applied to the control gate 11 via the word line WL2 to block programming. These operations are similar to the programming operations of the preceding embodiment that performs programming and erasing by using only positive voltages.

[0054]

For the erasing operation, as shown in FIG. 22, when the memory cell MC1 is to be erased, a negative voltage of, say, $-10$ V is applied to the control gate 11, a positive voltage of Vcc (5 V) is applied to the source, and the drain is connected with a ground potentials in order to draw electrons out of the floating gate 8 to the source side by the tunnel effect. In this case, as can be seen also from FIG. 21, because the memory cell MC2 arranged adjacent to the first memory cell MC1 in the direction of word line has its source connected in common with that of the memory cell MC1, it has the same potentials as the memory cell MC1.

[0055]

In this embodiment, therefore, the memory cells in one row with their word lines and sources connected in common are erased at one time. That is, while in the preceding embodiment that performs programming and erasing by using only positive voltages, the memory cells with their sources connected in common are erased at one time, this embodiment can erase memory cells simultaneously by word lines. By selecting a plurality of word lines during the erase operation, it is possible to erase memory cells in blocks. Where the power supply circuit EPS can select and supply either of the external program/erase voltage Vpp and the boost voltage of Vcc to the flash memory, the erase operation may be done by word lines when the stepped-up voltage is used and by blocks when the external voltage vpp is used.

In the case of erase operation by word lines, the memory cells MC3, MC4, MC5, MC6, . . . on the non-selected word lines are applied with a ground potential at their control gates 11 through the word lines WL2, WL3, WL4, . . . in order to be blocked from being programmed. This erase operation reduces the threshold voltages of the selected storage transistors as seen from their control gates 11.

[0056]

Next, by referring to FIG. 23 and 24, explanation will be given to the programming and erasing operations on the flash memory wherein a tunnel current is also utilized in the programming as in the erasing operation. The power supply circuit configuration and the structure of the storage transistors making up the memory cells are the same as those of the preceding embodiment. In this embodiment, the programming and erasing means not the electron injection into and withdrawing out of the floating gate as does the preceding embodiment. The act of injecting and withdrawing electrons into and out of the floating gate of a 1-bit memory cell is called a programming operation; and the act of injecting and withdrawing electrons into and out of the floating gates of a plurality of memory cells is called an erasing operation. Thus, when we look at the phenomenon of electron injection into and withdrawing out of the floating gate of memory cell, it is noted that the programming and erasing in this embodiment are reversed to those of the preceding embodiment.

[0057]

Figure 23:
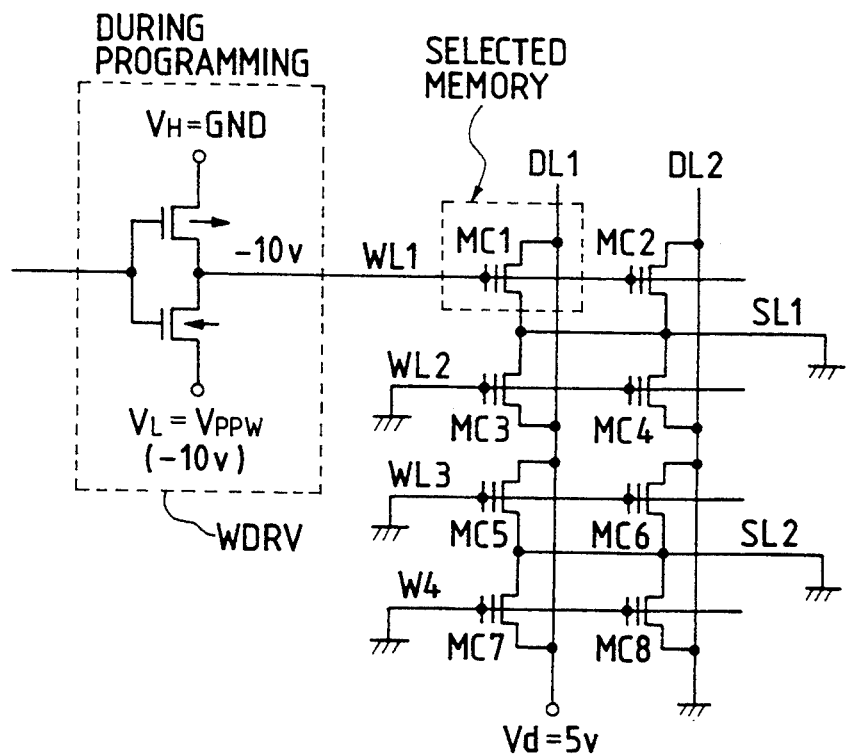
FIG. 23 is a circuitry showing the state of the negative-voltage programming flash memory at time of memory array erasing utilizing a tunnel phenomenon.

As to the programming operation on the memory cell, as shown in FIG. 23, the memory cell MC1 is programmed by applying a negative voltage of $-10$ V to its control gate 11 and Vcc (5 V) to its drain, and connecting the common source to the ground potential to draw electrons from the floating gate 8 to the drain by the tunnel effect. This programming operation reduces the threshold voltage of the storage transistor as seen from the control gate 11 to a level lower than those of storage transistors in the erase state for which the programming operation was not performed.

The non-selected memory cell MC2 with a common word line is applied with the ground potential at its drain through the data line DL2 to prevent the programming. The non-selected memory cell MC3 with a common data line with the first memory cell MC1 is applied with a ground potential at its control gate 11 to prevent the programming. These operations are the same as the programming operation in the preceding embodiment that uses only positive voltage in performing the programming and erasing operations.

[0058]

Figure 24:
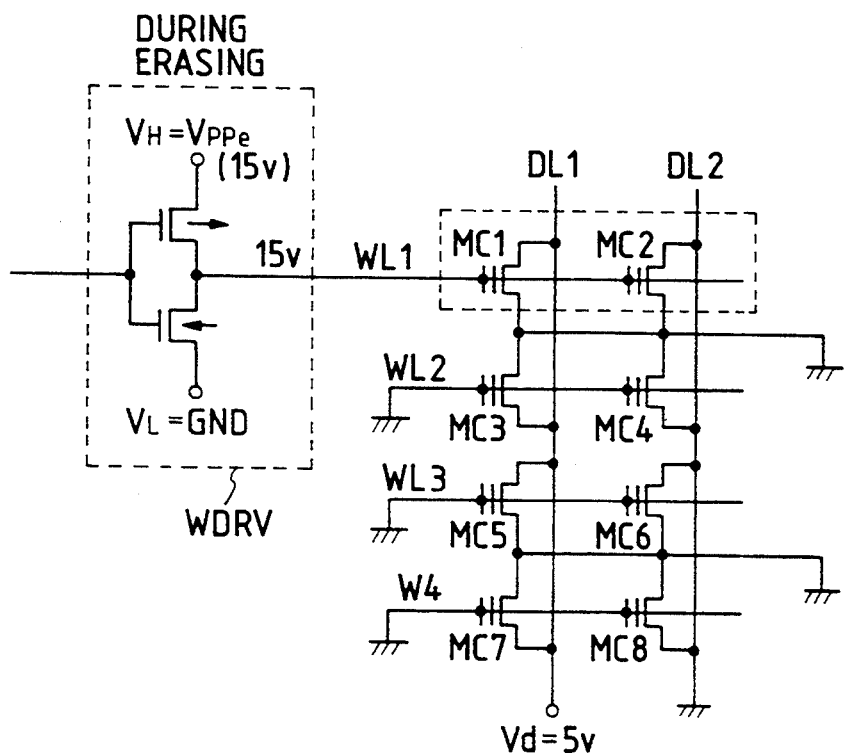
FIG. 24 is a circuitry showing the memory array configuration of the negative-voltage programming flash memory, which performs programming and erasing utilizing a tunnel phenomenon, and the state of the flash memory at time of programming.

As to the erase operation, as shown in FIG. 24, when, for example, a memory cell MC1 is to be erased, a positive voltage of, say, 15 V is applied to its control gate 11, and the source and drain are connected to the ground potential to inject electrons from the substrate side into the floating gate 8 by the tunnel effect. In this case, if the source of the memory cell MC2 arranged adjacent to the first memory cell MC1 in the word line direction is connected commonly with the memory cell MC1, the second memory cell MC2 also has the same potentials as the memory cell MC1.

Therefore, in this embodiment it is possible to erase memory cells a word line at a time. In the erase operation by word lines, the memory cells MC3, MC4, MC5, MC6, . . . on non-selected word lines are prevented from being programmed, by applying the ground potential to their control gates 11 through the word lines WL2, WL3, WL4, . . . Selection of multiple word lines allows erasure of memory cells in blocks. This erase operation raises the threshold voltages of the storage transistors as seen from the control gate 11 to a level (about 5 V) higher than that of the storage transistor in the programmed state.

[0059]

If the tunnel phenomenon is used in both the programming and erasing operations, the programming of 1 bit needs only several nA to several tens of nA of current, substantially alleviating the burden of the step-up circuit and reducing its occupying area when compared with the flash memory of the preceding embodiment in which the electron injection by the avalanche phenomenon requires several hundred $\mu A$ of current in programming one bit.

In this embodiment, too, the power supply circuit EPS may be so constructed as to be able to select and supply either of the external program/erase voltage Vpp and the boost voltage of Vcc to the flash memory in order to perform the erase operation by word lines when the boost voltage is used and by blocks when the external voltage Vpp is used.

[0060]

Figure 25:
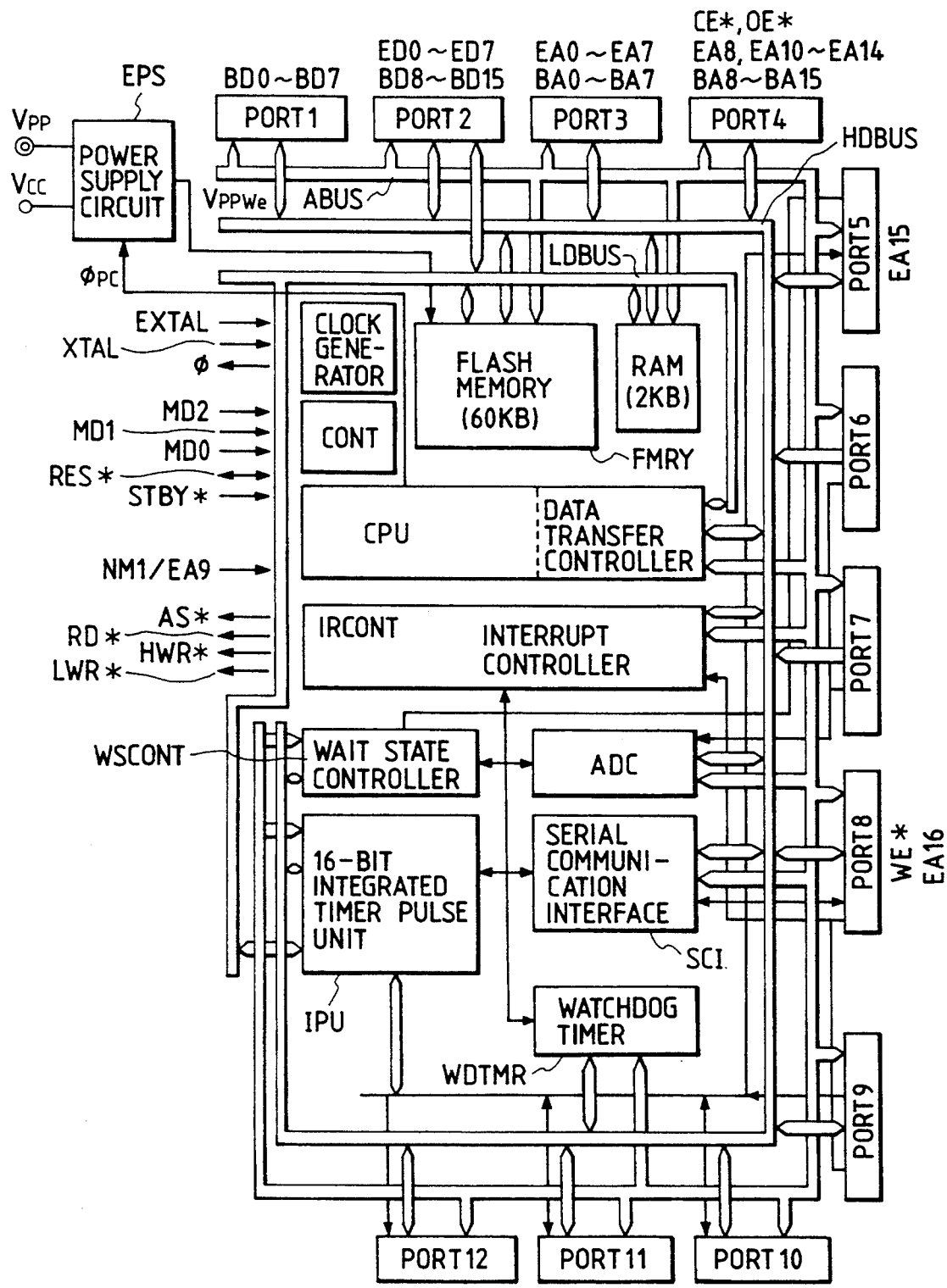
FIG. 25 is an overall block diagram showing an example configuration of the microcomputer of FIG. 1.

FIG. 25 shows a detailed block diagram of a microcomputer corresponding to the microcomputer of FIG. 1. The microcomputer MCU shown in the figure includes, as the same function block of FIG. 1, a central processing unit CPU, a flash memory FMRY, a serial communication interface SCI, a control circuit CONT, a random access memory RAM and a power supply circuit EPS. What corresponds to the timer of FIG. 1 is a 16-bit integrated timer pulse unit IPU and a watchdog timer WDTMR.

What corresponds to the input/output circuit I/O of FIG. 1 is ports PORT1–PORT12. Other function blocks in this embodiment include a clock oscillator CPG, an itnerrupt controller IRCONT, an analog-digital converter ADC, and a wait state controller WSCONT.

[0061]

The central processing unit CPU, flash memory FMRY, random access memory RAM, and 16-bit integrated timer pulse unit IPU are connected to an address bus ABUS, a lower data bus LDBUS (for instance, 8-bit bus) and an upper data bus HDBUS (for instance, 8-bit bus). The serial communication interface SCI, watchdog timer WDTMR, interrupt controller IRCONT, analog digital converter ADC, wait state controller WSCONT, and ports PORT1–PORT12 are connected to the address bus ABUS and upper data bus HDBUS.

[0062]

In FIG. 25, Vppw/e represents a high voltage for programming the flash memory FMRY. The power supply circuit EPS selects either the external program/erase votlage Vpp or the stepped-up voltage from the boost circuit and supplies it as the Vppw/e to the flash memory FMRY.

Denoted EXTAL and XTAL are signals Given to the clock oscillator CPG from a vibrator not shown which is mounted on the microcomputer chip. $\phi$ is a synchronous clock signal output from the Clock oscillator CPG.

Designated MD0-MD2 are mode signals supplied to the control circuit CCT to set the operation mode in overwriting the flash memory FMRY. Symbol RES* represents a reset signal and STBY* represents a standby signal, both supplied to the central processing unit CPU and other circuit blocks.

Designated NMI is a non-maskable interrupt signal given to the interrupt controller ICONT. Other interrupt signals not shown are given to the interrupt controller ICONT through ports PORT8, PORT9.

[0063]

Denoted AS* is an address strobe signal that indicates the validity of an address signal output to the external Circuit. Designated RD* is a read signal that informs the outside circuit that a read cycle is being executed. Denoted HWR* is an upper byte write signal that notifies the external circuit that the upper 8-bit write cycle is being executed. LWR* is a lower byte write signal that notifies the external circuit that the lower 8-bit write cycle is being performed. These signals are external circuit access control signals for the microcomputer MCU.

In other than the second operation mode in which the flash memory FMRY is directly re-programmed by the external PROM writer, the ports PORT1, PORT2 are allocated for the input/output of the data BD0-BD15 used by the microcomputer MCU in accessing the external circuit. For the output of the address signals BA0-BA19, the ports PORT3-PORT5 are assigned.

[0064]

When the microcomputer MCU is set to the second operation mode, the ports PORT2-PORT5 and PORT8 are allocated for the connection of the PROM writer that controls the programming of the flash memory FMRY. That is, for the input/output of the data ED0-- ED7 for programming and verifying, the port PORT2 is allocated; and for the input of the address signals EA0-EA16 and for the input of the access control signal CE* (chip enable signal), OE* (output enable signal) and WE* (write enable signal), the ports PORT-3-PORT5 and PORT8 are allocated.

The chip enable signal CE* is an operation selection signal for the flash memory FMRY from the PROM writer; the output enable signal OE* is an output operation specifying signal for the flash memory FMRY; and the write enable signal WE* is a program operation specifying singal for the flash memory FMRY.

[0065]

Of the address signals EA0-EA16, one bit EA9 is assigned an input terminal of the signal NMI for input. The external terminals of these ports thus assigned and other external terminals such as high voltage Vpp application terminals are connected, through a conversion socket, to the general-use PROM writer. Allocation of the external terminals can be determined in such a manner that the microcomputer MCU can easily be connected through the conversion socket to the PROM writer.

The external terminals assigned for the connection of the PROM writer PRW in the second operation mode are given other functions in other operation modes of the microcomputer MCU.

The supply terminal for the external program/erase voltage Vpp may share other terminals such as input terminal of the reset signal RES*. This obviates the need to provide a dedicated terminal reducing the number of terminals.

[0066]

Figure 26:
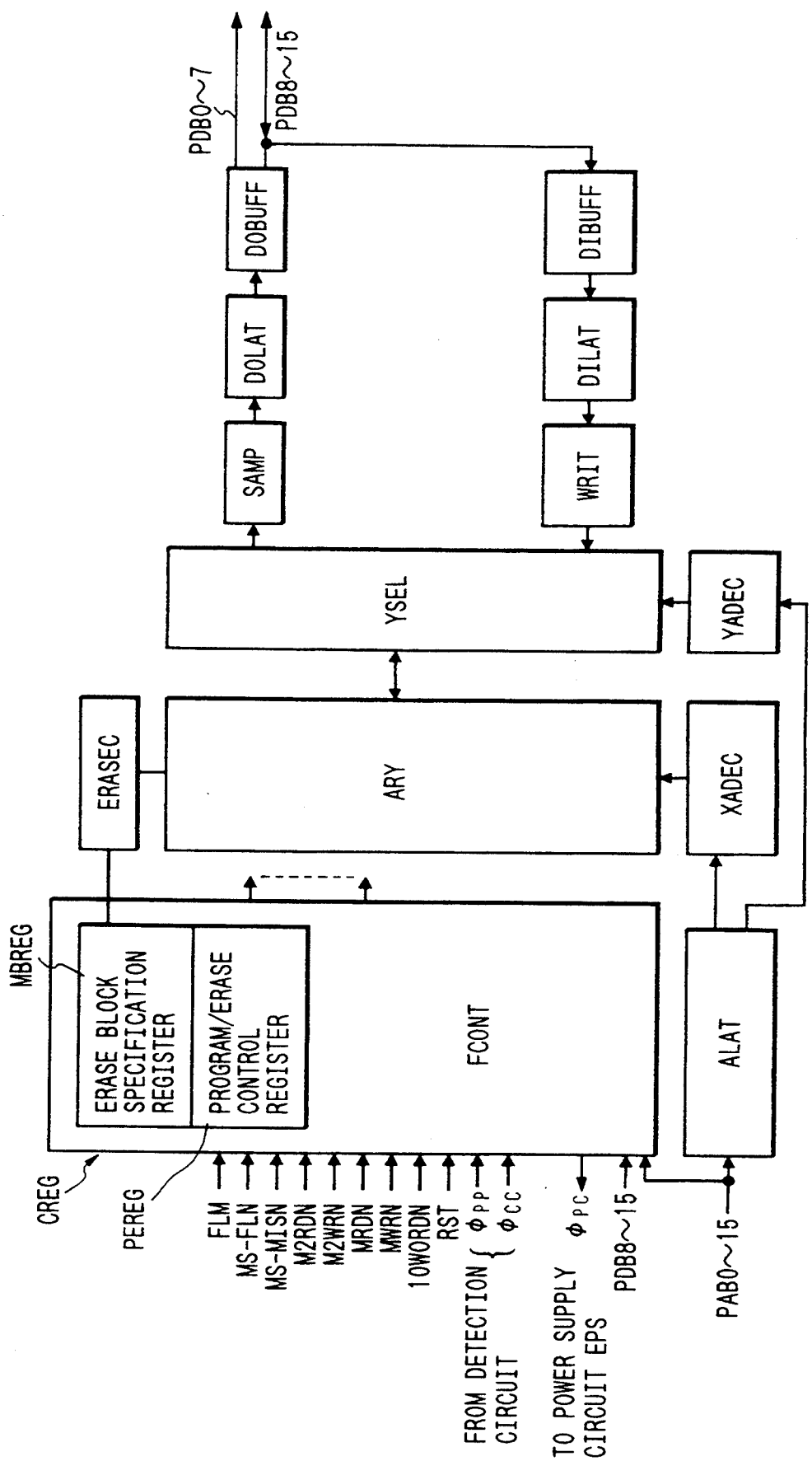
FIG. 26 is an overall block diagram of the flash memory incorporated in the microcomputer of FIG. 25.

FIG. 26 shows an overall block diagram of the flash memory FMRY incorporated in the microcomputer MCU of FIG. 25.

In the figure, designated ARY is a memory array in which memory cells formed of insulated gate fieldeffect transistors of two-layer gate structure explained in FIG. 9 are arranged in matrix. This memory array ARY, like the configuration shown in FIG. 13, has the control gates of the memory cells connected to the corresponding word lines, the drain regions connected to the corresponding data lines and the source regions in each memory block connected to the common source line.

[0067]

In FIG. 26, designated ALAT is a latch circuit for the address signals PAB0-PAB15. In the first operation mode where the central processing unit CPU re-programs the flash memory FMRY, the address signals PAB0-PAB15 correspond to the output address signals of the central processing unit CPU. In the second operation mode where the PROM writer re-programs the flash memory FMRY, the address signals PAB0-PAB15 correspond to the output address signals EA0-EA15 of the PROM writer.

Designated XADEC is a row address decoder that decodes the row address signals taken in through the address latch ALAT. Denoted WDRV is a word driver that drives a word line according to the selection signal output from the row address decoder XADEC. In the data read operation, the word driver WDRV drives a word line with a voltage of, say, 5 V and, in the data programming operation, drives the word line with a high voltage of, say 12 V. In the data erase operation, all the outputs of the word driver WDRV are set to a low voltage level of, say, 0 V.

[0068]

A column address decoder YADEC decodes column address signals taken in through the address latch YALAT. A column selection circuit YSEL selects a data line according to the output selection signal from the column address decoder YADEC. Denoted SAMP is a sense amplifier that amplifies the read signal from the data line selected by the column selection circuit YSEL. Denoted DOLAT is a data output latch that holds the output of the sense amplifier. A data output buffer DOBUFF outputs to external circuit the data held in the data output latch DOLAT.

In FIG. 26, reference numerals PDB0-PDB7 represent lower 8 bits (1 byte) of data while PDB8-PDB15 represent upper 8 bits (1 byte) of data. The output data in this case is two bytes at maximum. Denoted DIBUFF is a data input buffer that takes in the program data supplied from outside.

[0069]

The data taken in from the data input buffer DIBUFF is held in the data input latch circuit DILAT. When the data held in the data input latch circuit DILAT is "0," the programming circuit WRIT supplies the programming high voltage to a data line selected by the column selection circuit YSEL.

The programming high voltage is fed, according to the row address signal, to the drain of a memory cell whose control gate is applied with a high voltage, thus programming the selected memory cell. Designated ERASEC is an erase circuit that supplies the erasing high voltage to the source line of the specified memory block to erase the entire memory block in one operation.

A control circuit FCONT performs a timing control of data read operation on the flash memory FMRY and selection/control of various timings and voltage for programming and erasing. This control circuit FCONT has a control register CREG.

[0070]

FIG. 27 shows one example of the control register CREG.

The control register CREG consists of an 8-bit program/erase control register PEREG, and 8-bit erase block specification registers MBREG1 and MBREG2.

In the program/erase control register PEREG, what is shown by reference symbol Vpp is a high voltage application flag, which is set to "1" when it is detected that the program/erase high voltage Vpp supplied to the power supply pad Pvp for programming and erasing the flash memory FMRY becomes higher than a specified level. A Vcc bit is an operation voltage application flag, which is set to "1" when it is detected that the power supply voltage $V_{cc}$ supplied to the power supply pad Pvc for normal operation becomes higher than a specified level. The specified level means the minimum voltage at which the Vcc can be stepped up to generate the program/erase voltage Vppw/e.

The Vpp/Vcc bit is used to specify which voltage—the high voltage Vpp supplied from outside for programming and erasing the flash memory FMRY or the Vcc-boost voltage—should be used as the program/erase voltage Vppw/e. According to the contents of the Vpp/Vcc bit, the control signal $\phi pc$ shown in FIG. 8 is formed.

[0071]

Further, in FIG. 7, the E bit is to specify the erase operation, and the EV bit is to specify the erase verify operation. The P bit specifies the program operation, the PV bit specifies the verify operation in the programming, and the PB bit specifies the size of the flash memory FMRY to be programmed or erased. This PB bit uses the external voltage Vpp as the program/erase voltage Vppw/e and is set to "1" to perform the programming one page at a time and the erasing two or more blocks at a time. When the PB bit is set to "0," the programming is done one byte at a time and the erasing one block at a time. The PB bit can be set to "0" even when the Vpp bit is set to "1."This permits the programming to be done one byte at a time and the erasing to be performed one block at a time even when the voltage used for the programming and erasing is the externally supplied Vpp.

[0072]

The erase block specification registers MBREG1 and MBREG2 specify which memory blocks in seven divided large blocks and in eight divided small blocks are to be erased. Their 0th bit to 7th bit are memory block specification bits. A bit "1" represents that the corresponding memory block is selected and a bit "0" indicates that the corresponding memory block is non-selected. For instance, when the seventh bit of the erase block specification register MBREG2 is "1," it means that the small memory block SMB7 is specified to be erased.

The control register CREG can be read and written from outside. The control circuit FCONT references the contents of setting in the control register CREG and performs the erase/program control according to the setting. It is possible to control the erase/program operation state by changing the contents of the control register CREG.

[0073]

Returning to FIG. 26, the control circuit FCONT is supplied with control signals FLM, MS-FLN, MS-MISN, M2RDN, M2WRN, MRDN, MWRN, IOWORDN and RST, and is also given higher 1-byte data PDB8–PDB15 and a specified bit of the address signals PAB0–PAB15.

The control signal FLM is a signal to specify the operation mode of the flash memory FMRY. When it is "0," the control signal FLM specifies the first operation mode and, when it is "1," it specifies the second operation mode. This signal FLM is formed based on the mode signals MD0–MD2.

[0074]

The control signals MS-FLN is a selection signal for the flash memory FMRY. "0" represents selection and "1" represents non-selection. In the first operation mode, the central processing unit CPU outputs the control signal MS-FLN, which in the second operation mode corresponds to the chip enable signal CE* supplied from the PROM writer PRW.

The control signal MS-MISN is a selection signal for the control register CREG. Which of the program/erase control register PEREG and the erase block specification register MBREG1 and MBREG2 is to be selected is determined by referencing a specified bit of the address signals PAB0–PAB15. In the first operation mode, the central processing unit CPU outputs its control signal MS-MISN. In the second operation mode, the most significant address bit EA16 output from the PROM writer PRW is taken to be the control signal MS-MISN.

[0075]

Denoted M2RDN is a memory read strobe signal, M2WRN a memory write strobe signal, MRDN a read signal for the control register CREG, and MWRN a write signal for the control register CREG. In the first operation mode, the central processing unit CPU produces these control signals. In the second operation mode, the write enable signal WE* supplied from the PROM writer PRW is taken as the control signals M2WRN, MWRN, and the output enable signal OE* from the PROM writer PRW is regarded as the signals M2RDN, MRDN. The memory write strobe signal MZWRN is taken to be a strobe signal for writing into the data input latch circuit DILAT data to be written into memory cell. Actual writing into memory cell is initiated by setting the p bit in the control register CREG.

[0076]

Designated IOWORDN is a signal to switch between the 8-bit read access and the 16-bit read access for the flash memory FMRY. In the second operation mode, the control signal IOWORDN is fixed to a logic value that specifies the 8-bit read access.

Denoted RST is a reset signal for the flash memory FMRY. When the flash memory FMRY is reset by this signal RST or the vpp flag in the program/erase control register PEREG is set to "0," the mode setting bits EV, PV, E, P in the program/erase control register PEREG are cleared.

[0077]

Figure 28:
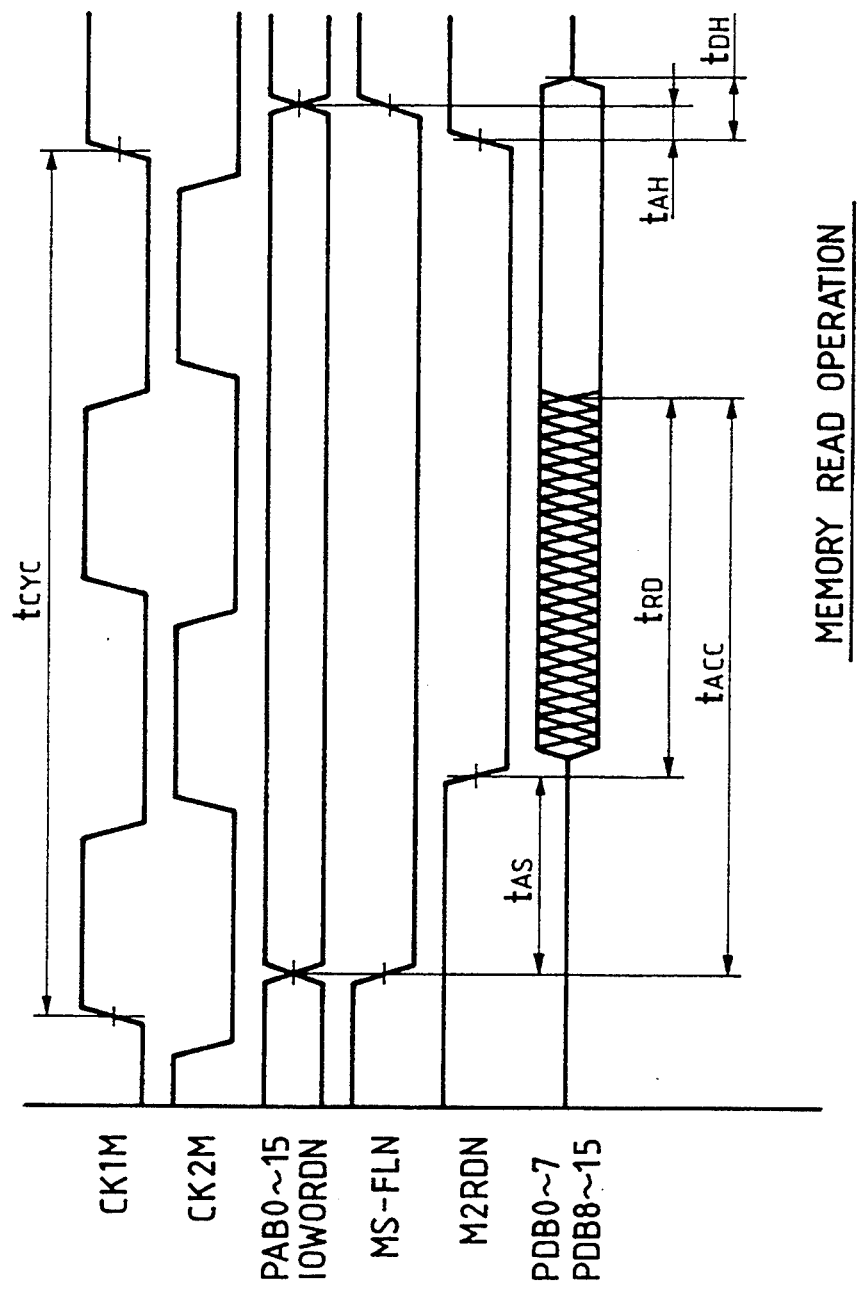
FIG. 28 is a timing chart showing an example memory read operation in the flash memory.

FIG. 28 shows an example timing chart of the memory read operation on the flash memory FMRY.

In the figure, signals CK1M, CK2M are non-overlapped two-phase clock signals and deemed to be operation reference clock signals. Denoted tCYC is a cycle time, which is little different from the RAM access time. The read operation on the control register CREG is also performed in the similar timing.

[0078]

Figure 29:
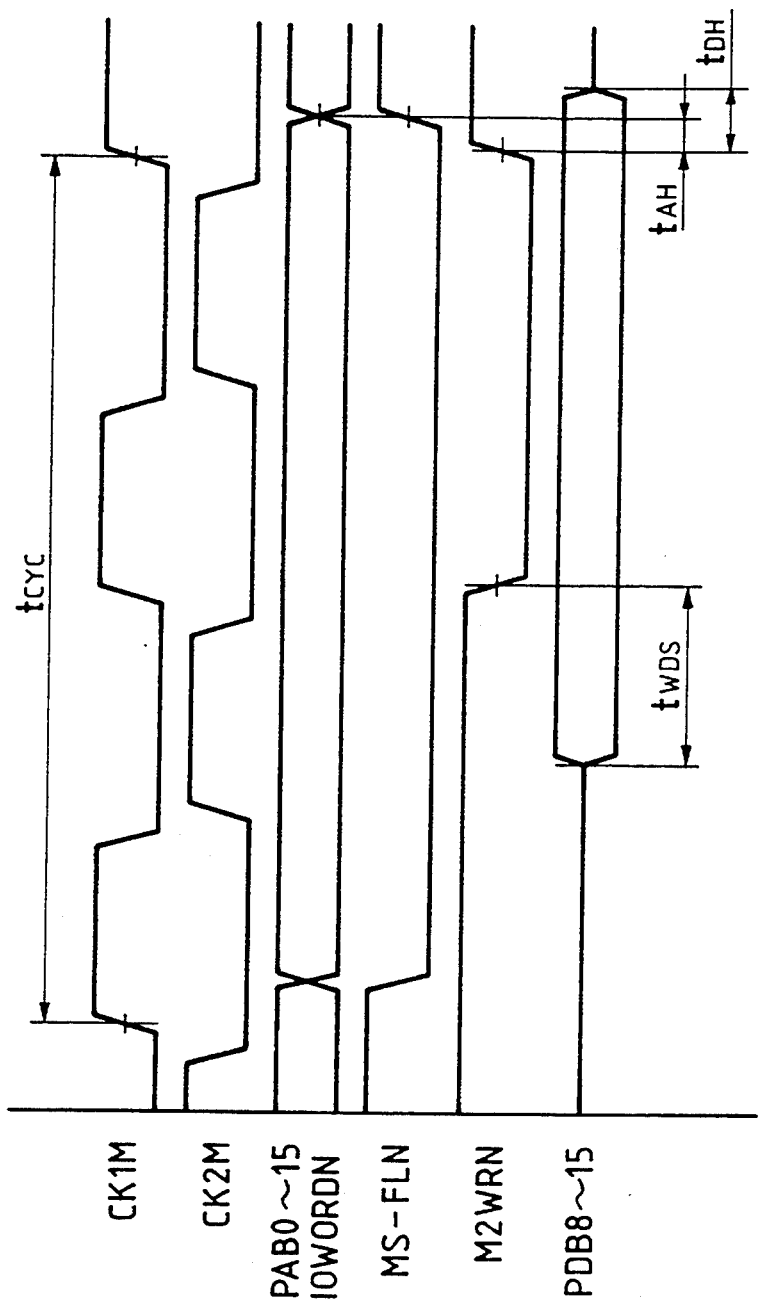
FIG. 29 is a timing chart showing an example memory write operation in the flash memory.

FIG. 29 shows an example timing chart of the memory write operation on the flash memory FMRY. In the memory write operation specified by the write strobe signal M2WRN shown in the figure, the actual writing into memory cells as mentioned above is not performed but the input address signals PAB0–PAB15 are held in the address latch circuit ALAT and the input data PB8–PB15 is held in the data input latch DILAT, completing the write cycle. The write operation on the control register CREG is also performed on the similar timing but in this case the actual data writing into the control register CREG is carried out.

[0079]

Figure 30:
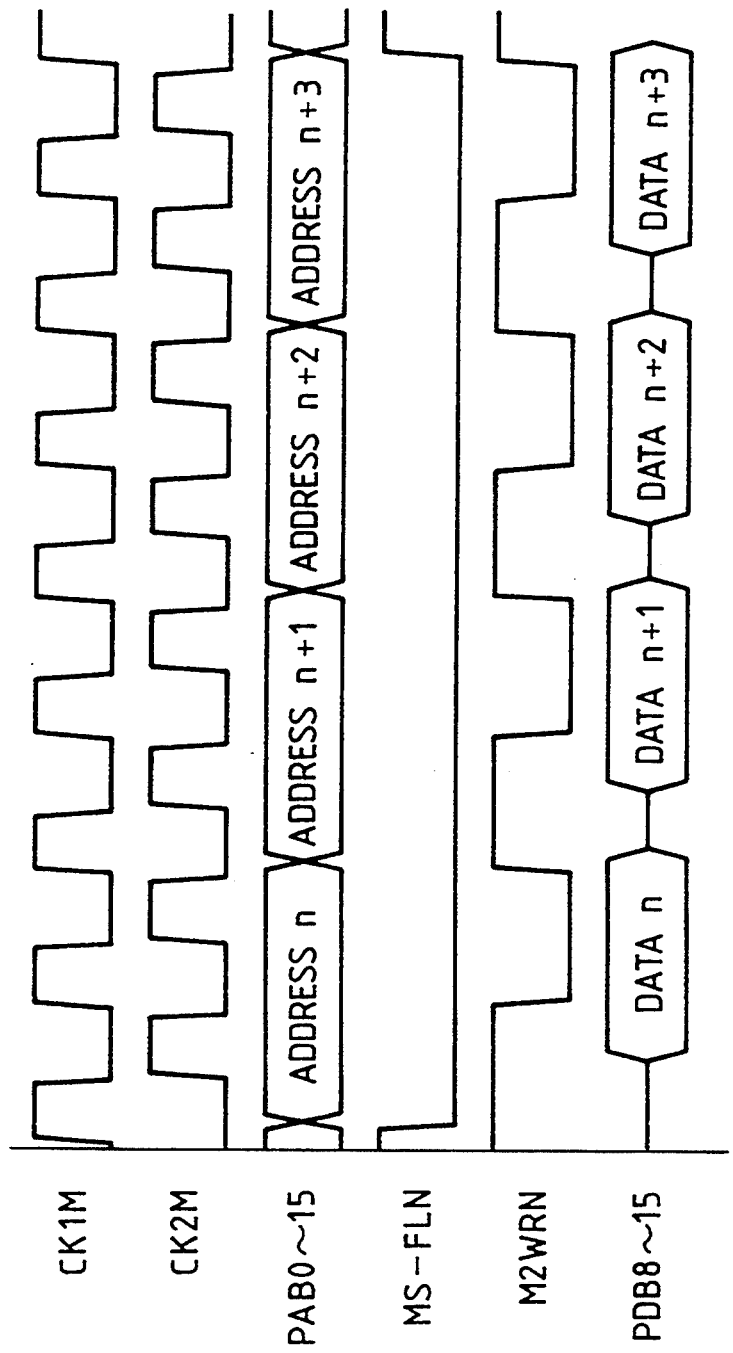
FIG. 30 is a timing chart showing an example memory program operation in the flash memory in a page program mode.

FIG. 30 shows an example operation timing for the Vpp mode in which the programming is done one page at a time using the external voltage Vpp.

Figure 31:
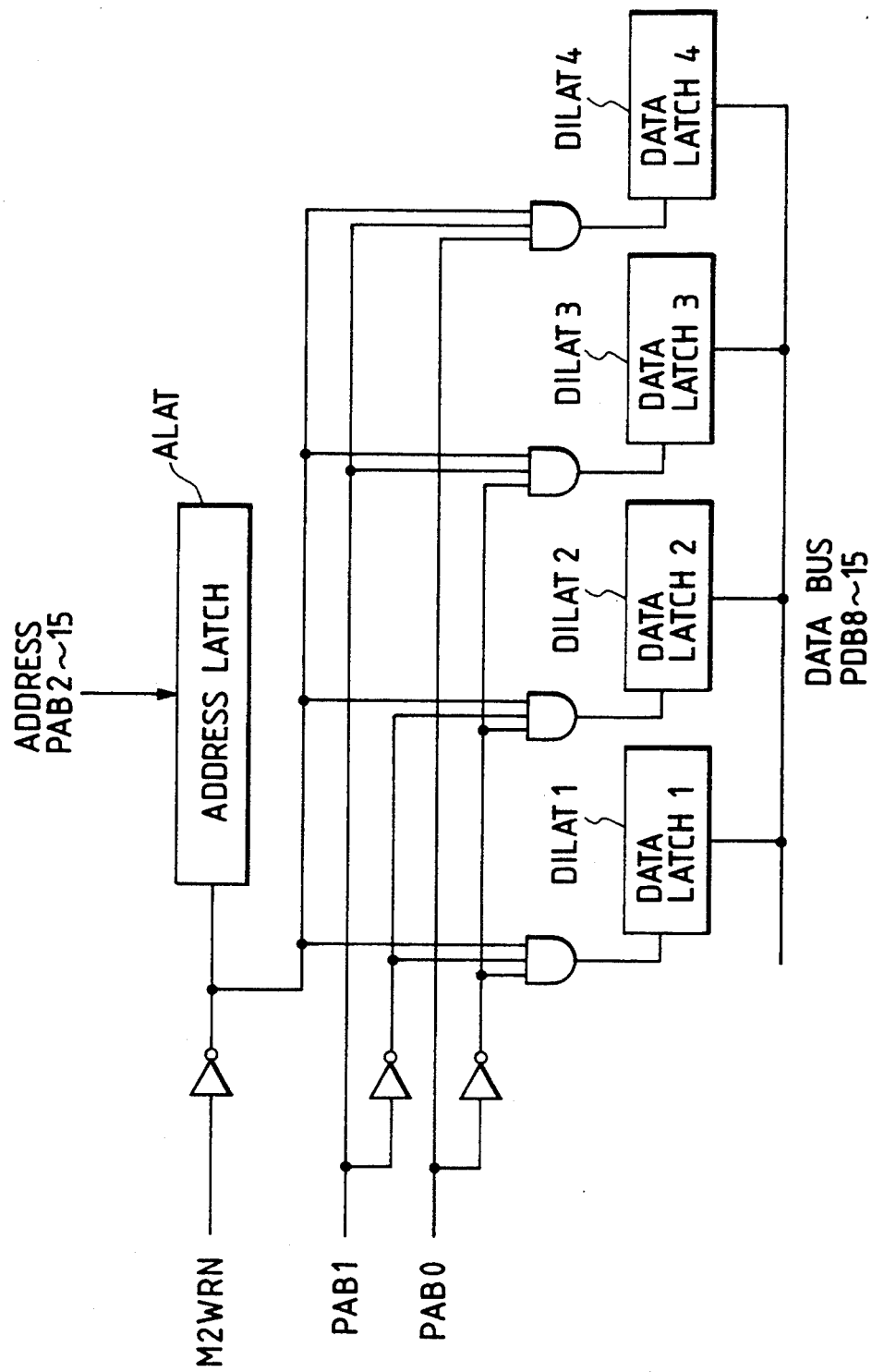
FIG. 31 is a block diagram showing a detailed example of a data latch circuit configuration.

The input address signals PAB0–PAB15 are latched by the address latch circuit ALAT in response to the write strobe signal MZWRN. The lower two bits of the address are ignored. The data input latch circuit DILAT, as shown in FIG. 31, has latch circuits DILAT1–DILAT4, each four bytes long. Data is latched by the latch circuit selected by the lower two bits of the address. When four-byte-long data is taken into the latch circuit DILAT1–DILAT4, the P bit in the control register CREG is set to "1" executing the writing of data into memory cell.

[0080]

[Details of Control Procedure for Re-Programming Flash Memory FMRY]

Next, an example of control procedure whereby the central processing unit CPU or PROM writer performs the programming and erasing of the flash memory through the control circuit FCONT will be described in detail. Information programming into the flash memory is basically performed on the memory cells in the erased state.

In the first mode where the re-programming of the flash memory is performed with the microcomputer mounted on the system, the re-programming control program to be executed by the central processing unit CPU includes an erasing program and a programming (or writing) program. The re-programming control program can be made to execute, according to the specification of the first operation mode, the erase processing routine first and then automatically perform the programming processing routine. Alternatively it is possible to specify the first operation mode for the erasing routine and the programming routine, separately. The reprogramming control by the PROM writer is executed in the same operation procedure as in the first operation mode.

Now, the programming control procedure and the erasing control procedure will be explained in detail.

[0081]

Figure 32:
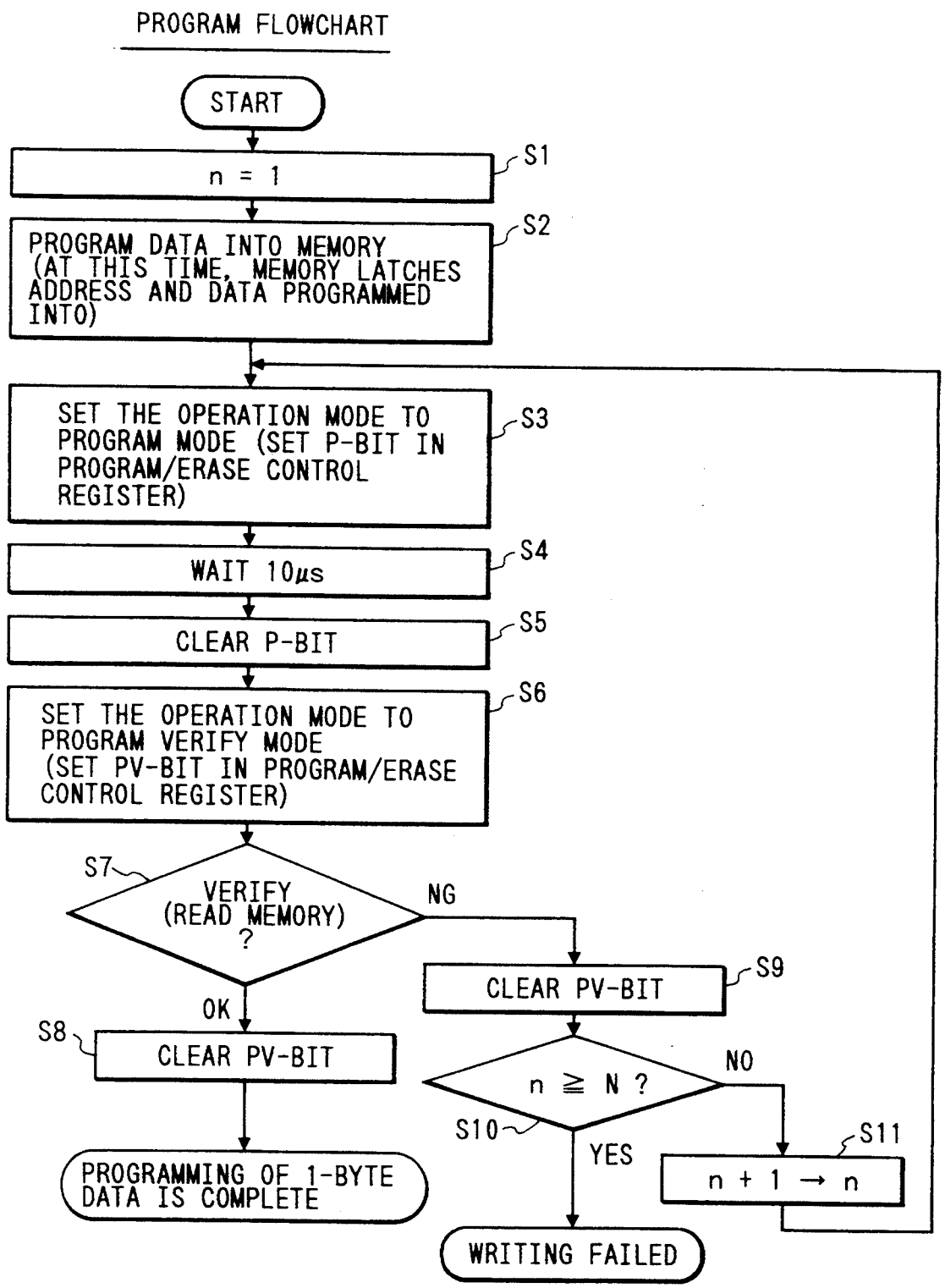
FIG. 32 is a flowchart showing a detailed example of a programming control procedure.

FIG. 32 shows one detailed example of the programming control procedure. The procedure shown in the figure is the one to program 1-byte data in the Vcc boost mode according to the timing of FIG. 29 and is common to the control by the central processing unit CPU in the first operation and to the control by the PROM writer in the second operation mode. In the following description, let us take the central processing unit CPU as the main control apparatus.

In the first step of the data programming by bytes, the central processing unit CPU sets "1" in its built-in counter n (step S1). Next, the central processing unit CPU, according to the memory program operation shown in FIG. 29, sets the data to be written in the data input latch circuit DILAT of FIG. 26 and also sets the address in which to program data in the address latch circuit ALAT (step S2).

[0082]

Then, the central processing unit CPU issues a write cycle to the control register CREG and sets the program bit P (step S3). The control circuit FCONT, according to the data and address set at step 2, applies a high voltage to the control gate and drain of the memory cell specified by the address, thus writing data. The central processing unit CPU waits for about 10 psec for the write processing to be completed in the flash memory (step S4) and then clears the program bit P (step S5).

[0083]

Then, to verify the programmed state the central processing unit CPU issues a write cycle to the control register CREG and sets a program verify bit PV (step S6). In response to this, the control circuit FCONT applies a verify voltage to a word line selected by the address, which was set at step S2, thus reading data from the memory cell into which data was programmed. The verify voltage is set at about 7 V, higher than the power supply voltage $V_{cc}$ of 5 V, in order to secure a sufficient margin for the programming level. The central processing unit CPU checks the agreement between the data read out and the data used for programming (step S7). The central processing unit CPU, upon confirming the agreement by the verify operation, clears the program verify bit PV (step S8), thus completing the programming of 1-byte data.

[0084]

When, on the other hand, the central processing unit CPU recognizes disagreement by the verify operation of step S7, it clears the program verify bit PV at step S9 and then checks whether the value of the counter n has reached the upper limit number of program retries N (step S10). If the upper limit number of program retries N is found to be reached, the central processing unit CPU decides that the programming has failed and ends the processing. When the upper limit number of program reties N is not reached, the central processing unit CPU increments the value of the counter n by 1 (step S11) and repeats the processing from the step S3.

[0085]

Figure 33:
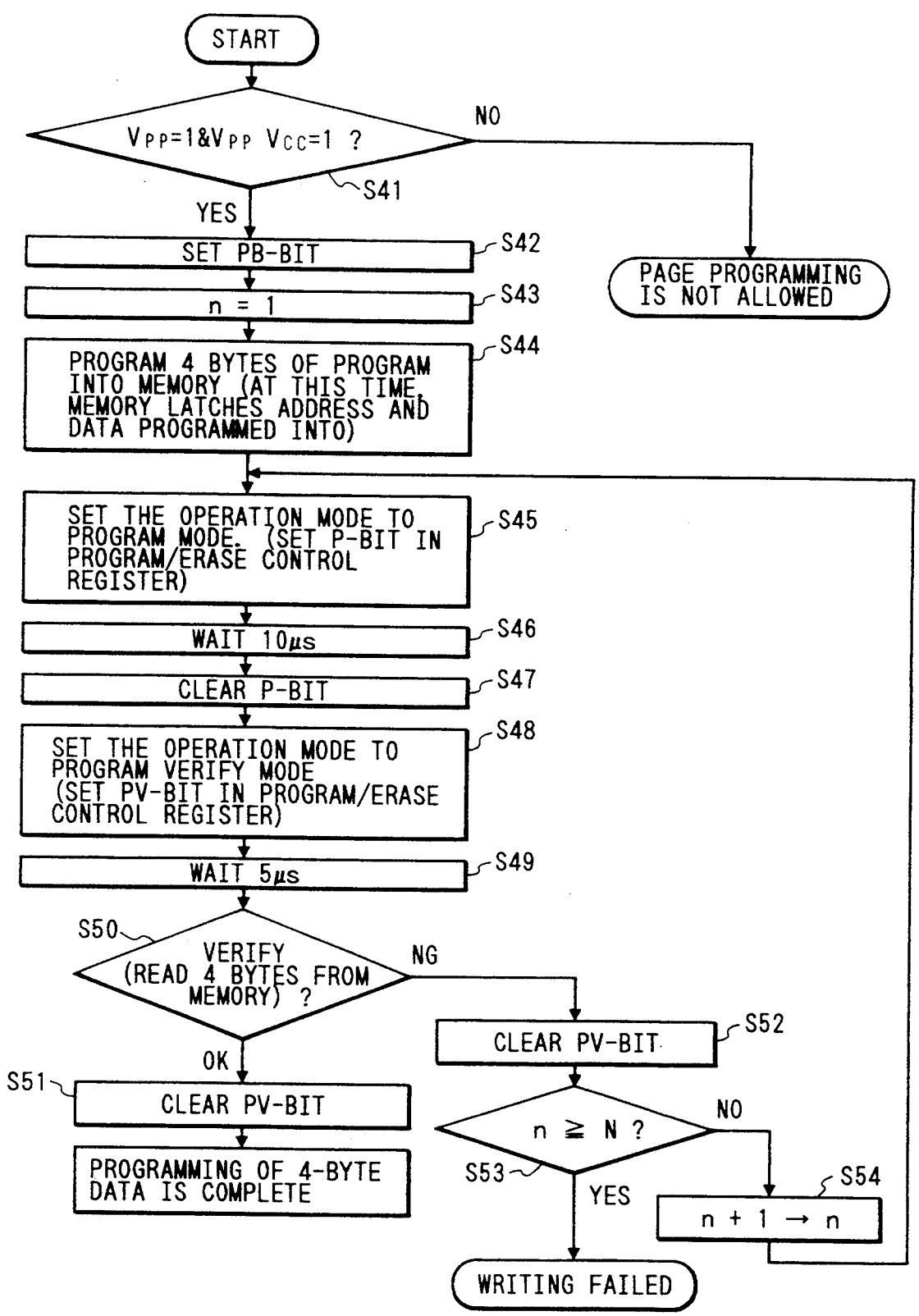
FIG. 33 is a flowchart showing a detailed example of a programming control procedure in a page program mode.

FIG. 33 shows a detailed example of the programming control procedure performed on a page-by-page basis. The procedure shown in the figure is common to both the control by the central processing unit CPU in the first operation mode and the control by the PROM writer in the second operation mode. In the following the central processing unit CPU is taken as the main controller.

At the first step in the data programming by pages, the central processing unit CPU checks the Vpp bit and Vpp/Vcc bit in the control register CREG to see if both are "1" (step S41). If both of the Vpp bit and the Vpp/Vcc bit are "1," the central processing unit CPU sets "1" in the PB bit and "1" in the built-in counter n (step S42, S43).

[0086]

Next, the central processing unit CPU supplies data to be written (four bytes) and its address to the flash memory FMRY (step 44). At this time, on the memory side, the data and address supplied are latched. Then, the central processing unit CPU issues a write cycle to the control register CREG and sets the P bit of the control register CREG to "1" to set the operation mode to the program mode (step S45). After the elapse of 10 sec, it clears the P bit to "0"(step S46, S47). Then the central processing unit CPU sets the PV bit to "1" changing the operation mode to the program verify mode, and then waits 5 sec (step S48, S49).

[0087]

Then, to check the programmed state, the central processing unit CPU reads four-byte data written into the flash memory FMRY and compares it with the program data to see if they agree (step S50). If these data agree, the central processing unit CPU clears the PV bit to "0" terminating the programming processing (step S51). When on the other hand the data do not agree, the central processing unit CPU clears the PV bit to "0" at step S52 and checks the built-in counter n to decide whether the specified upper limit number of program retries N (for example, 20 times) is exceeded (step S53). If the n does not reach the N, the central processing unit CPU increments n by "1" before returning to step S45 to repeat the above procedure (step S54). Then, when the built-in counter n reaches the upper limit number N, the central processing unit CPU decides that the programming processing has failed and ends the processing.

[0088]

Figure 34:
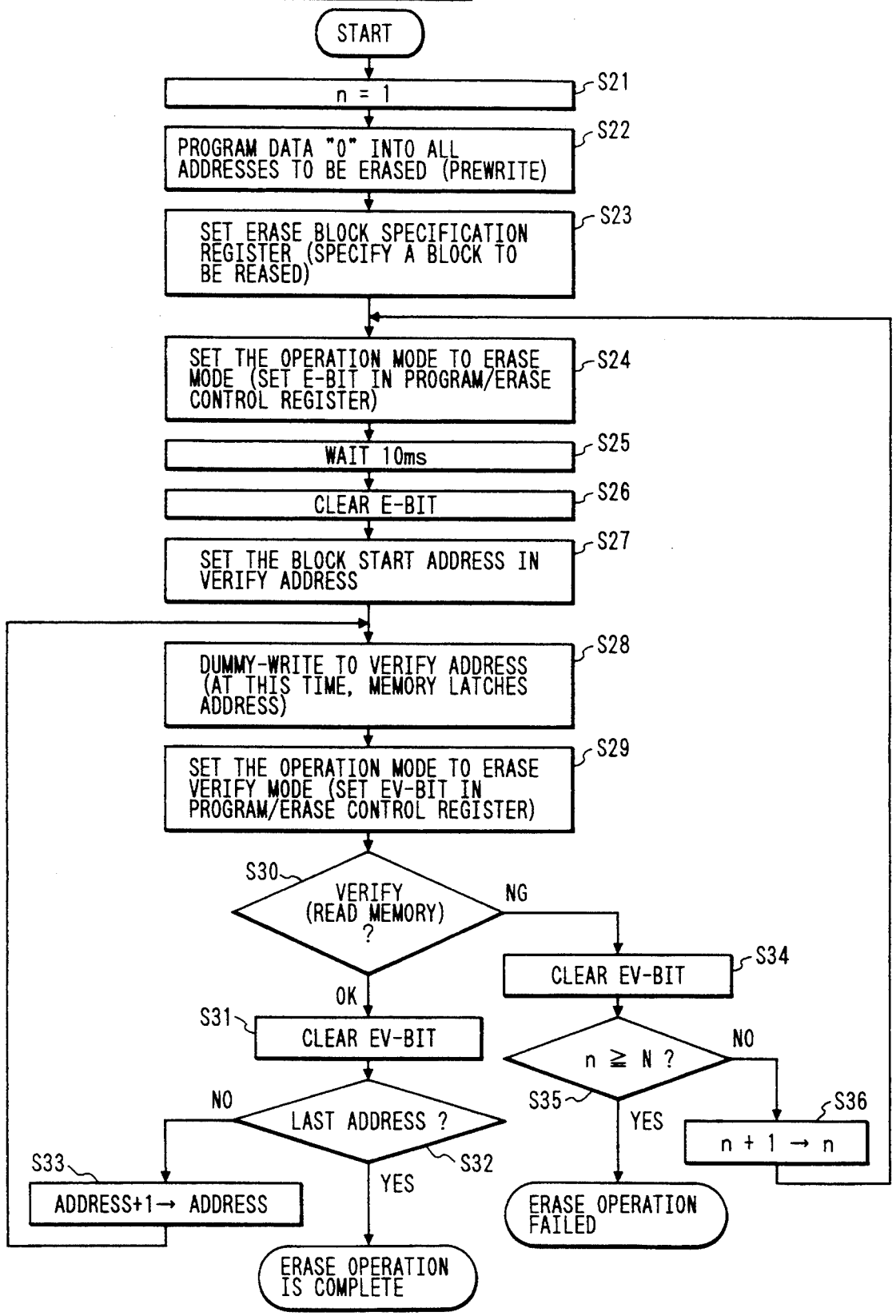
FIG. 34 is a detailed example of a flowchart showing an erase control procedure.

FIG. 34 shows a detailed example of the erasing control procedure. The procedure shown in the figure is common to both the control by the central processing unit CPU in the first operation mode and the control by the PROM writer in the second operation mode. In the following the central processing unit CPU is taken as the main controller.

In performing the erase operation, the central processing unit CPU sets "1" in the built-in counter n (step S21). Next, the central processing unit CPU performs a pre-write operation on the memory cells in the area to be erased (step S22). That is, it writes data "0" into memory cells at addresses specified to be erased. This pre-write control procedure may use the programming control procedure explained by referring to FIG. 32. The pre-write operation is performed to make uniform the amounts of electric charge in the floating gates of all bits before erasing so that the erased states will be uniform among the bits.

[0089]

Next, the central processing unit CPU issues a write cycle to the control register CREG and specifies a memory block to be erased in one operation (step S23). That is, it specifies a memory block number to be erased in the erase block specification registers MBREG1 and MBREG2. After specifying the memory block to be erased, the central processing unit CPU issues a write cycle to the control register CREG and sets an erase bit E (Step S24).

Then, the control circuit FCONT applies a high voltage to the source line of the memory block specified at step S23, erasing the memory block in one operation. The central processing unit CPU waits 10 msec, a processing time for the block erasing on the flash memory side (step S25). The duration of 10 msec is so set as to be shorter than the time it takes for the erase operation to be completed in one operation. Then, the erase bit E is cleared (step S26).

[0090]

To check the erased state, the central processing unit CPU internally sets the start address of the memory block to be erased as an address to be verified (step S27) and then performs a dummy write on the verify address (step S28). That is, it issues a memory write cycle to the address to be verified. As a result, the memory address to be verified is held in the address latch circuit ALAT.

Next, the central processing unit CPU issues a write cycle to the control register CREG and sets the erase verify bit EV (step S29). As a result, the control circuit FCONT applies an erase verify voltage to the word line selected by the address, which was set at step S28, to read data from the erased memory cell.

[0091]

The erase verify voltage is set at about 3.5 V, lower than the power supply voltage $V_{cc}$ of 5 V, in order to secure a sufficient margin for the erase level. The central processing unit CPU verifies whether the data thus read out agrees with the data in the erased state (step S30).

Upon verifying the agreement, the central processing unit CPU clears the erase verify bit EV (step S31) and then checks if the verify address used this time is the last address of the memory block erased (step S32). If it is found to be the last address, the central processing unit CPU ends the series of erase operations. When it is found that the current address is not the last address, the central processing unit CPU increments the verify address by "1" (step S33) before repeating the processing from step S29.

[0092]

When the central processing unit CPU detects disagreement by the verify operation at step S30, it clears the erase verify bit EV at step S34 and checks if the value of the counter n reaches the upper limit number of progressive erase operations N (step S35). If the check has found that the upper limit number of progressive erase operations N is reached, the central processing unit CPU decides that the processing has failed, ending the processing.

When the upper limit number of progressive erase operations N is not reached, the central processing unit CPU increments the value of the counter n by "1" (step S36) and repeats the processing from step S24. In practice, to prevent an over-erase in which the threshold voltage of memory cells becomes negative, the verify is carried out every erase operation, thus progressively performing the erase operations, each in as short a duration as 10 msec at a time.

[0093]

[Grouping Memory Cells into a Plurality of Blocks Defined by Word Lines and Having Differing Memory Capacities]

Figure 35:
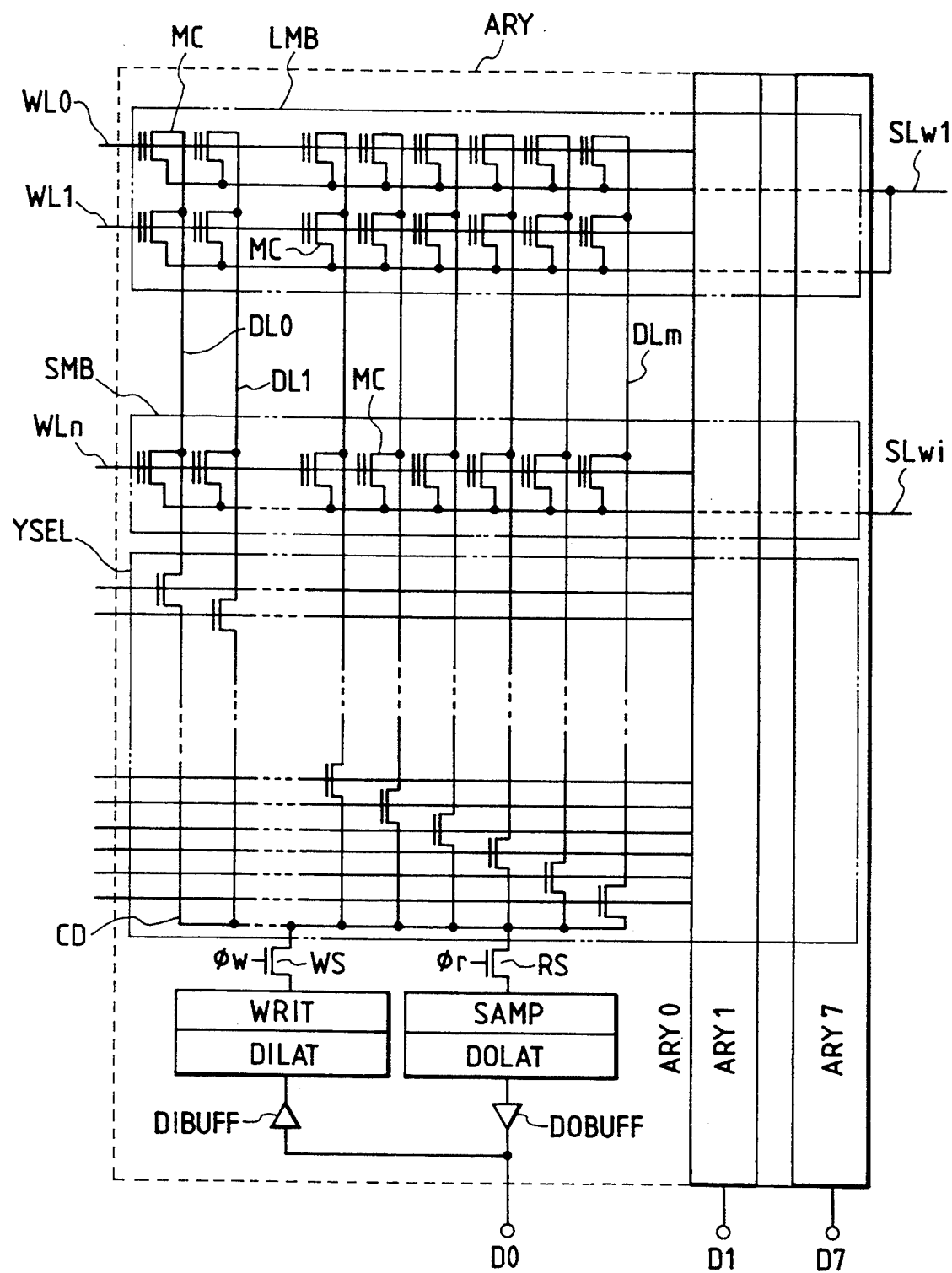
FIG. 35 is an explanatory diagram showing another example of memory block division.

FIG. 35 shows the memory mat configuration of flash memory in which the flash memory cells are grouped into a plurality of blocks by word lines and in which the memory capacities of the memory blocks that are erasable in one operation are differentiated.

While in the embodiment shown in FIG. 13, the memory blocks are defined by data lines, those in the embodiment of FIG. 35 are defined by word lines. In the memory mats ARY0–ARY7 of FIG. 35, memory blocks LMB with relatively large storage capacities and memory blocks SMB with relatively small storage capacities are representatively shown.

[0094]

In each of the memory mats ARY0–ARY7 are matrix-arranged memory cells MC formed of insulated gate field-effect transistors of two-layer gate structure.

In the figure, WL0–WLn are word lines common to all memory mats ARY0–ARY7. The control gates of memory cells arranged on the same row are connected to the corresponding word line. In each of the memory mats ARY0–ARY7, the drain regions of memory cells MC arranged on the same column are connected to the corresponding one of data lines DL0–DLm.

[0095]

The source regions of memory cells MC making up the small memory block are commonly connected to a source line SLwi that extends in the direction of word line, while the source regions of memory cells MC making up the large memory block are commonly connected to the source line SLwl that extends in the direction of word line.

As in the embodiment of FIG. 13, during the block erase where the erase operation is done in blocks, the memory block to be erased is specified by the erase block specification register, and an erasing high voltage Vpp is supplied to the source line of the memory block thus specified. The detail of the voltage conditions for erase and program will be detailed later. In FIG. 35, indicated by YSEL is a Y selection circuit, CD a common data line, WRIT a programming circuit, DILAT a data input latch, SAMP a sense amplifier, DOLAT a data output latch, DIBUFF a data input buffer, and DOBUFF a data output buffer.

[0096]

The relation between the memory mats ARY0–ARY7 and the output data is the same as that shown in FIG. 13. That is, one bit of the input/output data corresponds to one memory mat. For example, data DO is carried by the memory mat ARY0. The adoption of the configuration in which one I/O is formed of one memory mat allows the common data line CD to be divided for each memory mat, obviating the need to extend the common data line CD over a long distance to pass through all the memory mats. Thus, it is possible to minimize the parasitic capacitance of the common data line CD, contributing to increased speed of access and reduced voltage required for operation.

[0097]

If the memory blocks such as LMB, SMB are defined by word lines, as shown in FIG. 35, the storage capacity of the minimum memory block in the entire memory array ARY whose parallel input/output bit number is one byte is equal to that of one word line. This holds true whatever the number of parallel input/output bits.

On the contrary, when the memory blocks are defined by data lines as shown in FIG. 13, the minimum memory block in the entire memory array has a storage capacity of eight data lines corresponding to the number of parallel input/output bits (one data line for each memory mat). Thus, if the memory bit number in the data line direction is one-eighth the memory bit number in the word line direction, the storage capacity of the minimum memory block remains the same whether the memory block is defined by data lines or by word lines.

[0098]

In reality, however, considering the layout efficiency in making semiconductor integrated circuits or the memory cell addressing efficiency, the number of memory bits in the direction of data line is usually one-half that in the direction of word line. Furthermore, because the flash memory incorporated in the microcomputer is connected to the internal data bus, the number of parallel input/output bits is set equal to byte or word.

Therefore, defining the memory block by word lines makes it possible to significantly reduce the storage capacity of the minimum memory block. Reduced minimum size of the memory block improves the usefulness of the memory as by allowing the area made available from the reduced size to be used for data storage and by obviating a redundant operation in which information that does not require reprogramming is block-erased and then has to be programmed again.

[0099]

[Information Programming by General-Use PROM Writer]

Figure 36:
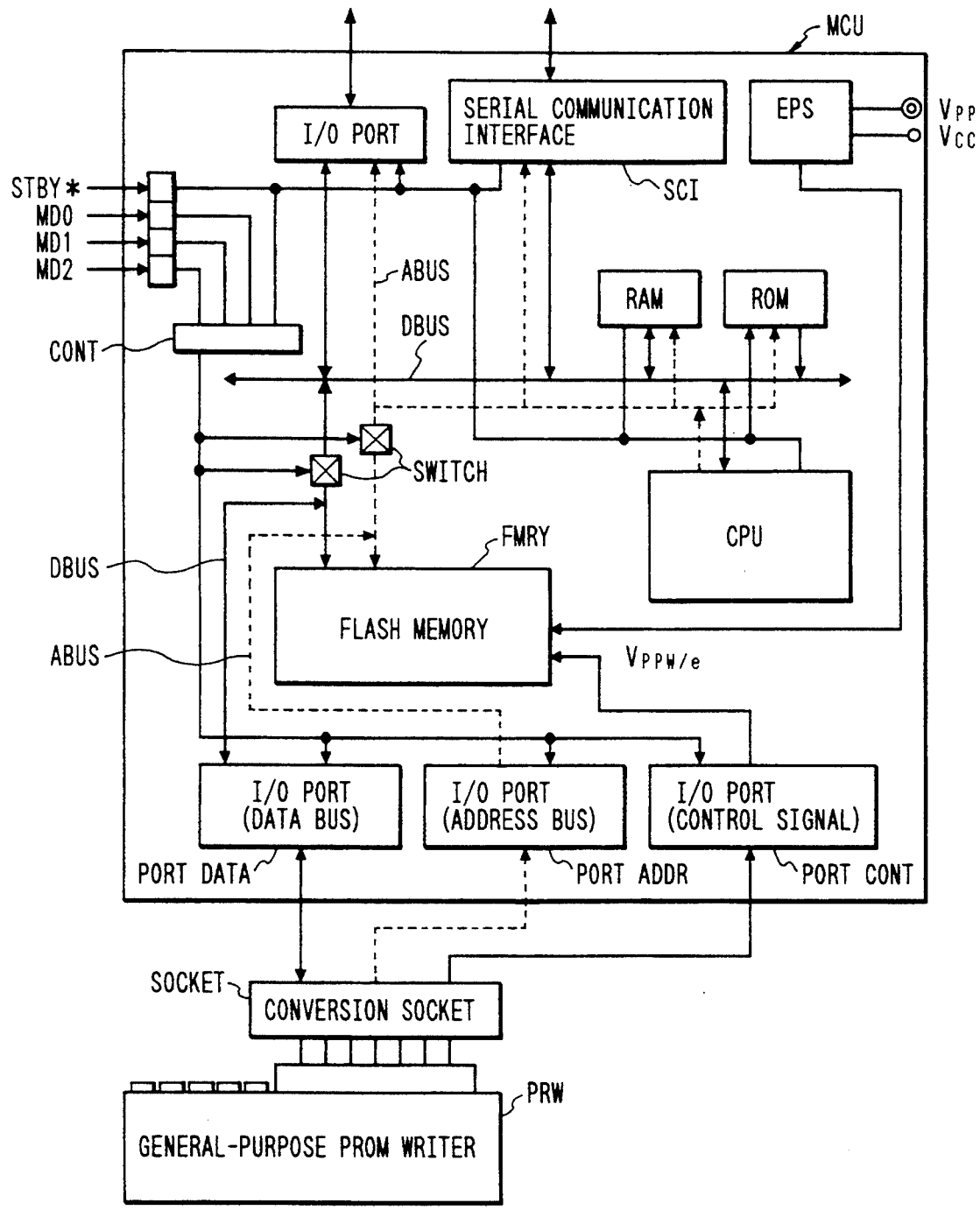
FIG. 36 is a block diagram showing the re-programming of the flash memory by means of a general-purpose PROM writer.

FIG. 36 shows a block diagram when the flash memory FMRY is re-programmed by the general-use PROM writer.

In the figure, MD0, MD1 and MD2 are shown as examples of the mode signal MODE. The mode signals MD1–MD3 are supplied to the control circuit CONT. The decoder in the control circuit CONT decodes the mode signals MD1–MD3 to determine whether the operation mode that does not require programming of the flash memory FMRY is specified or the first or second operation mode is specified.

[0100]

When the second operation mode is found to have been specified, the control circuit CONT specifies an I/O port to be interfaced with the general-purpose PROM writer PRW in order to allow the incorporated flash memory FMRY to be directly accessible by the external general-purpose PROM writer PRW. That is, what is specified by the control circuit CONT includes an I/O port PORTdata to transfer data to and from the flash memory FMRY, an I/O port PORTaddr to supply an address signal to the flash memory FMRY, and an I/O port PORTcont to supply various control signals to the flash memory FMRY.

Further, the operation of the built-in function blocks that are not directly associated with the reprogramming control by the general-purpose PROM writer PRW, such as central processing unit CPU, random access memory RAM and mask read-only memory MASK-ROM, is virtually restricted. For example, connection is cut off between the incorporated function block, such as the central processing unit CPU, and the flash memory FMRY by means of switch means SWITCH located on the data bus DBUS and the address bus ABUS, as illustrated in FIG. 36.

[0101]

The switch means SWITCH may be understood to be output circuits of tristate (3-state) type arranged on a circuit that outputs data from the built-in function block such as central processing unit CPU onto the data bus DBUS and also on a circuit that output addresses onto the address bus ABUS. Such tristate output circuits are controlled to the high output impedance state in response to the second operation mode.

In the example of FIG. 36, the built-in function block that are not directly associated with the re-programming control by the general-purpose PROM writer PRW, such as central processing unit CPU, random access memory RAM and mask read-only memory MASKROM, are rendered in a low power consumption mode by a standby signal STBY* (symbol * indicates that a signal attached with * is a low-active signal).

[0102]

If in the low power consumption mode the tristate output circuit is controlled to the high output impedance state, the built-in function blocks that are not directly associated with the re-programming control by the general-purpose PROM writer PRW, such as CPU, RAM and ROM, may be set with a low power consumption mode in response to the mode signals MD0–MD2 specifying the second operation mode in order to restrict the virtual operation of these function blocks.

Once the second operation mode is set, the I/O ports PORTdata, PORTaddr, PORTcont of the microcomputer MCU are connected to the general-purpose PROM writer PRW through the conversion socket SOCKET. The conversion socket SOCKET has a terminal arrangement for the I/0 ports PORTdata, PORTaddr, PORTcont on one hand and a terminal arrangement for a standard memory on the other, with the same function terminals interconnected internally.

[0103]

[Programming Control Program for CPU]

In the microcomputer MCU of FIG. 36, the reprogramming control program to be executed by the central processing unit CPU is written in the flash memory FMRY by the general-purpose PROM writer PRW beforehand.

In the microcomputer MCU of FIG. 2, it is possible to store in the mask read-only memory MASKROM the re-programming control program to be executed by the central processing unit CPU. When the mode signals MD0–MD2 specify the first operation mode and the control circuit CONT recognizes it, the central processing unit CPU writes data into the flash memory FMRY according to programming control program already written in the flash memory FMRY or the re-programming control program held in the mask read-only memory MASKROM.

[0104]

Figure 37:
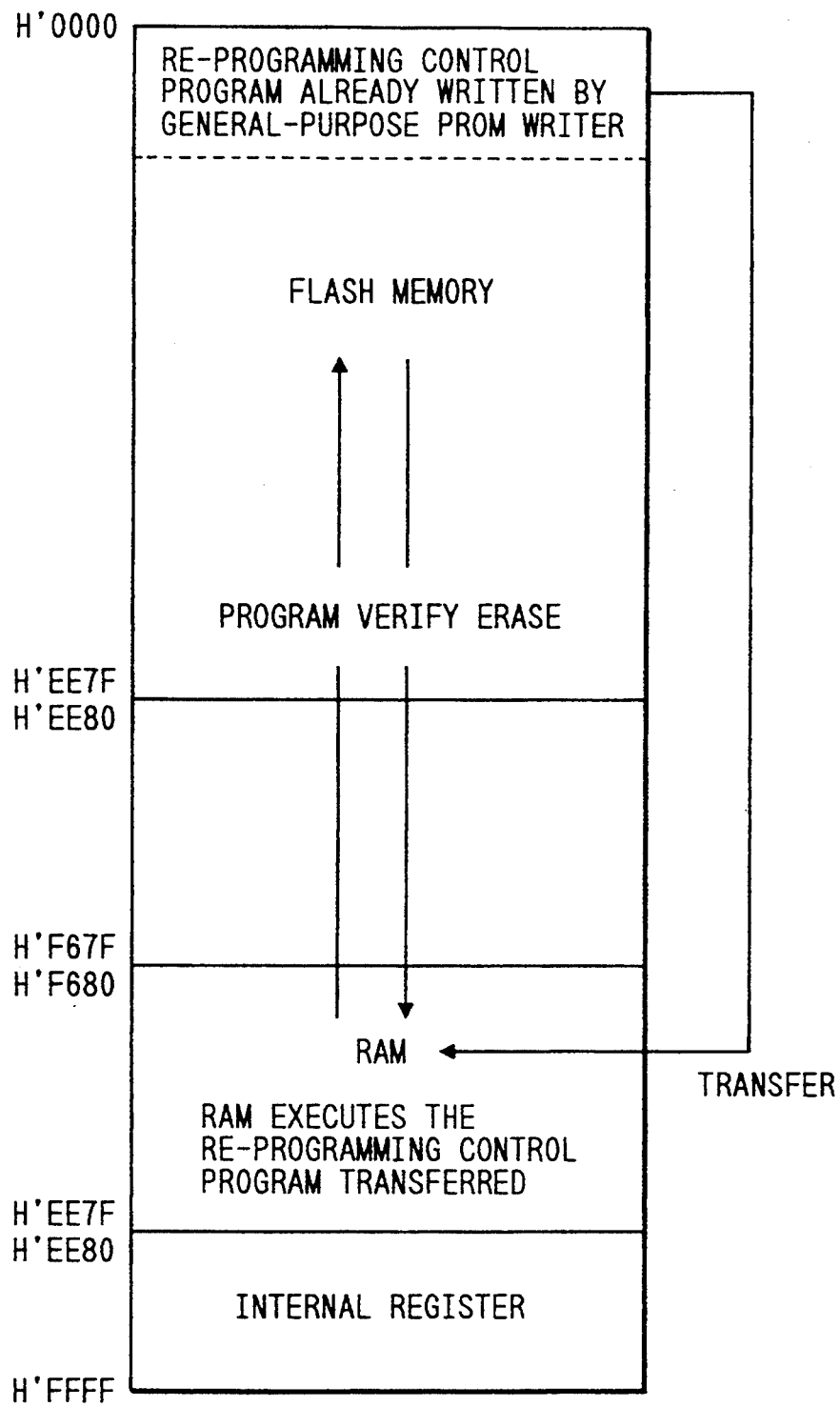
FIG. 37 is an example memory map of a microcomputer with the entire memory made of flash memory.

FIG. 37 shows a memory map for the microcomputer (see FIG. 1) with the entire memory composed of flash memory. In the figure, a re-programming control program and a transfer control program are written beforehand in specified areas of the flash memory. When the first operation mode is specified, the central processing unit CPU executes the transfer control program to transfer the re-programming control program to the random access memory RAM. After the transfer, the processing of the central processing unit CPU branches to the execution of the re-programming control program held in the random access memory RAM, thus repeating the erasing and programming operation (including verify operation) on the flash memory FMRY.

Figure 38:
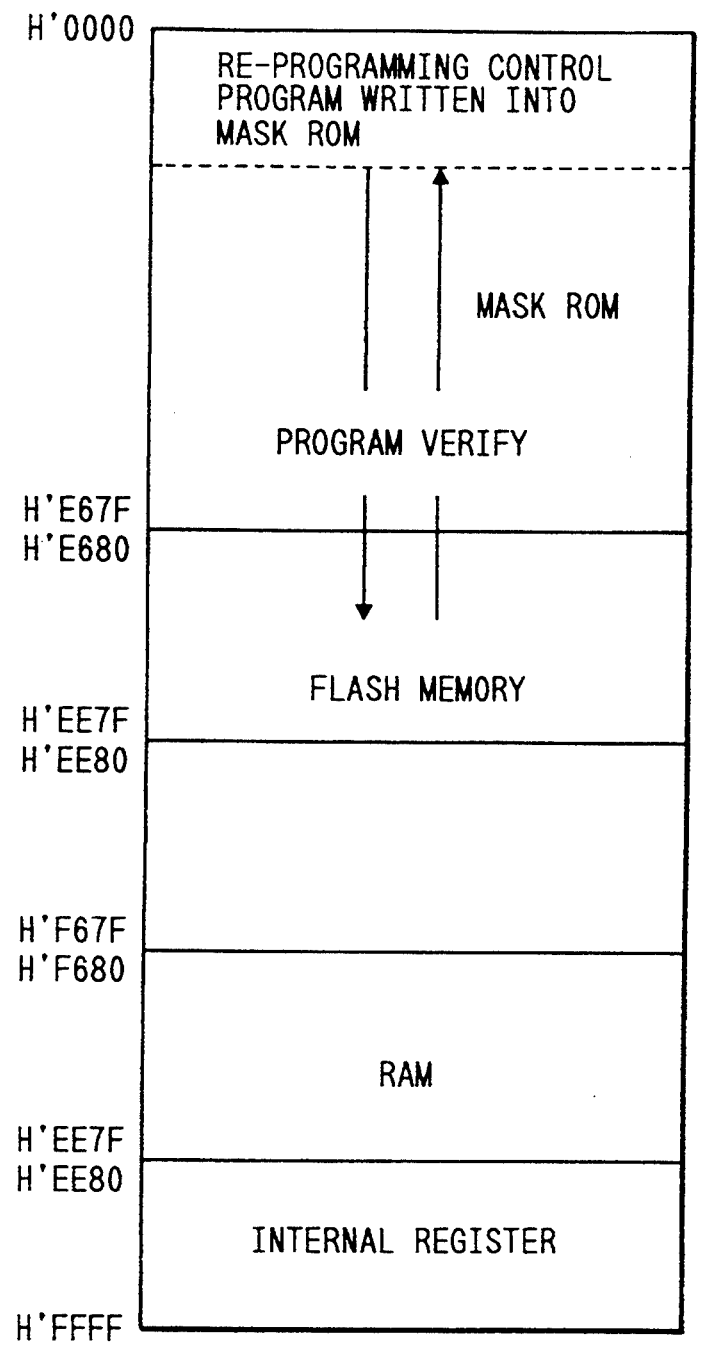
FIG. 38 is an example memory map of a microcomputer having flash memory and mask ROM.

FIG. 38 shows a memory map of the microcomputer (see FIG. 2) having a mask ROM as well as the flash memory. In this case, the transfer control program explained in FIG. 37 is not required. The central processing unit CPU, upon specification of the first operation mode, successively executes the re-programming control programs held in the mask read-only memory MASKROM, thus repeating the erasing and programming of the flash memory FMRY.

[0105]

[Selection between Programming by General-Purpose PROM Writer and Programming by CPU Control]

The programming by the general-purpose PROM writer is executed in the Vpp mode and is applied for writing initial data or initial program before mounting the microcomputer MCU on board or system. This allows a relatively large amount of information to be written efficiently.

The programming by the CPU control is executed in the Vcc step-up mode and is applied when data is tuned while the system in which the microcomputer MCU is mounted (or equipped system) is in operation, or when it is necessary to change data or programs, as during the program bugging or the updating of the version of the system, with the microcomputer MCU mounted on the system (i.e. on-board state). This allows the flash memory FMRY to be re-programmed without removing the microcomputer MCU from the system.

[0106]

[Procedure for Real Time Re-Programming]

Figure 39:
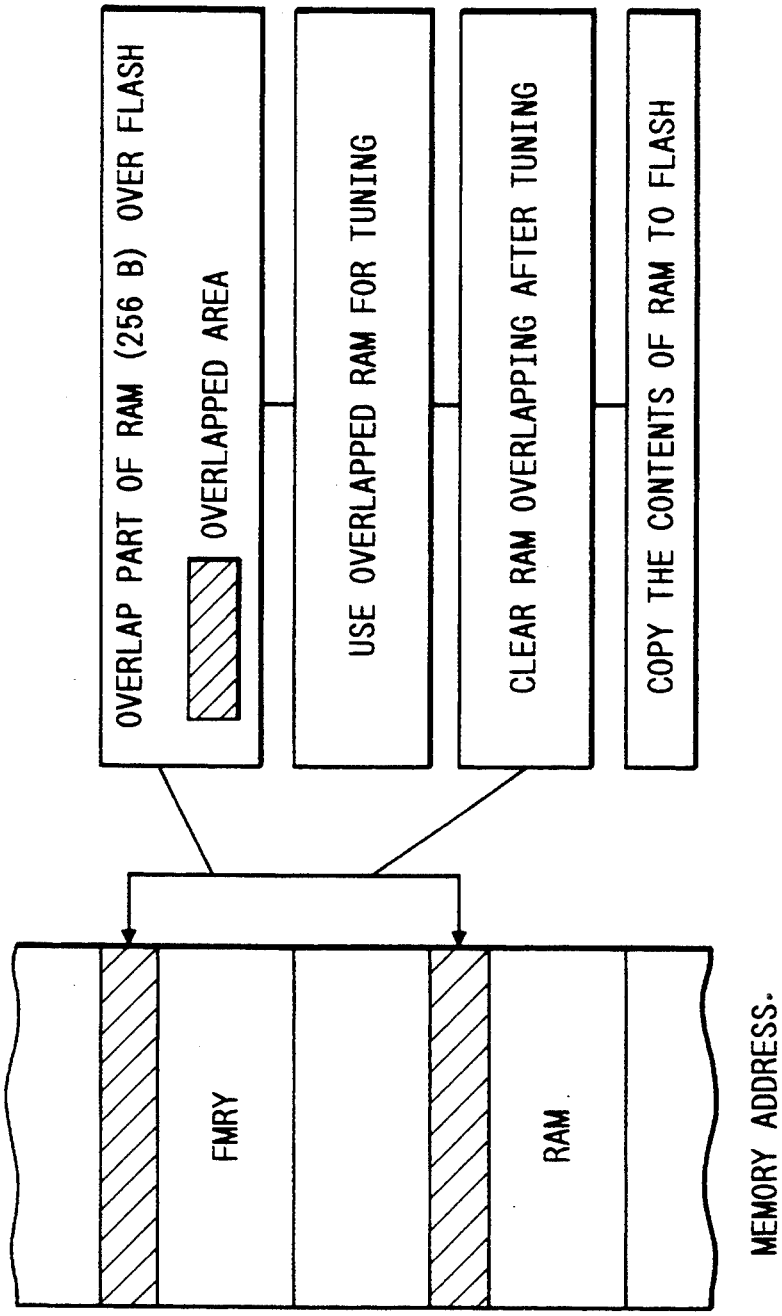
FIG. 39 is an explanatory diagram showing an emulation method for real time re-programming of flash memory.

FIG. 39 shows one example method of re-programming the flash memory in real time. The flash memory FMRY, if reduced in the storage capacity of the memory block as a unit for erasure, cannot shorten the time required by the erasing operation because of its memory configuration. The erasing operation takes several tens of msec to several seconds. Hence, it is difficult to perform data tuning by re-programming in real time the control data held in the flash memory FMRY while operating the system in which the microcomputer MCU is mounted. To cope with this situation, the built-in RAM is used as a work area or data buffer area for the memory block re-programming.

[0107]

This is detailed below. First, data of a specified small memory block SMB that holds data to be tuned is transferred to a particular address in the random access memory RAM. Next, the particular address area of the random access memory RAM is overlapped on the address of the specified small memory block SMB. Such an address location change can be realized by enabling the decode logic of the random access memory RAM to be changed in response to the setting of a specified control bit or flag. The tuning of control data is performed by using the random access memory RAM overlapped on the address of the specified small memory block SMB.

[0108]

After the tuning is completed, the address overlapping between the random access memory RAM and the small memory block SMB is reset to restore the location address of the random access memory RAM to its original state. Finally, using the tuned data held in the random access memory RAM, the small memory block SMB in the flash memory is re-programmed. As a result, the same data that was used to re-program in real time the control data held in the flash memory can be obtained in the small memory block SMB while operating the system in which the microcomputer MCU is mounted.

[0109]

[Improving Efficiency of Part Re-Programming of Memory Block]

Figure 40:
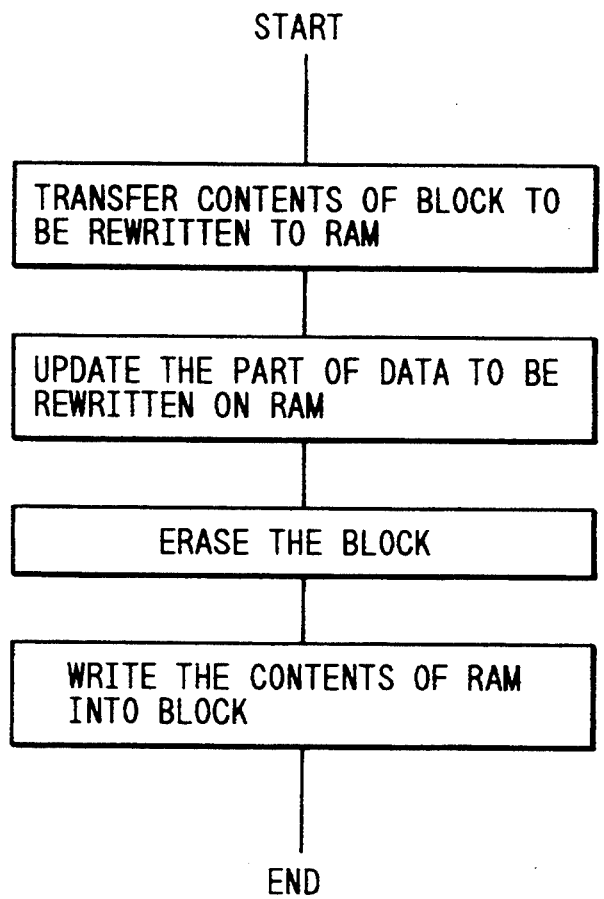
FIG. 40 is an explanatory diagram showing a method of facilitating the re-programming of a part of the flash memory block.

FIG. 40 shows one example method of enhancing the efficiency in re-programming a part of the memory block in the flash memory. To re-program a part of the information held in a specified memory block SMB in the flash memory FMRY, as in correcting bugs in program or updating the version of the program, involves transferring to the built-in RAM the information held in a memory block SMB whose storage capacity is smaller than the RAM, updating a part of the transferred information and re-programming the memory block with the updated information.

Hence, if one of the memory blocks SMB is erased by the block erase operation, there is no need to transfer from outside the information which does not require to be re-programmed and which was held in the flash memory FMRY before re-programming because the information in the memory block SMB is stored in the RAM. Thus, only the data to be re-programmed needs to be transferred from outside onto the RAM where it can be re-programmed, eliminating the redundant information transfer that would otherwise be required for re-programming a part of the memory block.

[0110]

[Application to Cordless Telephone]

Figure 41:
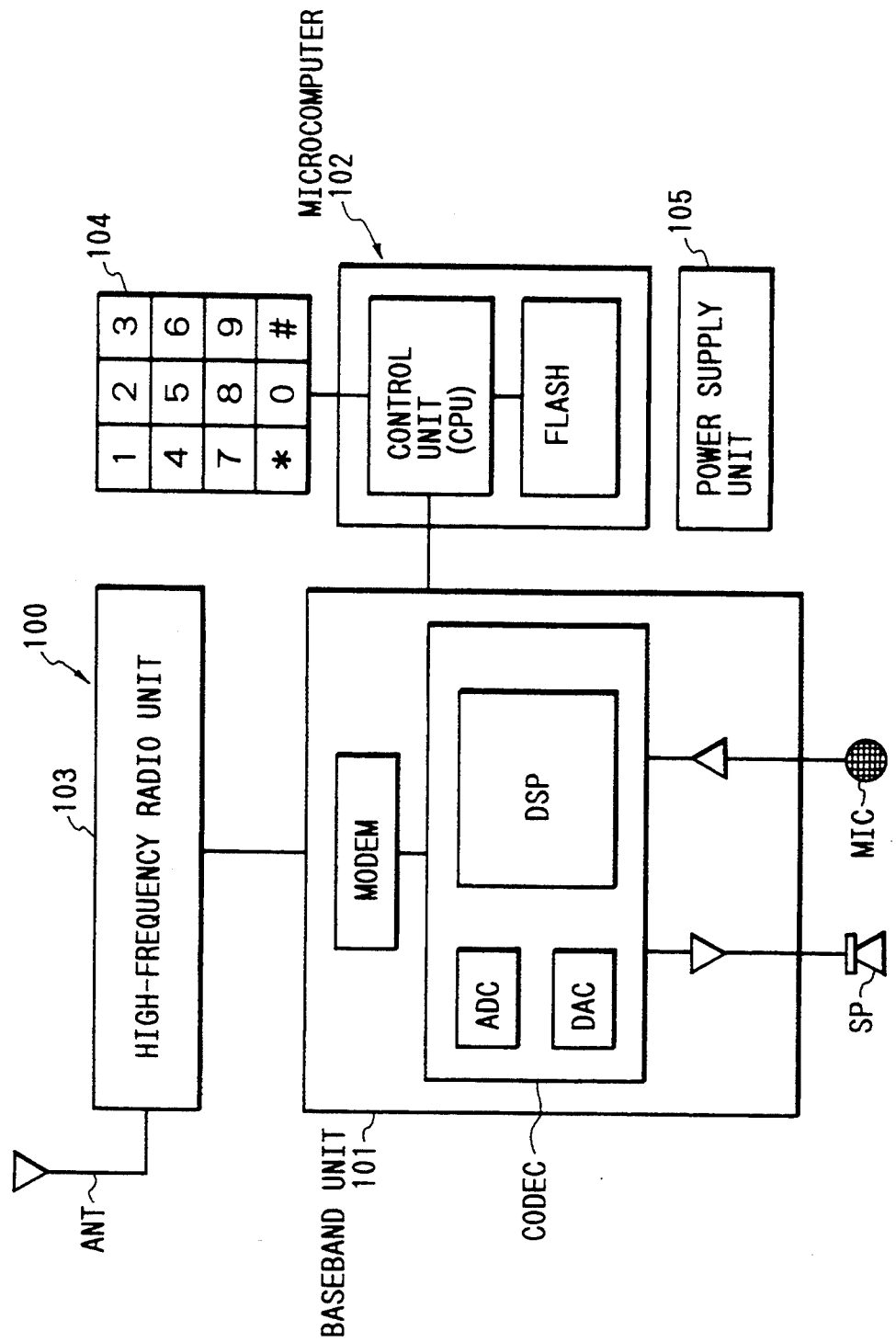
FIG. 41 is a block diagram showing one example of a mobile radio communication equipment such as a cordless telephone, for which the flash memory of this invention can be suitably applied.

FIG. 41 shows a block diagram of one embodiment of a mobile radio communications equipment, such as a cordless telephone, to which the flash memory of this invention is effectively applied.

The mobile radio communications equipment 100 in this example consists of: a base band unit 101; a microcomputer 102; a high frequency radio unit 103; a key pad 104; and a power supply unit 105 such as a battery. The base band unit 101 includes: a codec CODEC consisting of a digital signal processor DSP, an analog-digital convertor ADC and a digital-analog convertor DAC; and a modem MODEM. The microcomputer 102 has a control unit CPU and a memory device MRY. The control unit CPU is supplied a dial number and various modes from the key pad 104. In FIG. 41, designated ATN is an antenna, SPa speaker, and MICa microphone.

[0111]

In a cordless telephone, a radio signal received by the antenna ATN is entered into the base band unit 101 where it is subjected to shaping and analog-digital conversion before being error-corrected and decoded into frames. Further, the signal is subjected to the digital-analog conversion and voice expansion by the codec CODEC and then sent to the speaker SP that produces sound.

Voice that entered the microphone MIC is fed to the codec CODEC of the base band unit 101 where it is subjected to analog-digital conversion and voice compression before being error-corrected and assembled into frames. It is then shaped and converted from a digital to an analog signal, which is then transmitted form the antenna ANT.

[0112]

In this embodiment, the memory device MRY incorporated in the microcomputer 102 uses the flash memory of this invention. This memory device stores, for example, telephone numbers for speed dialing and other information such as memo. As one form of memo information, voice information may be stored. For example, a person may leave a message in memory so that it can be heard by a caller when he or she is out, or what persons are talking over a telephone line may be stored in real time. It is also possible to use the memory of the mobile radio telephone in the same way as a tape recorder when the telephone is not used. Further, the telephone may be provided with a function of transferring what is recorded to the memory of a telephone of an intended person.

[0113]

The mobile radio communications equipment such as a cordless telephone has a requirement for smaller size and weight. One of the factors standing in the way for reduced size and weight is a power supply device (battery). By using the flash memory of this invention in the control unit of the cordless telephone as in the case of this embodiment, a nonvolatile storage becomes possible, requiring no current consumption for storing data. Thus, it is possible to reduce the capacity of the battery. Or if the battery capacity remains unchanged, the use of the flash memory extends the battery life made available by one charge.

As a result, the cordless mobile telephone system can be reduced in size, weight and power consumption and a large amount of information can be read and written at high speed, improving the processing capability of the system as a whole. Further, the application of this invention enhances the impact resistance, which is a weak point of the mobile radiophones, improving the reliability.

[0114]

[Application to Automotive System]

Figure 42:
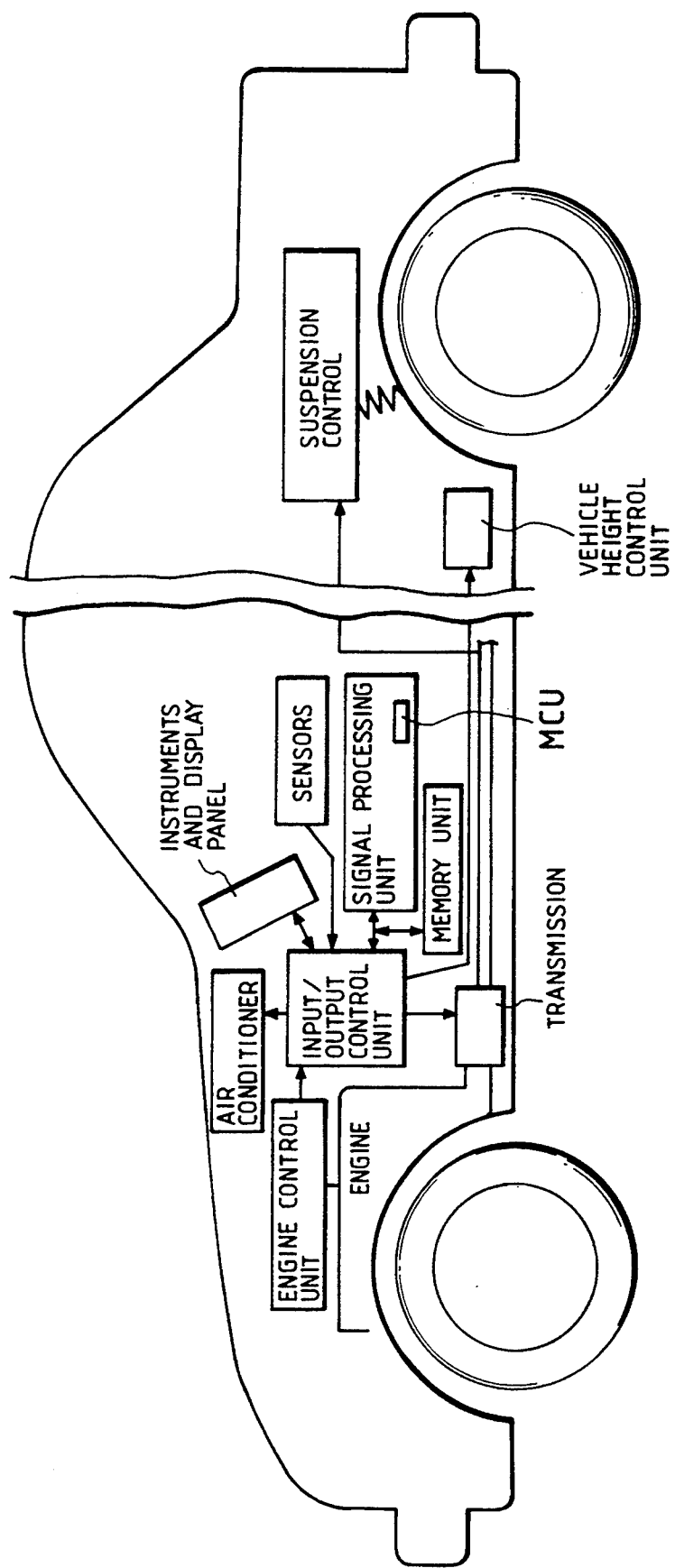
FIG. 42 is a schematic diagram showing essential parts of an automotive system using the flash memory of this invention as its memory element.

FIG. 42 shows the outline of an automotive system that uses as the control device a flash memory of this invention or a microcomputer with a built-in flash memory.

An input/output control unit I/OCONT controls an air conditioning unit, sensors and a transmission TRM that transmits the engine power to the tires, and also interfaces with meters and a display panel. The engine is controlled by an engine control unit. The input/output control unit I/OCONT, according to the demand from a signal processing unit incorporating a microcomputer MPU, controls the flash memory to write and read information. The output signal of the transmission TRM is sent to a vehicle height control unit and a suspension control unit to control the vehicle chassis.

[0115]

With the flash memory of this invention or the microcomputer MPU incorporating such a flash memory, because the tuning data, such as program data and table data representing the relation between intake air amounts and engine revolutions, can be written into the flash memory by using the general-purpose PROM writer and the external power supply (Vpp) before the flash memory or the microcomputer is incorporated into a system as a storage device or a controller, the writing can be done in a short length of time, improving efficiency.

Once the flash memory or the microcomputer is incorporated as a memory device or a controller into the system, the writing into the flash memory can be done with a voltage, which is internally stepped up or stepped down from the battery voltage (Vcc), so that the distance traveled and the tuning data can be updated in real time. Further, although this embodiment employs as a power supply device a battery whose voltage is unstable, the programming can be done stably because the flash memory of this invention or the microcomputer incorporating it has a built-in boost circuit.

Because this embodiment uses the microcomputer with a built-in flash memory of this invention as a controller, the impact resistance of the microcomputer and therefore the system's reliability are improved. Furthermore, since a large capacity memory can be provided by this invention, the control system can have a sophisticated processing capability with a reduced number of components.

[0116]

[Application to IC Card]

Figure 43:
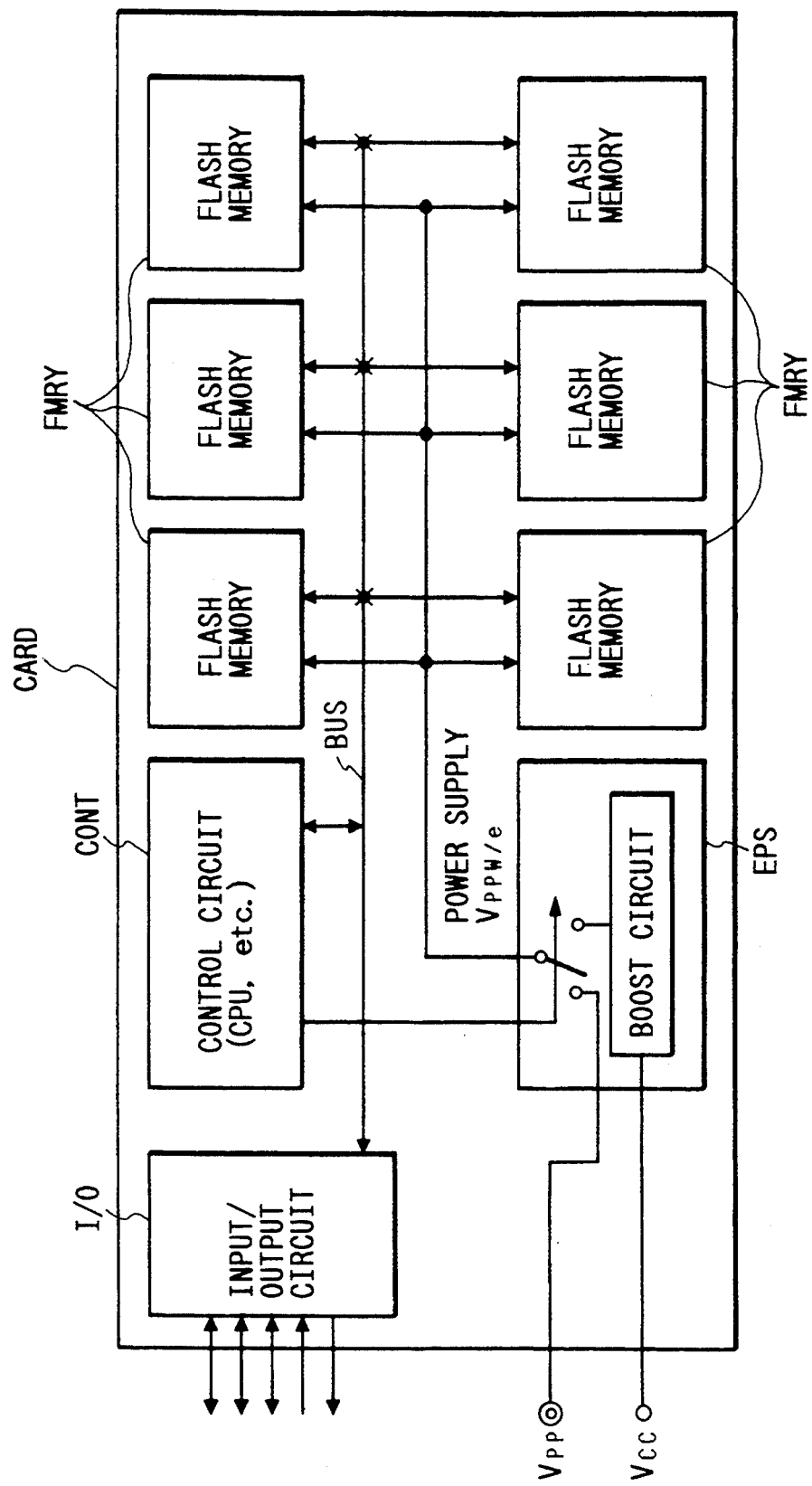
FIG. 43 is a schematic diagram showing essential parts of an IC card using the flash memory of this invention.

FIG. 43 shows a schematic diagram of an IC card using the flash memory of this invention. Mounted on a plastic substrate are flash memories FMRY, a control device CONT such as a microcomputer, an input/output circuit I/O and a power supply circuit EPS of this invention. The power supply circuit EPS incorporates a step-up circuit, and has a power supply terminal to receive the program/erase voltage Vpp and a power supply terminal to receive the normal operation voltage Vcc so that the Vpp or Vcc-boost up voltage can be fed to the flash memory FMRY as the program/erase voltage Vppw/e.

[0117]

The internal lines of the flash memory of this invention and of the microcomputer are connected to the wiring on the plastic substrate. The input/output circuit I/O, the flash memory FMRY and the control device CONT are electrically connected to the wiring on the plastic substrate, so that the IC card can transfer signals to and from external systems through the input/output circuit I/O. Hence, the IC card can be used as an information storage for a variety of systems.

If the IC card is used as a replaceable auxiliary storage medium, like a conventional floppy disc, in small or portable computer systems ranked below the workstation, the need to turn the disc is eliminated, contributing to a reduction in size and weight, thickness and power consumption of the system as a whole. Since a great deal of information can be read and written at high speed, the processing capability of the system as a whole is further improved.

[0118]

The present invention has been described in connection with the example embodiments. It is noted, however, that this invention is not limited to the above embodiments and that various modifications may be made without departing from the spirit of the invention.

Figure 44:
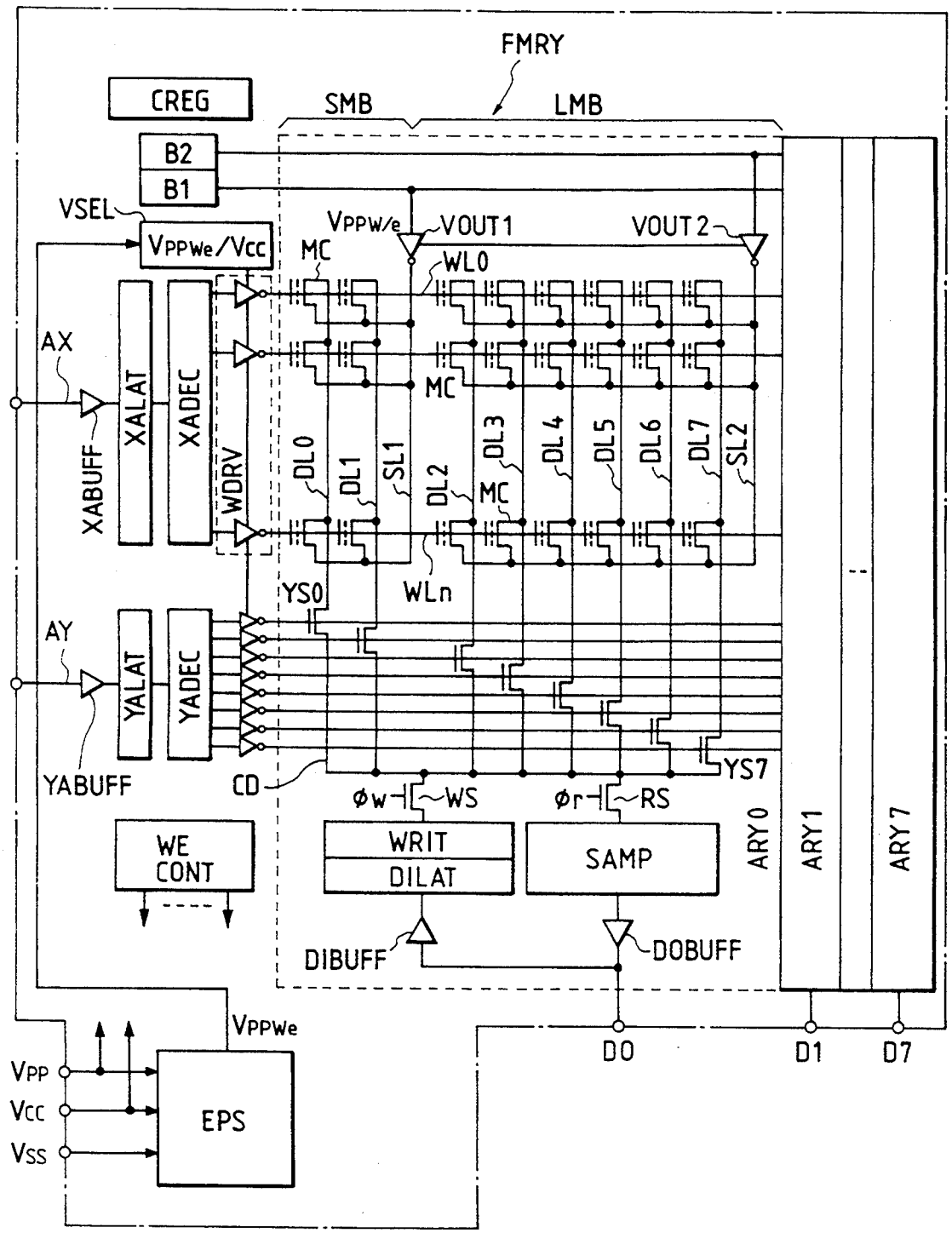
FIG. 44 is a circuitry showing the flash memory incorporating a power supply circuit.

While the above description concerns a case where the invention is applied to the microcomputer with a built-in flash memory—a field of application in which the invention has originated, the invention can be applied widely to a flash memory which can be erased and programmed at least a memory block at a time. For example, the power supply circuit EPS described in the above embodiment may be mounted in the flash memory FMRY, as shown in FIG. 44.

The representative effects and advantages of the invention may be briefly summarized as follows.

It is possible to re-program data in real time and thereby enhance the functions of the equipment. In portable equipment, the invention obviates the need to incorporate batteries with differing voltages into the equipment, reducing the equipment size. Because the programming that most fits the applied system can be carried out, the invention can enhance versatility of the flash memory and reduce the time required for programming and erasing operations.

If the programming and erasing of the flash memory are performed by utilizing the tunnel phenomenon, the 1-bit programming needs only several nA to several tens of nA of current, alleviating the burden of the step-up circuit, so that the area occupied by the power supply circuit, if incorporated, can be reduced.

We claim

1. A microcomputer comprising:
   a first power supply terminal for receiving a circuit reference voltage;
   a second power supply terminal for receiving a first voltage having a first potential difference with respect to the circuit reference voltage;
   a third power supply terminal for receiving a second voltage having a second potential difference with respect to the circuit reference voltage, the second potential difference being larger than the first potential difference;
   a central processing unit which receives the circuit reference voltage and the first voltage and operates in response to these voltages;
   a flash memory having a plurality of memory cells, wherein each of the memory cells includes a source region and a drain region in a semiconductor substrate, a floating gate formed over the source and drain regions with a first oxide film interposed, and a control gate formed over the floating gate with the first oxide film interposed; and
   a power supply circuit, which includes: a first level detection circuit to decide whether the first voltage supplied to the second power supply terminal is higher than a specified level; a second level detection circuit to decide whether the second voltage supplied to the third power supply terminal is higher than a specified level; a boost circuit to boost the first voltage supplied to the second power supply terminal; and a voltage selection circuit to select either the second voltage supplied to the third power supply terminal or a boost voltage from the first voltage by the boost circuit and to supply the selected voltage to the flash memory.

2. The microcomputer according to claim 1, wherein the power supply circuit includes a voltage generation circuit that generates a fourth voltage used for an erase operation on the flash memory.

3. The microcomputer according to claim 2, further comprising: a control circuit which generates a control signal to control the voltage selection circuit in such a way as to supply the second voltage to the flash memory when the second level detection circuit decides that the second voltage supplied to the third power supply terminal is higher than the specified level of the second level detection circuit.

4. The microcomputer according to claim 3, further comprising: a control register which includes a bit representing the state of a detection signal from the first level detection circuit and the second level detection circuit, and a bit specifying which of the second voltage supplied to the third power supply terminal and the boost voltage the voltage selection circuit should select and supply to the flash memory.

5. A flash memory comprising:
   a first power supply terminal for receiving a circuit reference voltage;
   a second power supply terminal for receiving a first voltage having a first potential difference with respect to the circuit reference voltage;
   a third power supply terminal for receiving a second voltage having a second potential difference with respect to the circuit reference voltage, the second potential difference being larger than the first potential difference;
   a plurality of memory cells, wherein each of the memory cells includes a source region and a drain region in a semiconductor substrate, a floating gate formed over the source and drain regions with a first oxide film interposed, and a control gate formed over the floating gate with the first oxide film interposed; and
   a power supply circuit, which includes: a first level detection circuit to decide whether the first voltage supplied to the second power supply terminal is higher than a specified level; a second level detection circuit to decide whether the second voltage supplied to the third power supply terminal is higher than a specified level; a boost circuit to boost the first voltage supplied to the second power supply terminal; and a voltage selection circuit to select either the second voltage supplied to the third power supply terminal or a boost voltage from the first voltage by the boost circuit and to supply the selected voltage to the flash memory.

6. The flash memory according to claim 5, wherein the power supply circuit includes a voltage generation circuit that generates a fourth voltage used for an erase operation on the flash memory.

7. The flash memory according to claim 6, further comprising: a control circuit which generates a control signal to control the voltage selection circuit in such a way as to supply the second voltage to the flash memory when the second level detection circuit decides that the second voltage supplied to the third power supply terminal is higher than the specified level of the second level detection circuit.

* * * * *